US012568615B2

(12) United States Patent
Hwang et al.

(10) Patent No.: US 12,568,615 B2
(45) Date of Patent: Mar. 3, 2026

(54) SUPPORT PILLARS WITH MULTIPLE, ALTERNATING EPITAXIAL SILICON FOR HORIZONTAL ACCESS DEVICES IN VERTICAL THREE-DIMENSIONAL (3D) MEMORY

(71) Applicant: Micron Technology, Inc., Boise, ID (US)

(72) Inventors: David K. Hwang, Boise, ID (US); Yoshitaka Nakamura, Boise, ID (US); Scott E. Sills, Boise, ID (US); Si-Woo Lee, Boise, ID (US); Yuanzhi Ma, Boise, ID (US); Glen H. Walters, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 17/945,448

(22) Filed: Sep. 15, 2022

(65) Prior Publication Data

US 2024/0098969 A1      Mar. 21, 2024

(51) Int. Cl.
*H10B 12/00*          (2023.01)
(52) U.S. Cl.
CPC ............. *H10B 12/30* (2023.02); *H10B 12/03* (2023.02); *H10B 12/488* (2023.02)
(58) Field of Classification Search
CPC ..... H10B 12/30; H10B 12/488; H10B 12/482
See application file for complete search history.

(56) References Cited

U.S. PATENT DOCUMENTS

| | | | |
|---|---|---|---|
| 10,607,995 B2 | 3/2020 | Roberts et al. | |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2020/0279953 A1* | 9/2020 | Sharma ............. | H10D 30/6741 |
| 2021/0013226 A1 | 1/2021 | Tang et al. | |
| 2022/0102358 A1* | 3/2022 | Park ...................... | H10B 12/03 |
| 2022/0157828 A1* | 5/2022 | Zhang .................. | H10B 12/488 |

FOREIGN PATENT DOCUMENTS

| | | | | |
|---|---|---|---|---|
| CN | 110620113 A | * | 12/2019 | ........... H10B 12/482 |

* cited by examiner

*Primary Examiner* — Ali Naraghi
*Assistant Examiner* — Samuel Jonathan Smith
(74) *Attorney, Agent, or Firm* — Brooks, Cameron & Huebsch, PLLC

(57)          ABSTRACT
Systems, methods and apparatus are provided for an array of vertically stacked memory cells having horizontally oriented access devices and storage nodes formed in tiers. And, more particularly, to multiple, alternating silicon germanium (SiGe) and single crystalline silicon (Si) in different thicknesses to form tiers in which to form the horizontal access devices in vertical three-dimensional (3D) memory. The horizontally oriented access devices can have a first source/drain regions and a second source drain regions separated by single crystalline silicon (Si) channel regions. The single crystalline silicon (Si) channel regions can include a dielectric material to provide support structure to the single crystalline channel regions when forming the horizontal access devices in vertical three-dimensional (3D) memory. Horizontally oriented access lines can connect to gate structures opposing the channel regions. Vertical digit lines coupled to the first source/drain regions.

28 Claims, 39 Drawing Sheets

(ALONG CUT-LINE A-A' IN FIG 4A)

(ALONG CUT-LINE 6B-6B IN FIG 6A)

(ALONG CUT-LINE 7B-7B IN FIG 7A)

(ALONG CUT-LINE A-A' IN FIG 8A)

(ALONG CUT-LINE B-B' IN FIG 8A)

(ALONG CUT-LINE C-C' IN FIG 8A)

(ALONG CUT-LINE D-D' IN FIG 8A)

(ALONG CUT-LINE A-A' IN FIG 9A)

(ALONG CUT-LINE B-B' IN FIG 9A)

(ALONG CUT-LINE D-D' IN FIG 9A)

(ALONG CUT-LINE B-B' IN FIG 9A)

(ALONG CUT-LINE B-B' IN FIG 9A)

(ALONG CUT-LINE D-D' IN FIG 9A)

(ALONG CUT-LINE A-A' IN FIG 12A)

(ALONG CUT-LINE B-B' IN FIG 12A)

(ALONG CUT-LINE B-B' IN FIG 12A)

(ALONG CUT-LINE A-A' IN FIG 14A)

(ALONG CUT-LINE B-B' IN FIG 14A)

(ALONG CUT-LINE B-B' IN FIG 14A)

(ALONG CUT-LINE B-B' IN FIG 14A)

(ALONG CUT-LINE B-B' IN FIG 14A)

1

SUPPORT PILLARS WITH MULTIPLE, ALTERNATING EPITAXIAL SILICON FOR HORIZONTAL ACCESS DEVICES IN VERTICAL THREE-DIMENSIONAL (3D) MEMORY

TECHNICAL FIELD

The present disclosure relates generally to memory devices, and more particularly, to support pillars with multiple, alternating epitaxial silicon for horizontal access devices in vertical three-dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by epitaxially grown channel regions. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

2

Figure 3A:
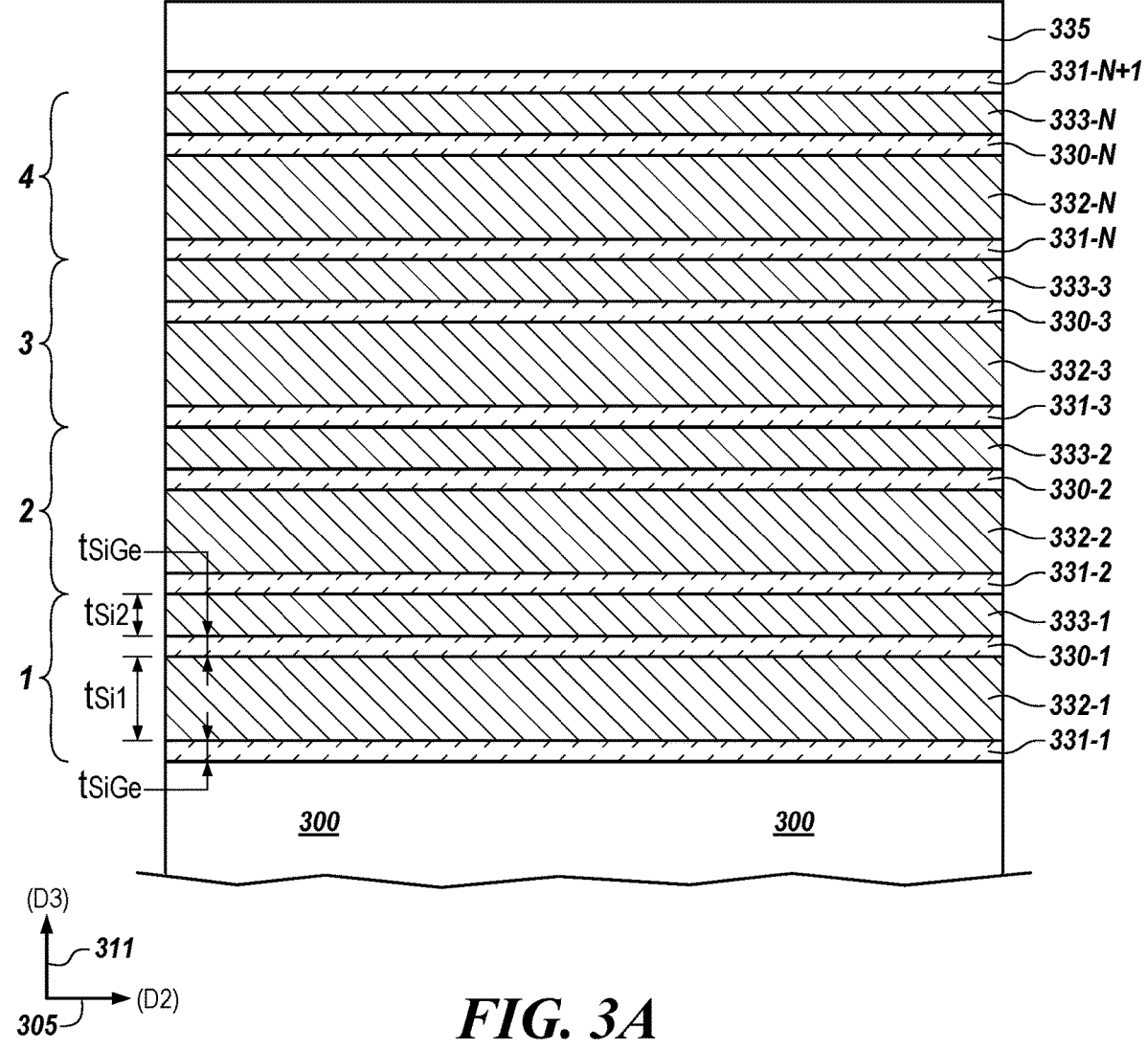
FIG. 3A illustrates a cross-sectional view of one example embodiment for forming multiple, alternating layers of silicon germanium (SiGe) and single crystalline silicon (Si) to form horizontal access devices in vertical three-dimensional (3D) memory in order to provide for defect mitigation and selective etch in accordance with a number of embodiments of the present disclosure.
Figure 3B:
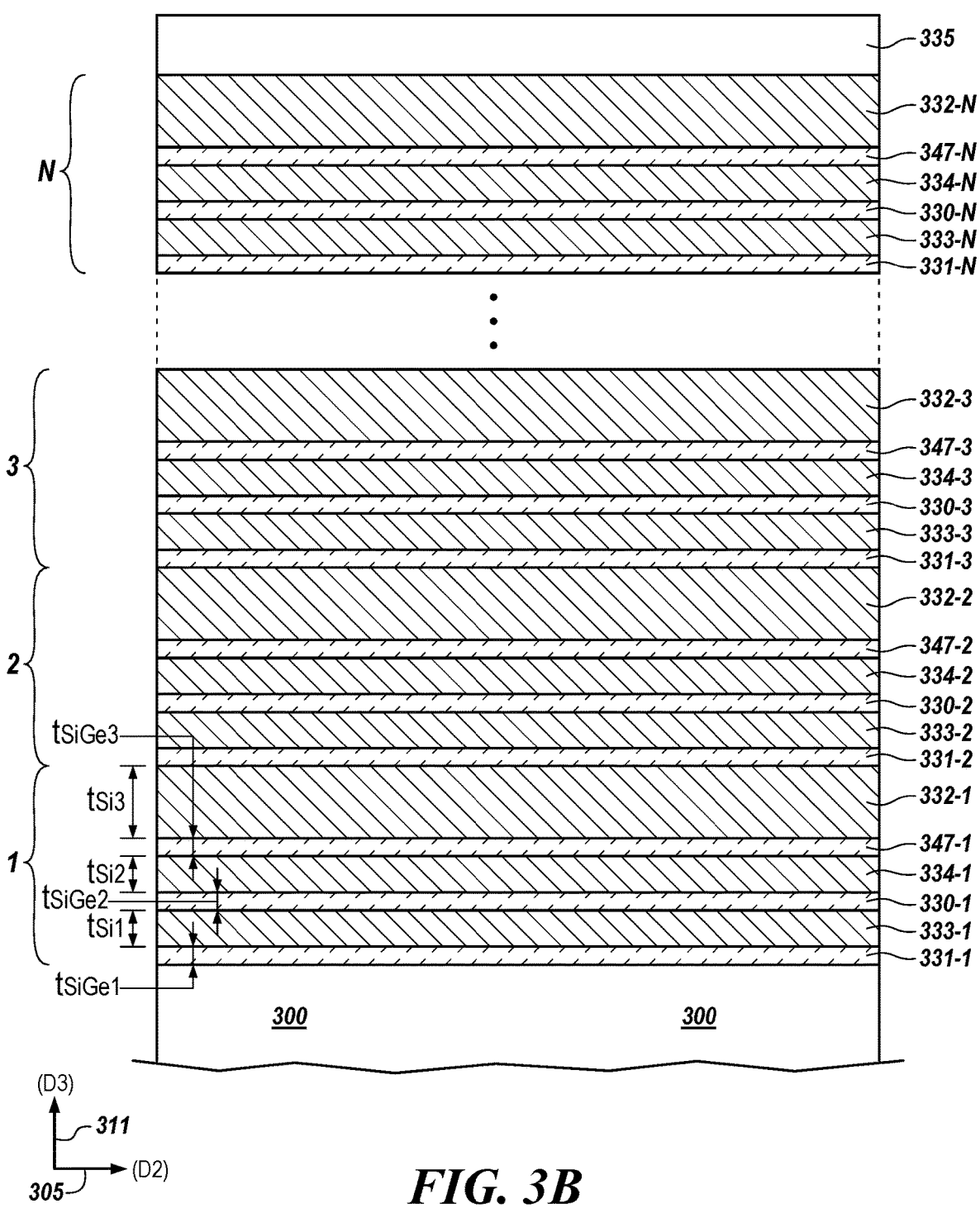

FIG. 3B illustrates another cross-sectional view of one example embodiment for forming multiple, alternating layers of silicon germanium (SiGe) and single crystalline silicon (Si) to form horizontal access devices in vertical three-dimensional (3D) memory in order to provide for defect mitigation and selective etch in accordance with a number of embodiments of the present disclosure.

Figure 4A:
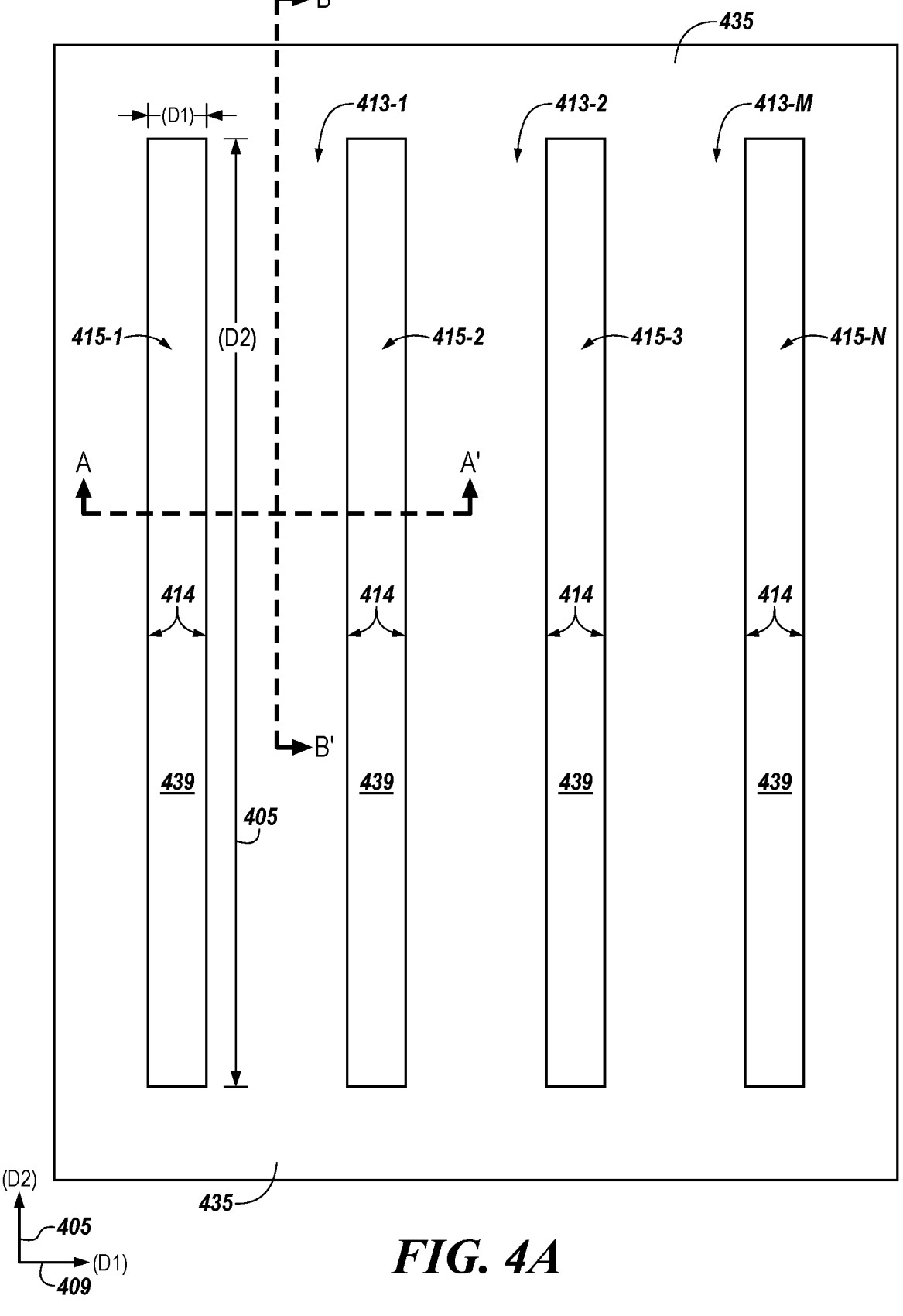
Figure 4B:
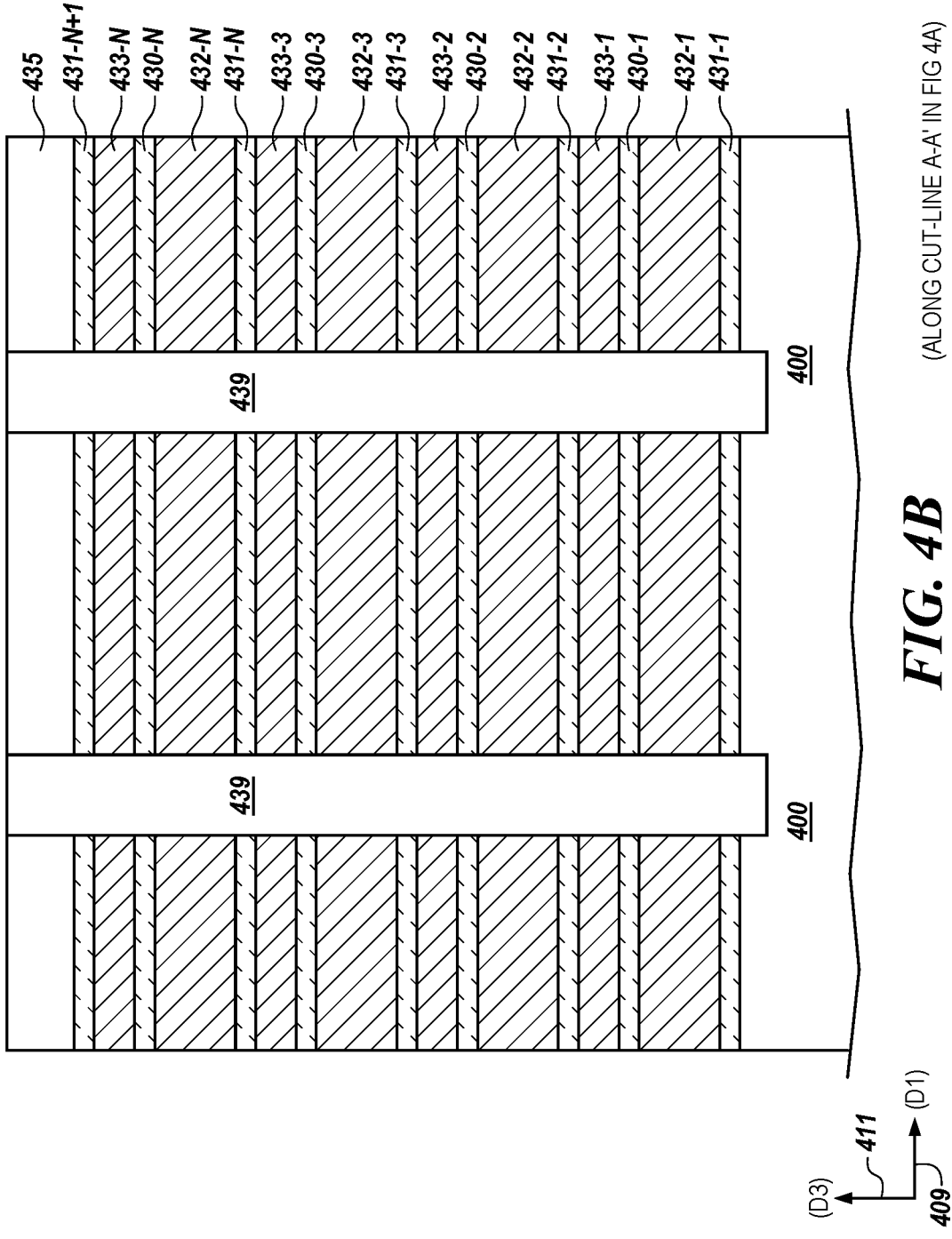

FIGS. 4A to 4B illustrate an example method, at one stage of a semiconductor fabrication process, for forming epitaxial silicon within horizontal access devices in vertical three-dimensional (3D) memory, in accordance with a number of embodiments of the present disclosure.

Figure 5:
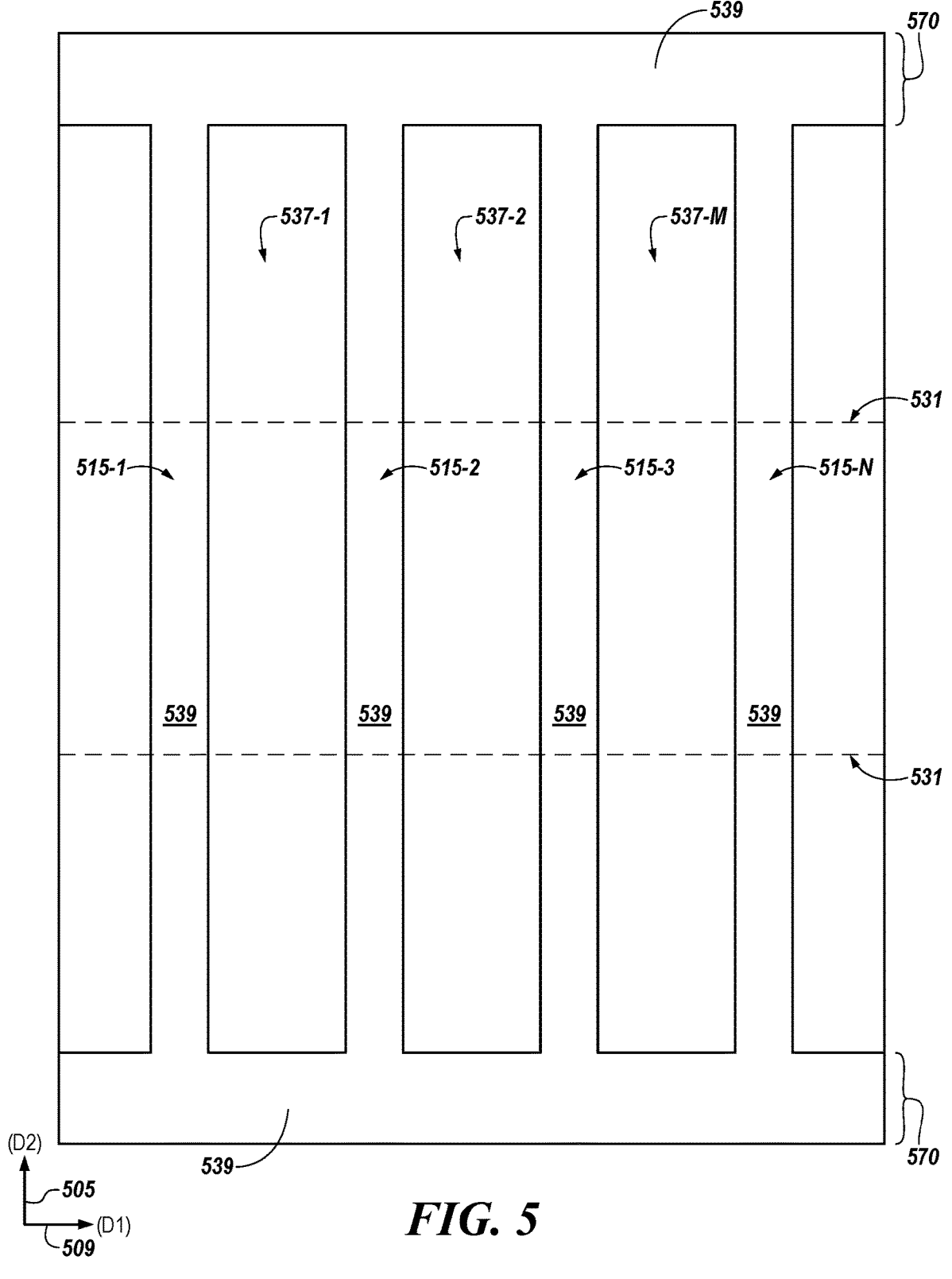

FIG. 5 illustrates an example method, at another stage of a semiconductor fabrication process, for forming epitaxial silicon within horizontal access devices in vertical three-dimensional (3D) memory, in accordance with a number of embodiments of the present disclosure.

Figure 6A:
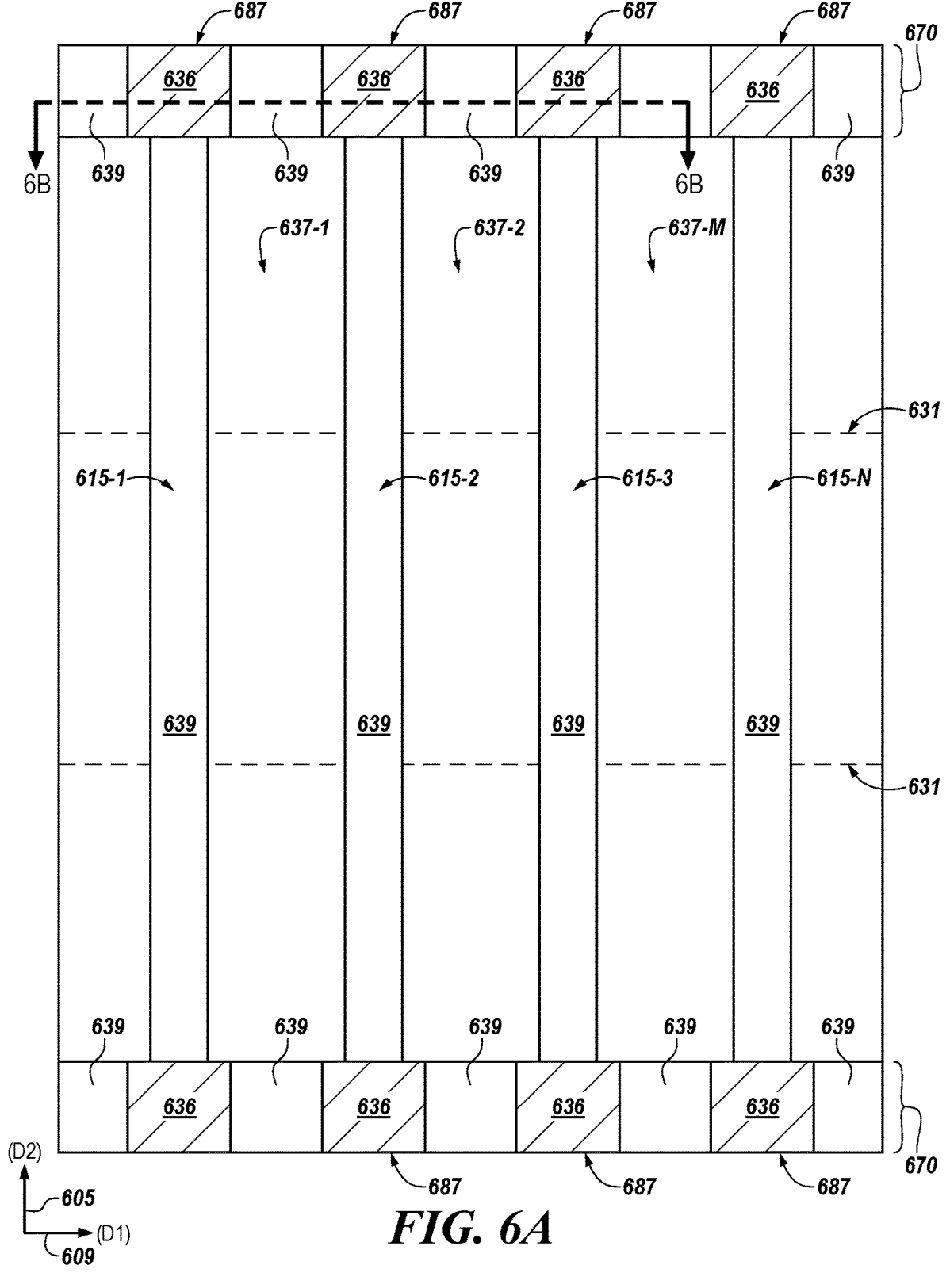
Figure 6B:
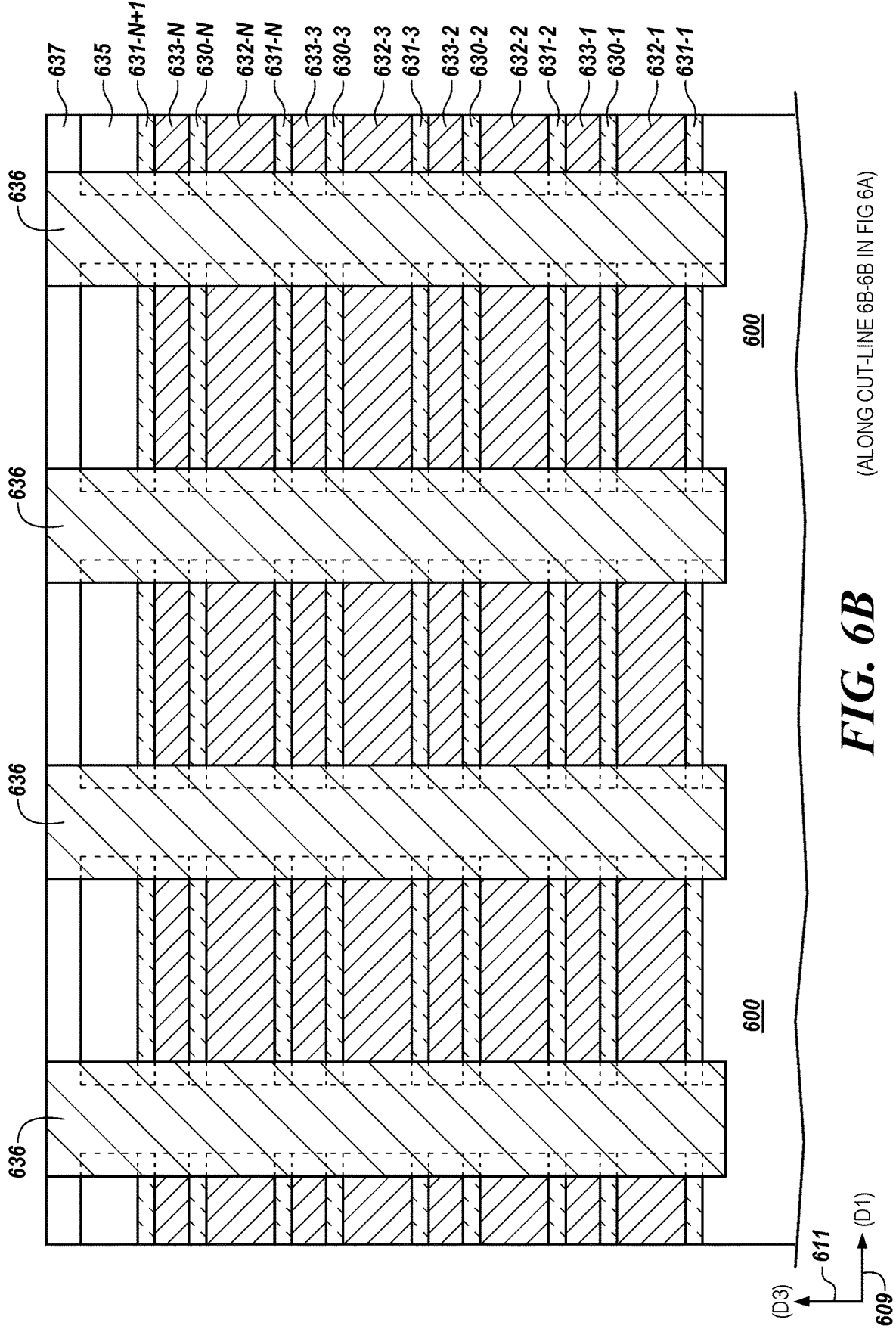

FIGS. 6A to 6B illustrate an example method, at one stage of a semiconductor fabrication process, for forming silicon within horizontal access devices in vertical three-dimensional (3D) memory, in accordance with a number of embodiments of the present disclosure.

Figure 7A:
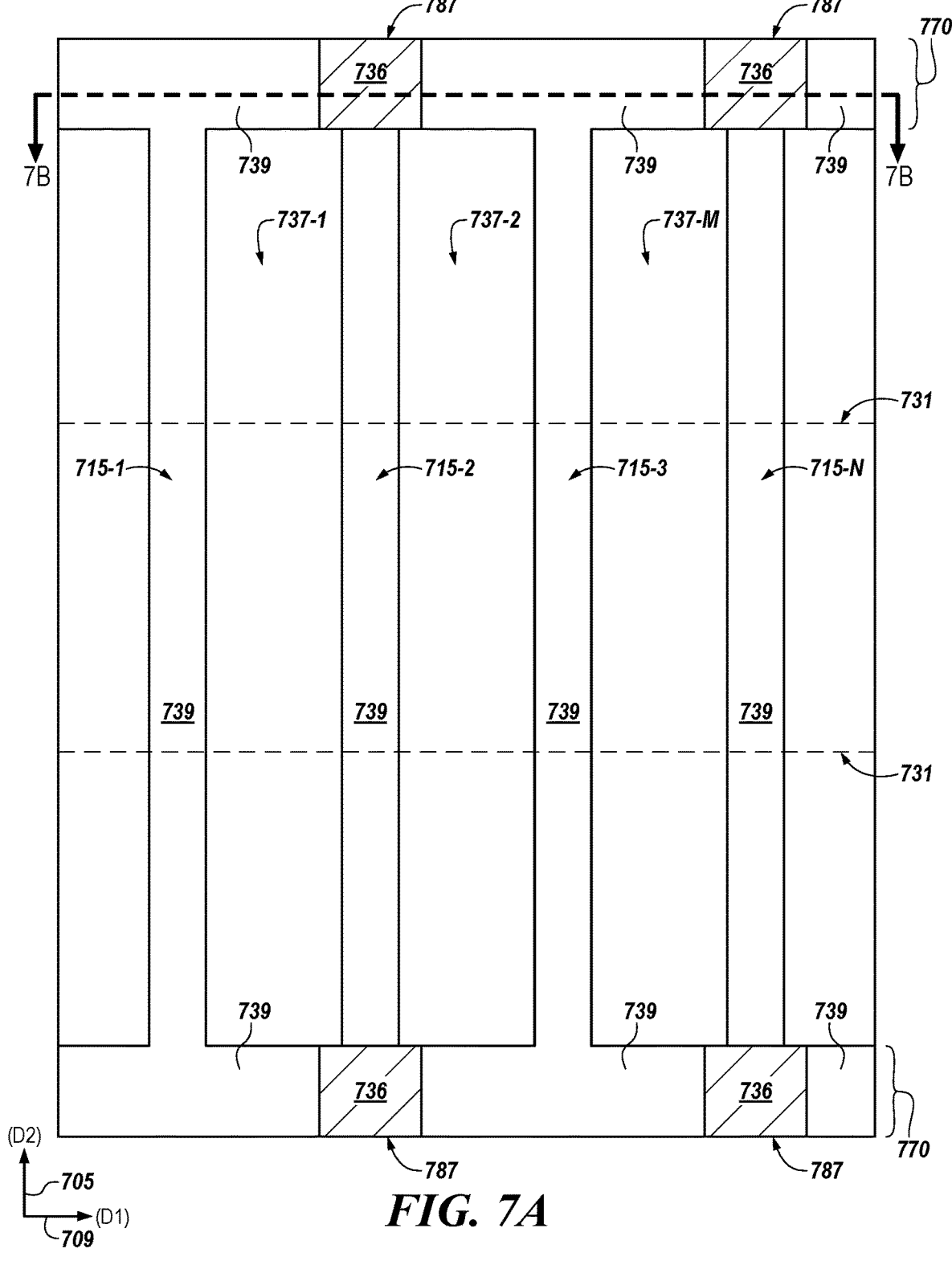
Figure 7B:
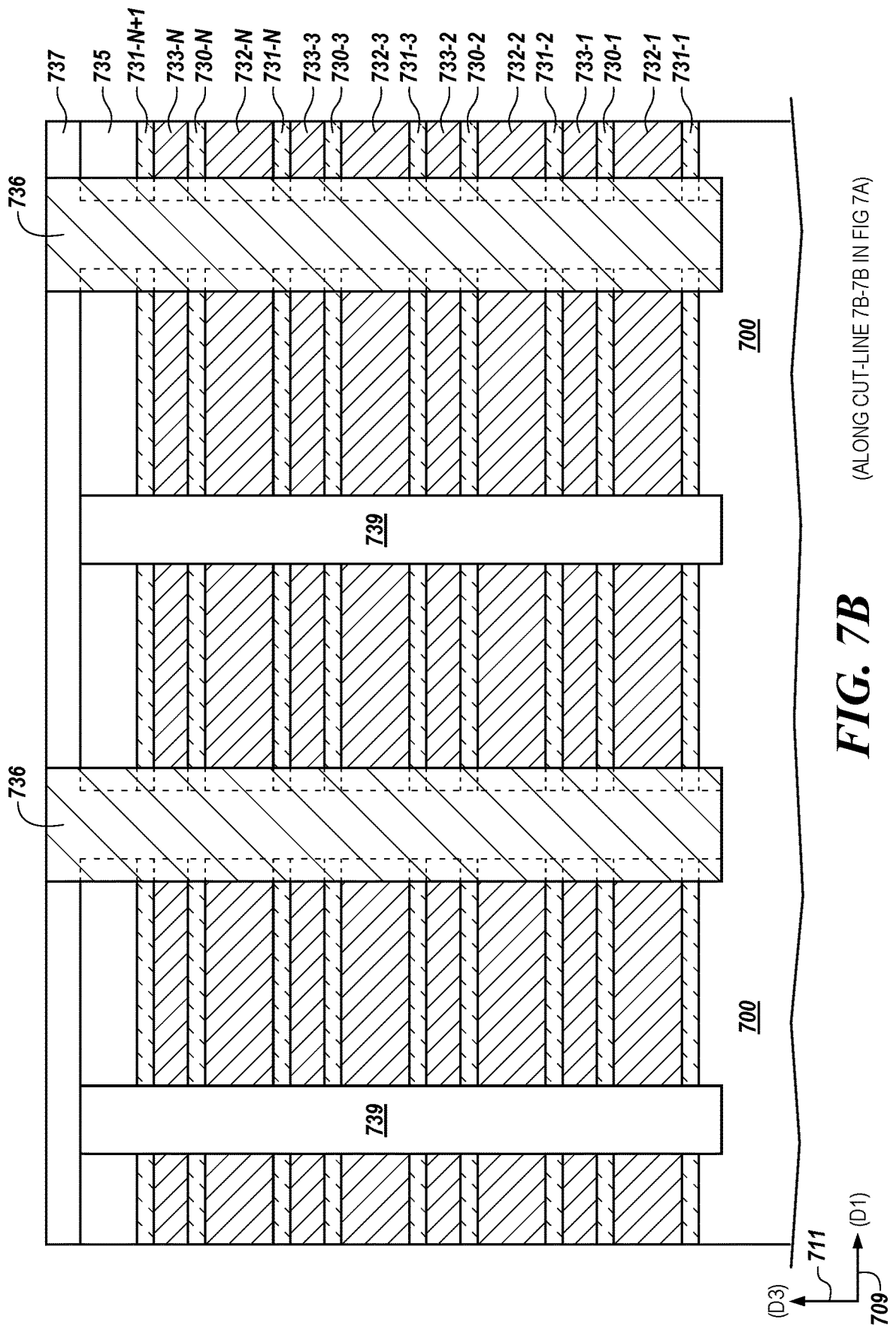

FIGS. 7A to 7B illustrate an example method, at one stage of a semiconductor fabrication process, for forming silicon within horizontal access devices in vertical three-dimensional (3D) memory, in accordance with a number of embodiments of the present disclosure.

FIGS. 8A to 8E illustrate an example method, at another stage of a semiconductor fabrication process, for forming silicon within horizontal access devices in vertical three-dimensional (3D) memory, in accordance with a number of embodiments of the present disclosure.

FIGS. 9A to 9D illustrate an example method, at another stage of a semiconductor fabrication process, for forming silicon within horizontal access devices in vertical three-dimensional (3D) memory, in accordance with a number of embodiments of the present disclosure.

Figure 10:
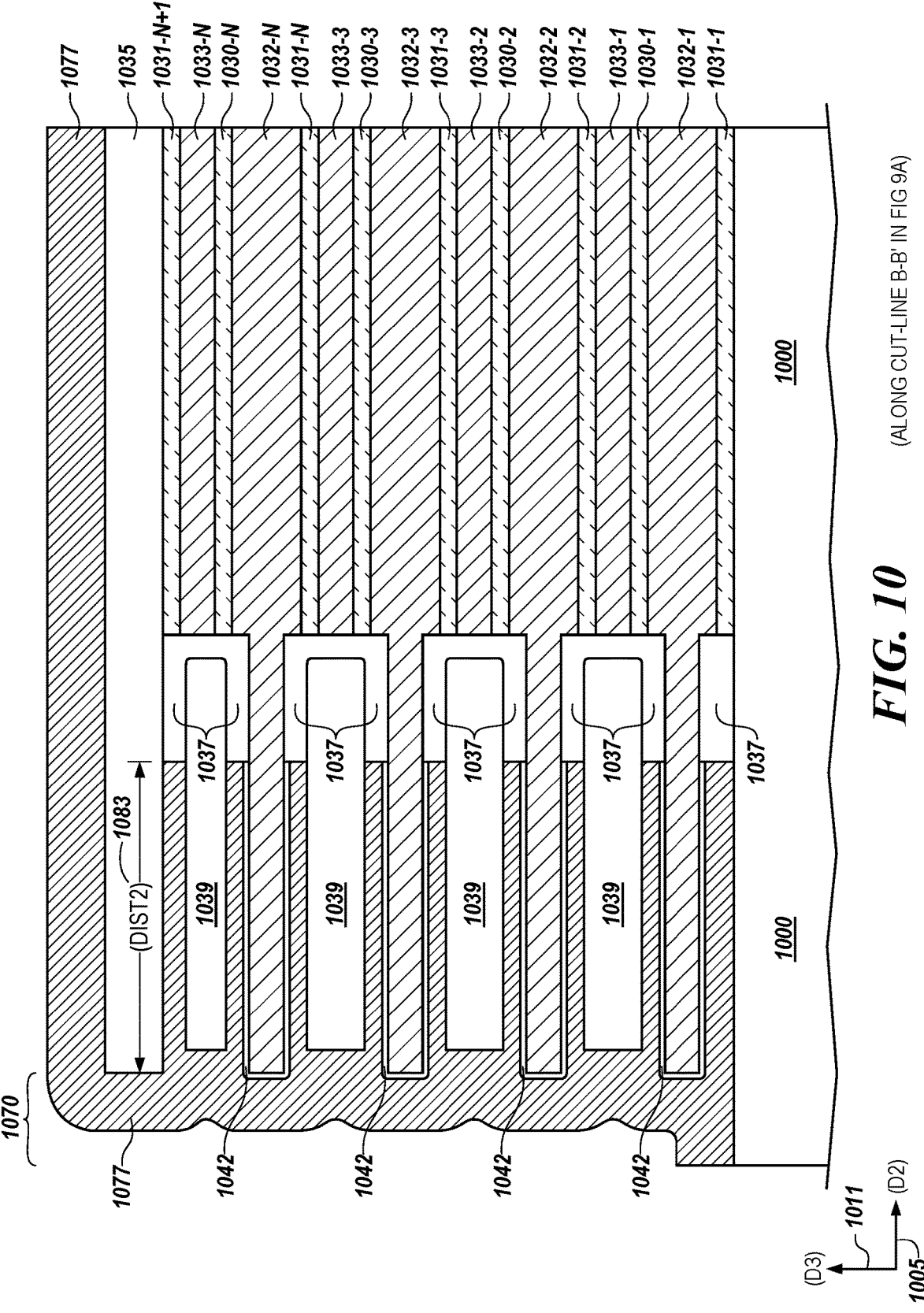

FIG. 10 illustrates an example method, at another stage of a semiconductor fabrication process, for forming silicon within horizontal access devices in vertical three-dimensional (3D) memory, in accordance with a number of embodiments of the present disclosure.

Figure 11A:
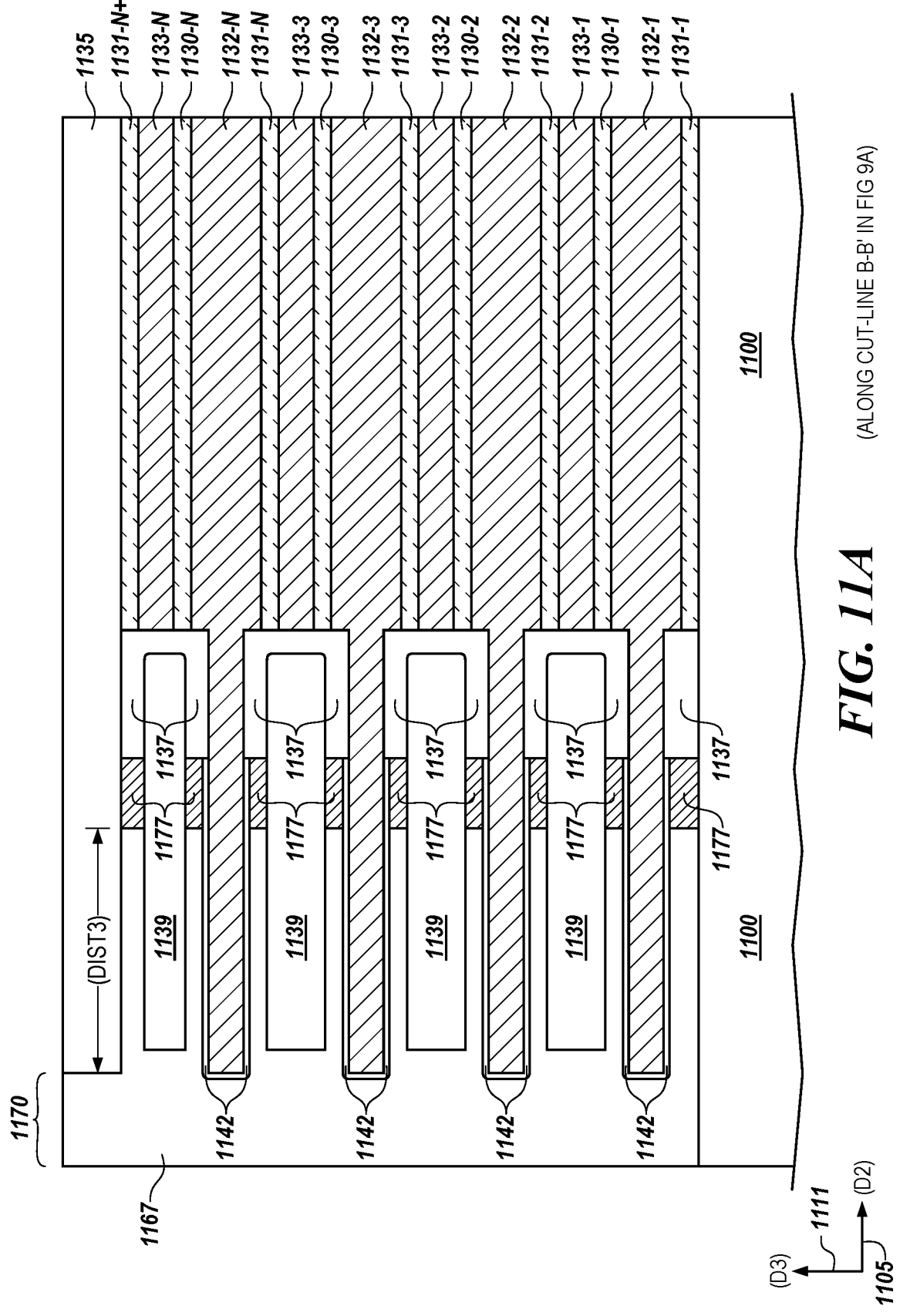
Figure 11B:
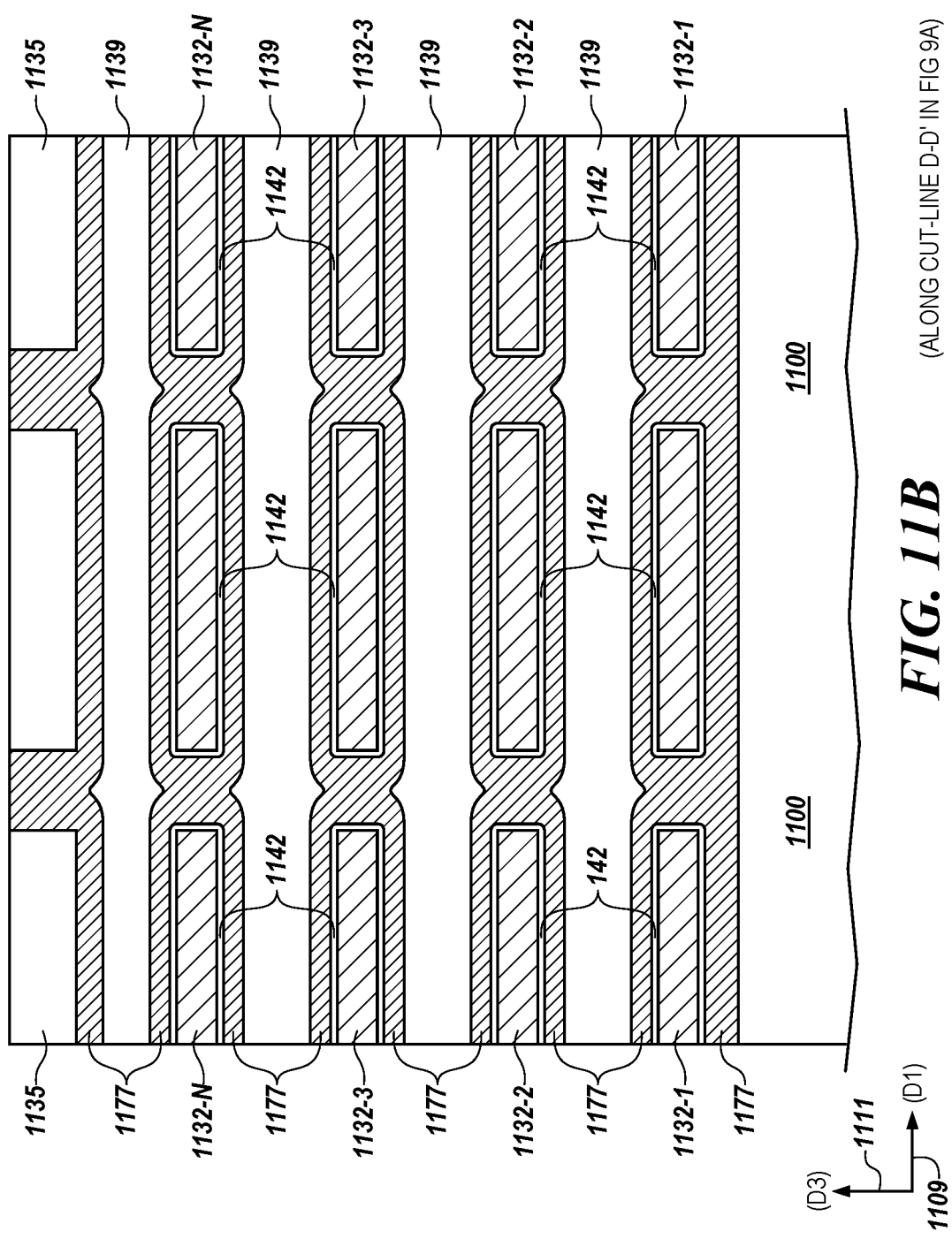

FIGS. 11A to 11B illustrate an example method, at another stage of a semiconductor fabrication process, for forming silicon within horizontal access devices in vertical three-dimensional (3D) memory, in accordance with a number of embodiments of the present disclosure.

Figure 12A:
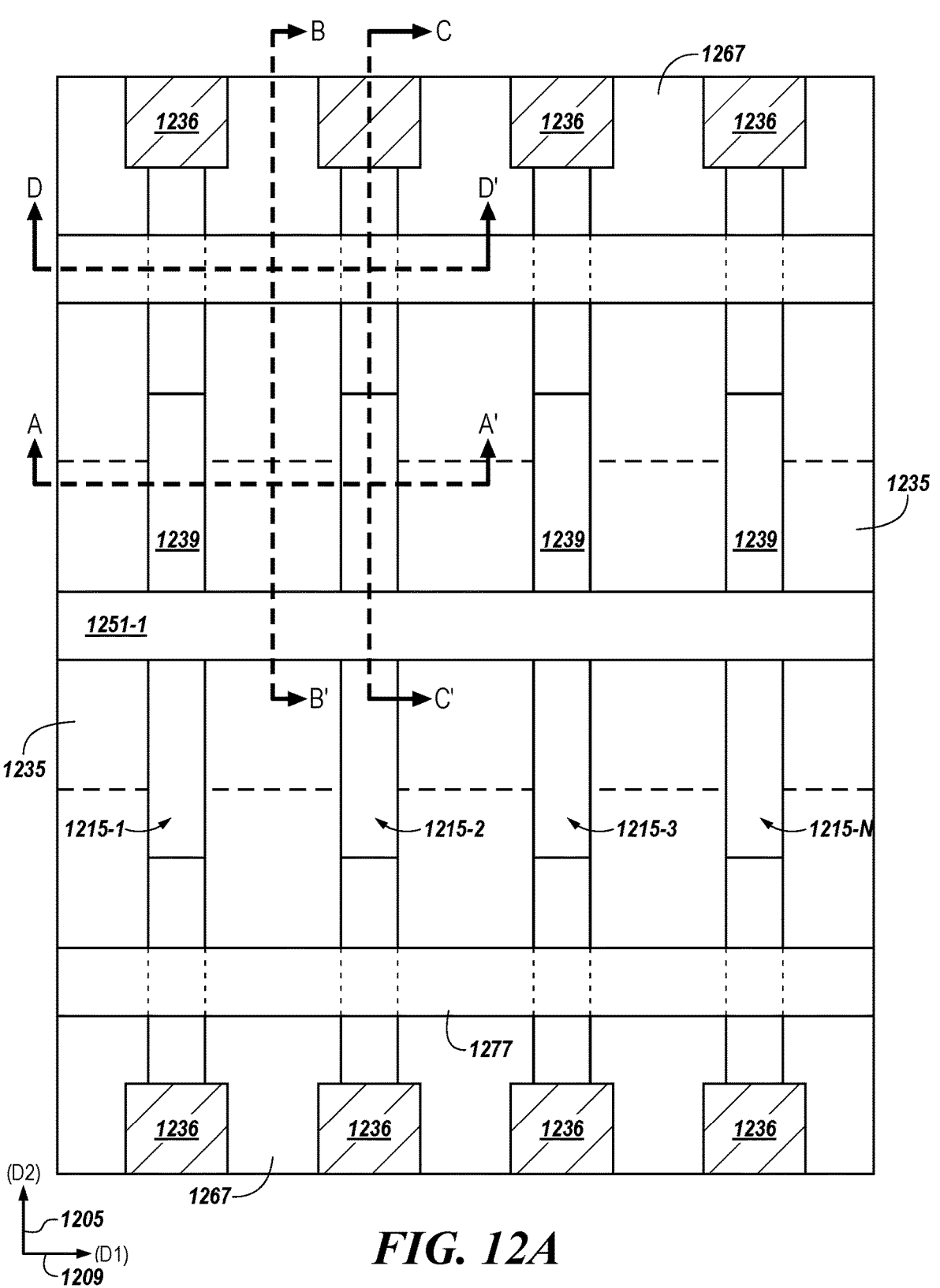
Figure 12B:
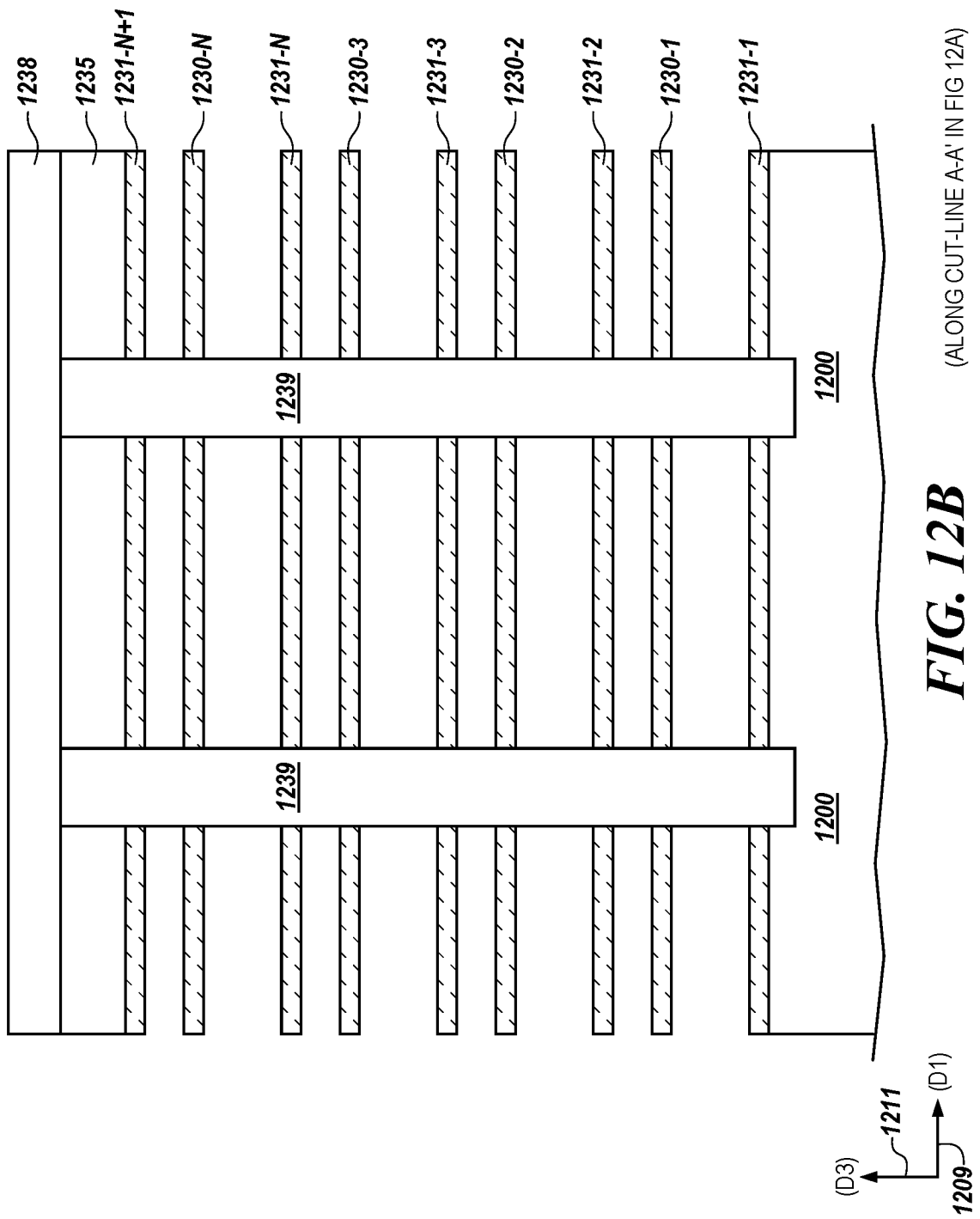
Figure 12C:
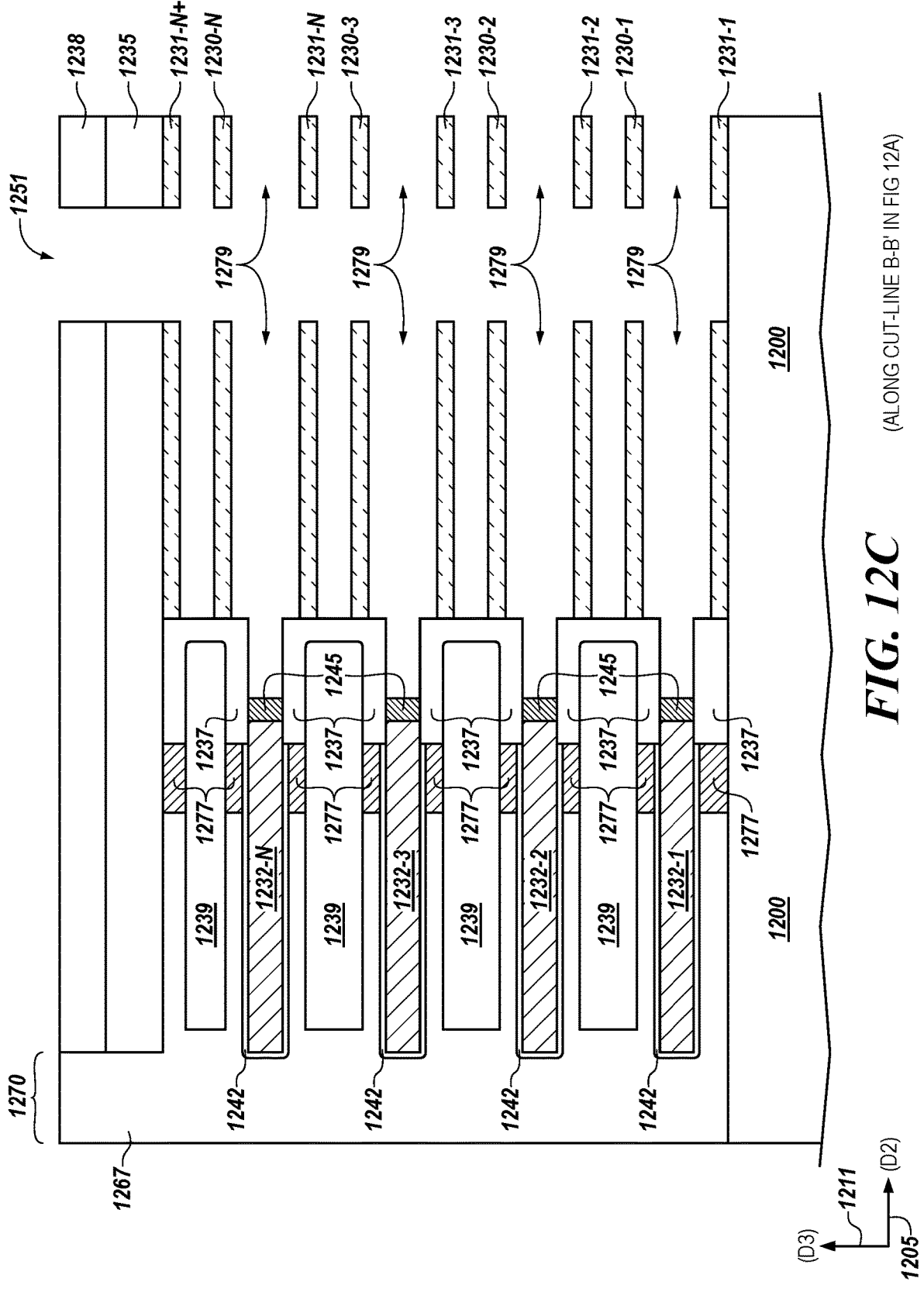

FIGS. 12A to 12C illustrate an example method, at another stage of a semiconductor fabrication process, for forming silicon within horizontal access devices in vertical three-dimensional (3D) memory, in accordance with a number of embodiments of the present disclosure.

Figure 13:
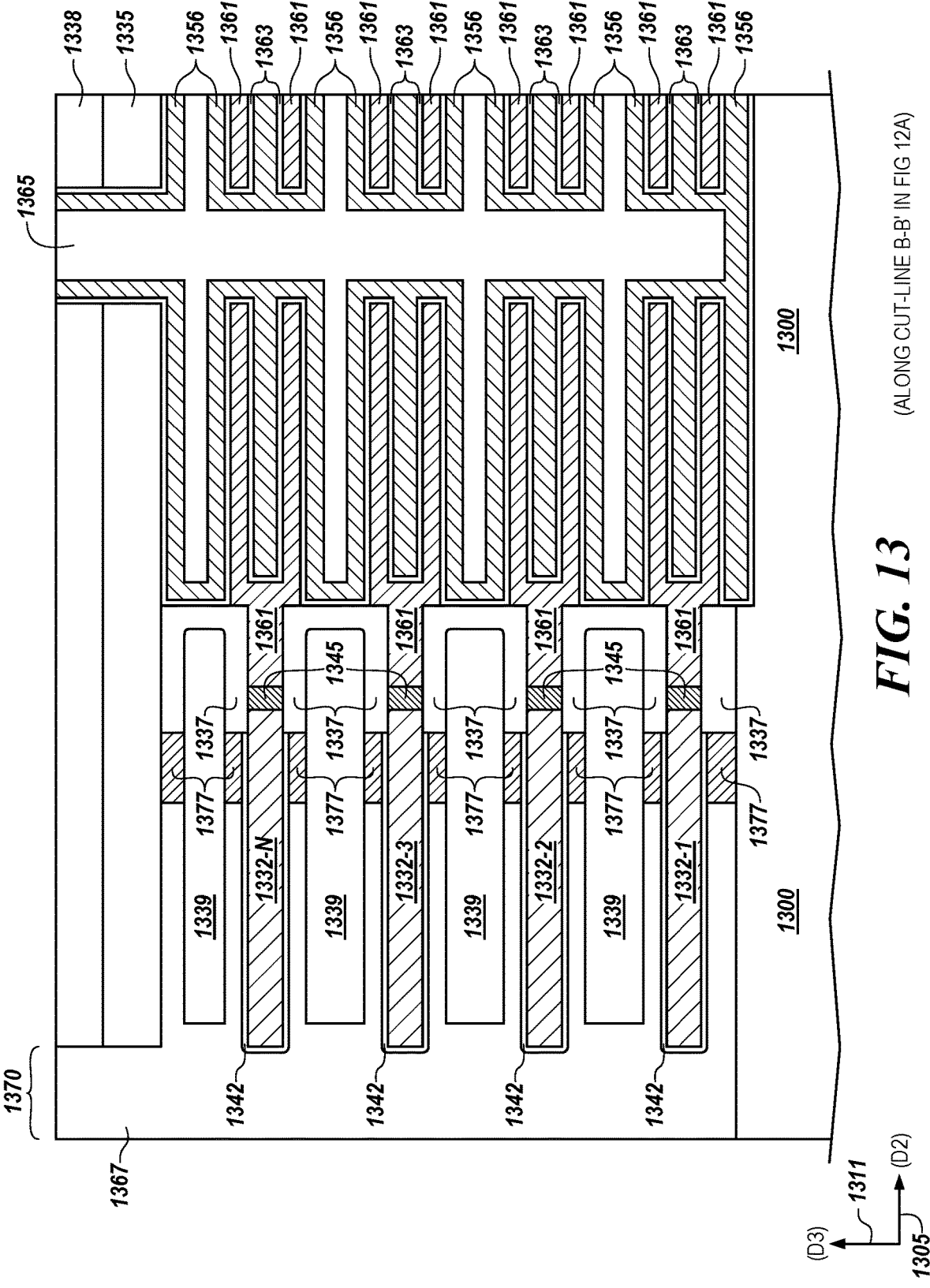

FIG. 13 illustrates an example method, at another stage of a semiconductor fabrication process, for forming silicon within horizontal access devices in vertical three-dimensional (3D) memory, in accordance with a number of embodiments of the present disclosure.

FIGS. 14A to 14D illustrate an example method, at another stage of a semiconductor fabrication process, for forming silicon within horizontal access devices in vertical three-dimensional (3D) memory, in accordance with a number of embodiments of the present disclosure.

Figure 15:
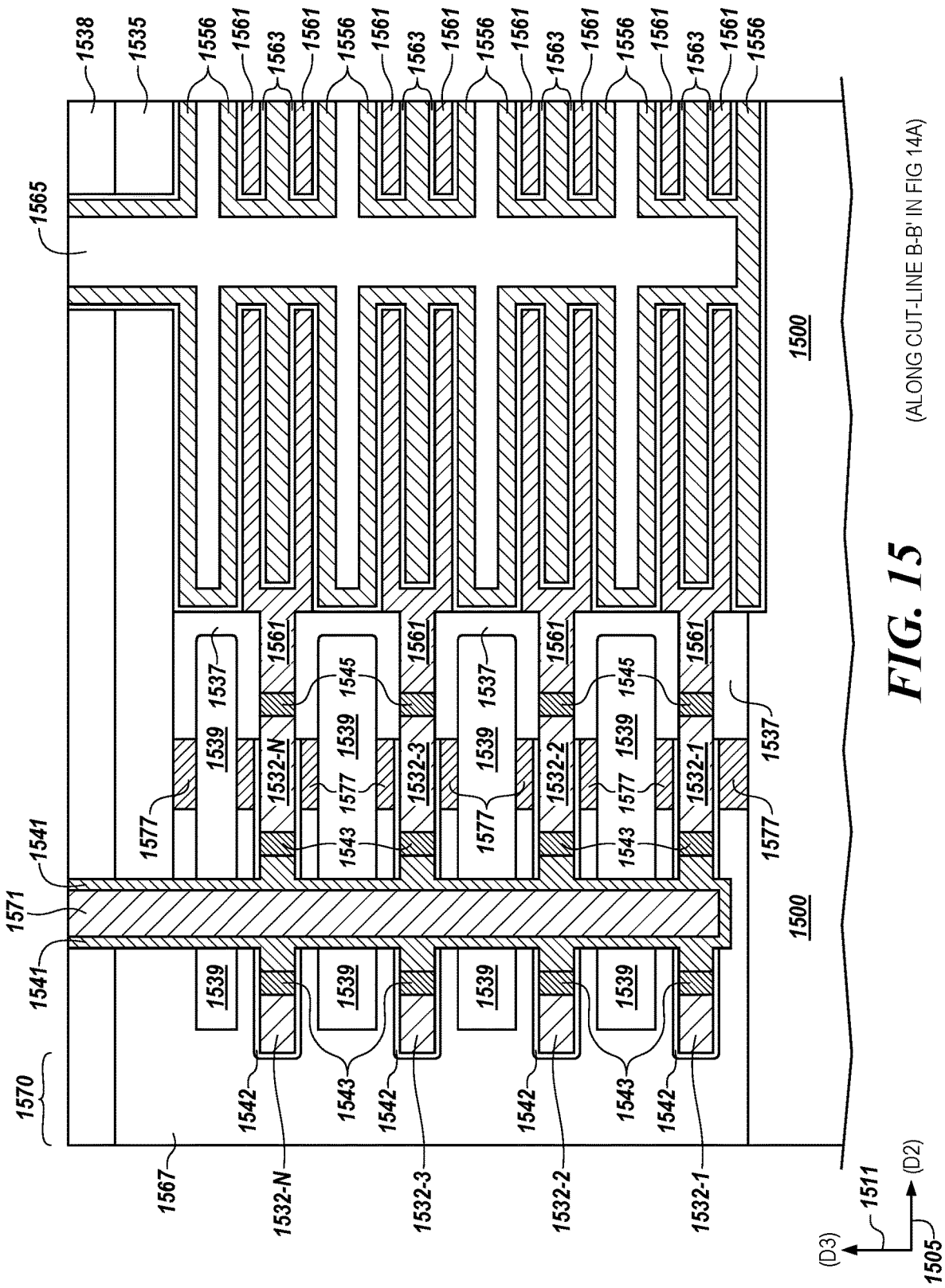
Figure 16:
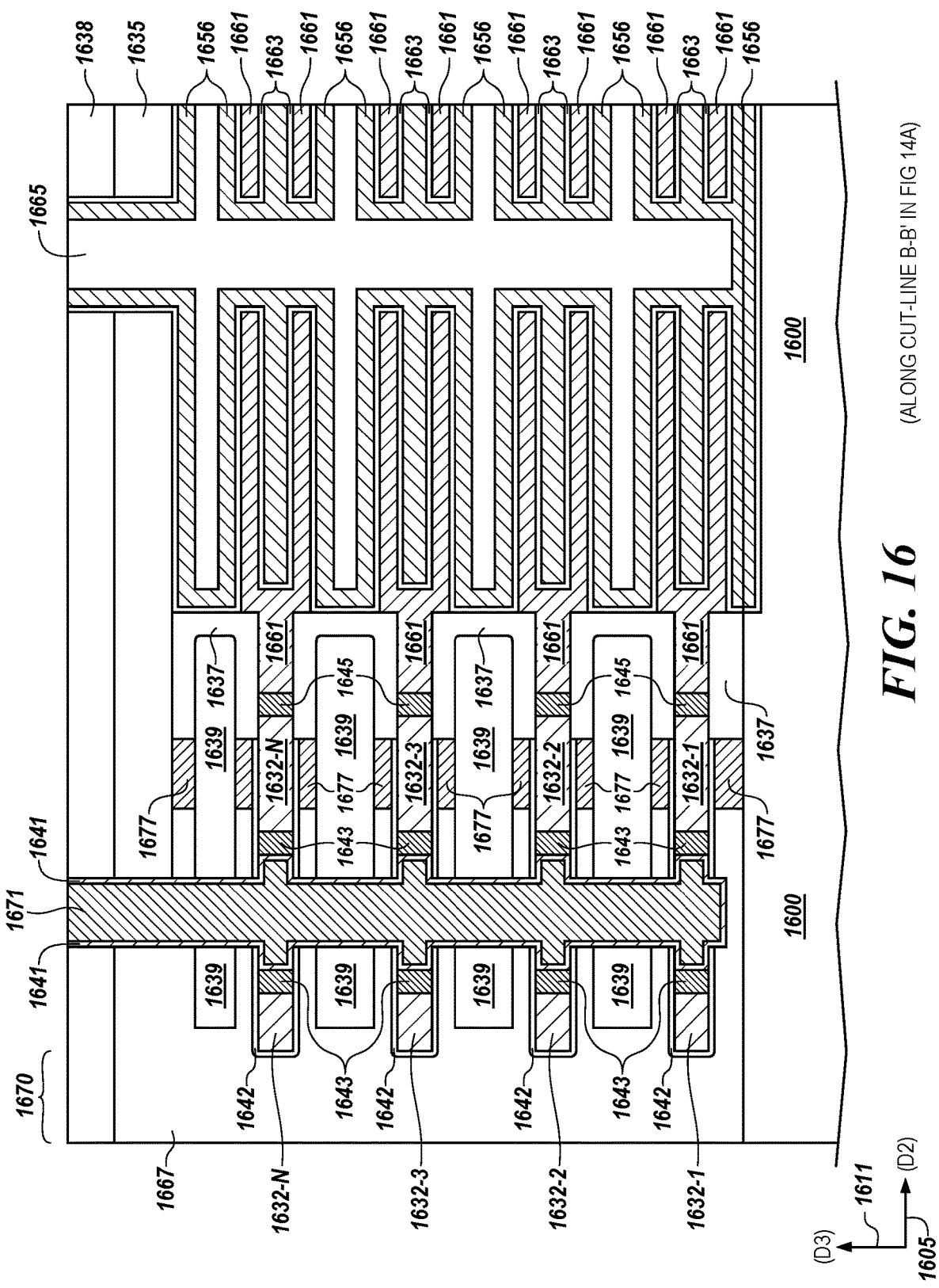

FIGS. 15 to 16 illustrate cross sectional views of an example horizontally oriented access device coupled to a horizontally oriented access lines, having vertical digit lines for semiconductor devices, in accordance with a number of alternate embodiments of the present disclosure.

Figure 17B:
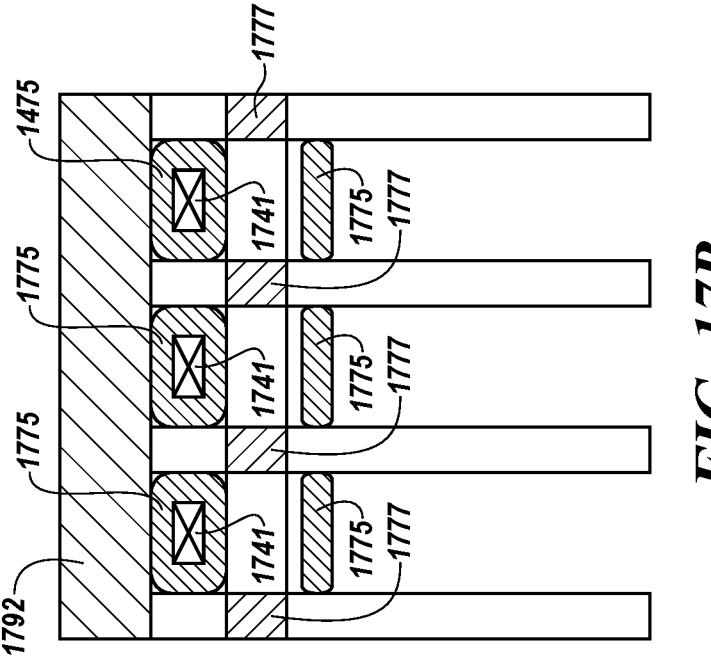
Figure 17A:
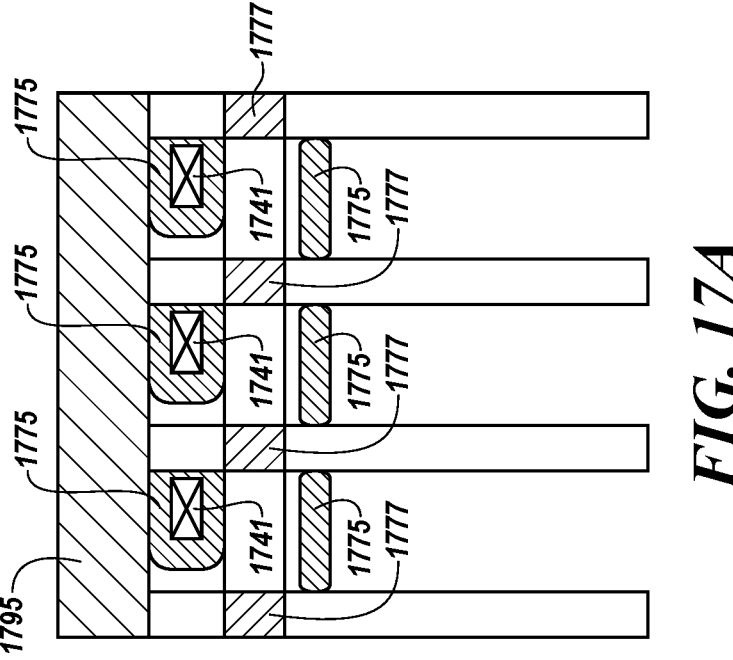

FIGS. 17A to 17B illustrate top views of example horizontally oriented access devices coupled to horizontally oriented access lines, having vertical digit lines for semiconductor devices for asymmetric and symmetric vertical digit lines, in accordance with a number of embodiments of the present disclosure.

Figure 18A:
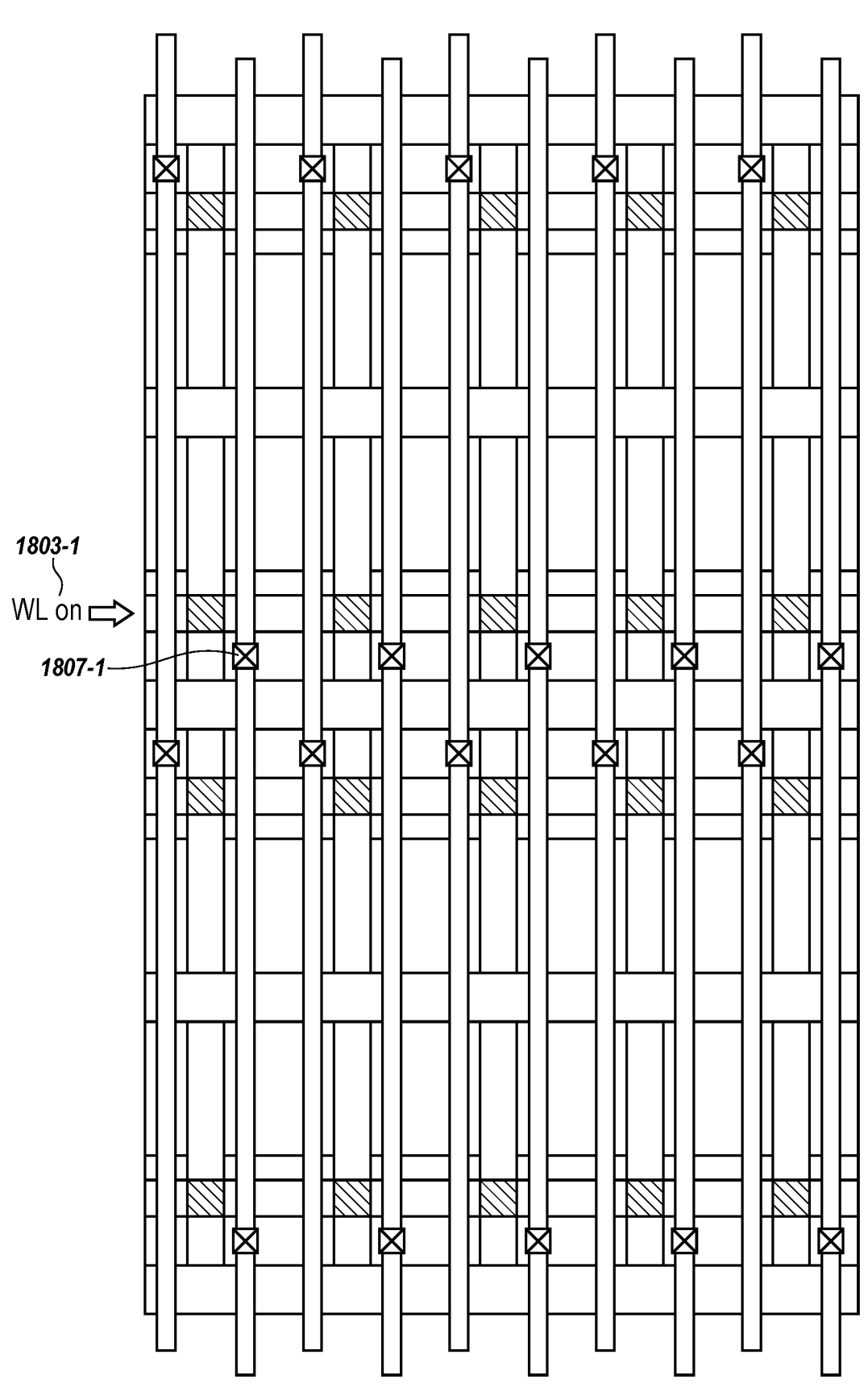
Figure 18B:
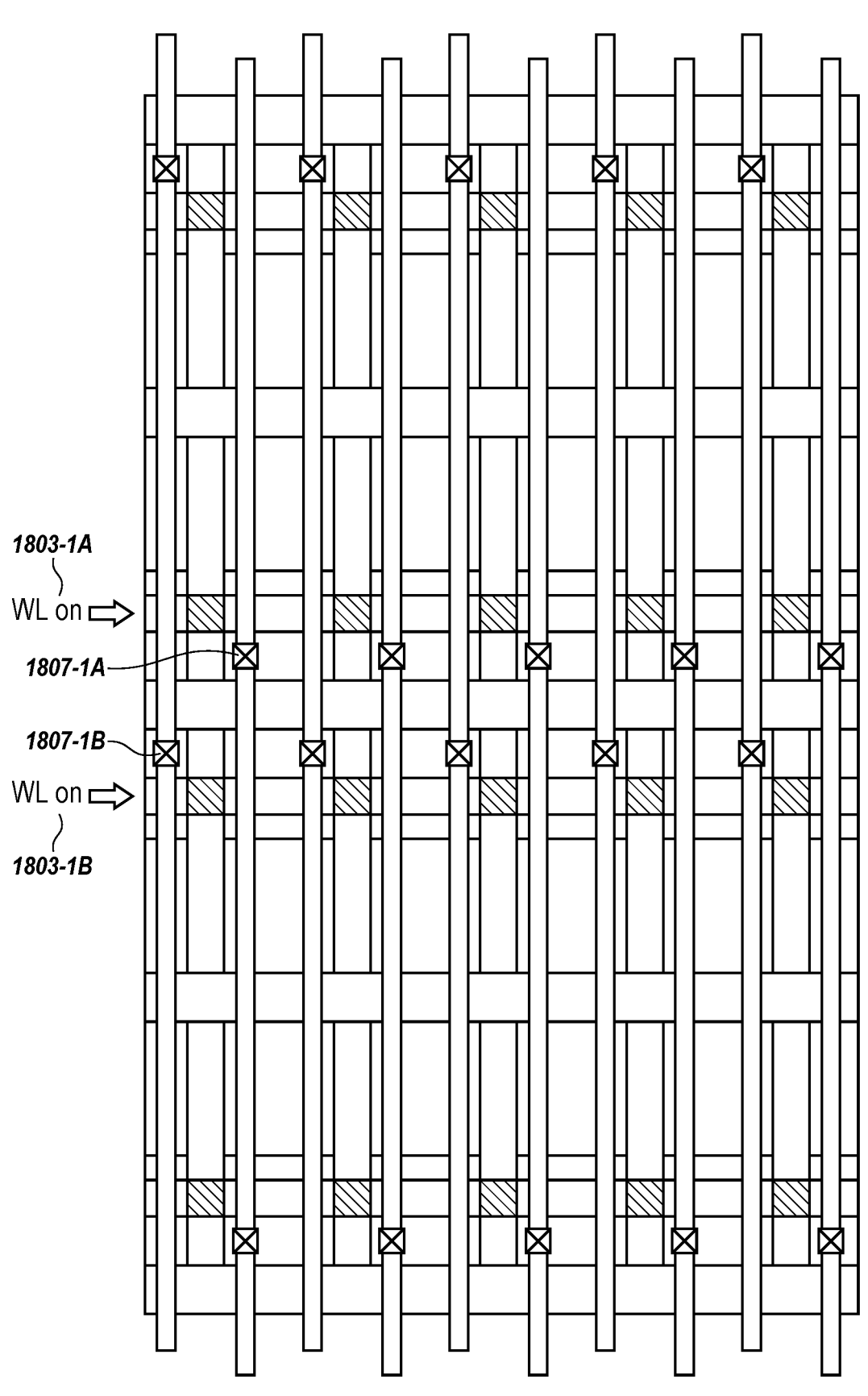

FIGS. 18A to 18B illustrate top down layout views for folded and open digit line architectures having horizontally oriented access devices coupled to horizontally oriented access lines, and having vertical digit lines for semiconductor devices, in accordance with a number of embodiments of the present disclosure.

Figure 19:
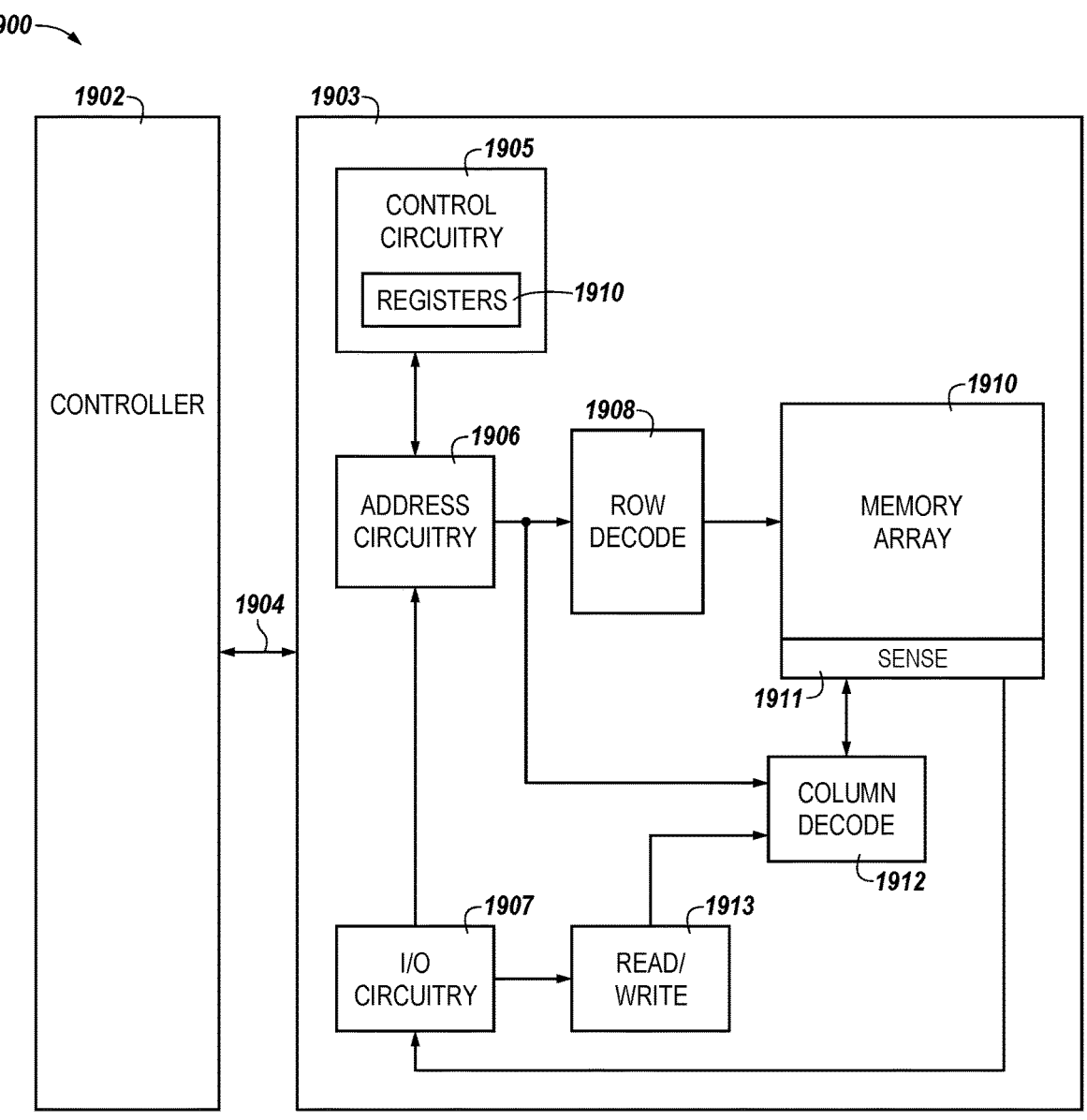

FIG. 19 is a block diagram of an apparatus in the form of a computing system including a memory device in accordance with a number of embodiments of the present disclosure.

DETAILED DESCRIPTION

Embodiments of the present disclosure describe forming support pillars for vertical three-dimensional (3D) memory. Embodiments described herein may involve multiple lateral exhumes, creating multiple silicon platforms, and depositions of material across multiple tires of memory, including silicon platforms. Support pillars may be formed in a third vertical opening to provide support to silicon platforms during the fabrication process. That is, the support pillars may mitigate and/or eliminate deformation and/or breakage of the silicon platform during subsequent processing.

For example, embodiments described herein may include method, systems, and apparatus for forming arrays of vertically stacked memory cells, having horizontally oriented access devices and horizontally oriented storage nodes. The method includes depositing multiple, alternating silicon germanium (SiGe) and silicon (Si) to form horizontal access devices in vertical three-dimensional (3D) memory. A vertically oriented digit line is formed with horizontally oriented access devices and access lines in an array of vertically stacked memory cells. The horizontal access devices are integrated with horizontally oriented access lines having a first source/drain regions and a second source drain regions separated by channel regions and integrated with vertically oriented digit lines. A plurality of spaced, third vertical openings are formed through a first dielectric material in the vertical stack adjacent areas where access device nodes will be formed. Support pillar material is deposited in the plurality of spaced, third vertical openings to form structural support pillars.

The silicon germanium (SiGe) material and potentially a sacrificial silicon (Si) material can be selectively etched to form the silicon platform and creating a plurality of first horizontal openings. The support pillar will remain after the silicon germanium (SiGe) material and, potentially, the sacrificial silicon (Si) material is selectively etched to provide support to the silicon platforms during subsequent fabrication processing. Completing subsequent fabrication using the support pillars can prevent cantilevered silicon platforms which has a risk of causing silicon platform deformation or breakage during fabrication.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Figure 1A:
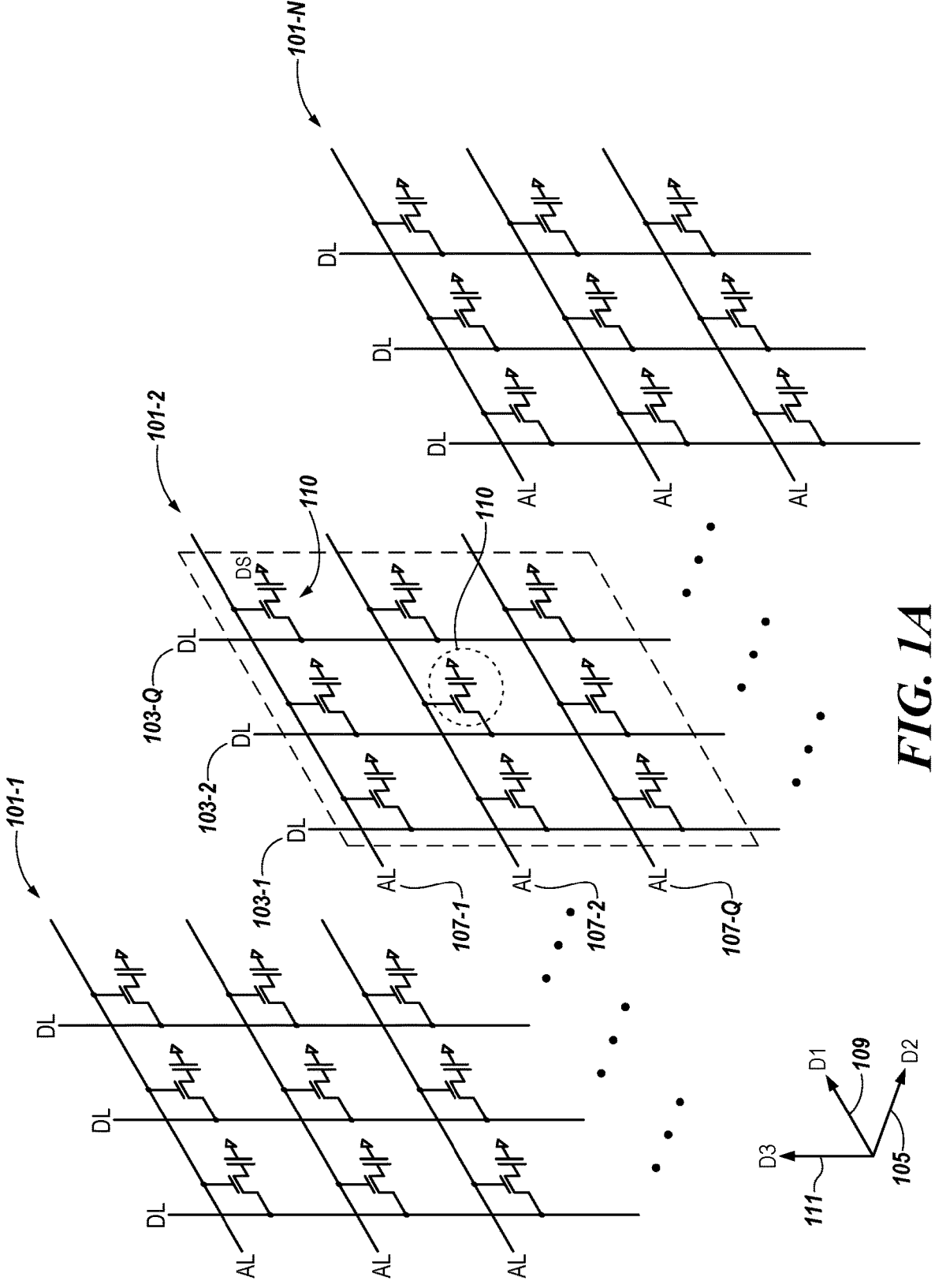
FIG. 1A is a schematic illustration of a horizontal access device in a vertical three-dimensional (3D) memory in accordance a number of embodiments of the present disclosure.

FIG. 1A is a block diagram of an apparatus in accordance with a number of embodiments of the present disclosure. FIG. 1A illustrates a circuit diagram showing a cell array of a three-dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a second direction (D3) 111. According to embodiments, the first direction (D1) 109 and the second direction (D2) 105 may be considered in a horizontal ("X-Y") plane. The second direction (D3) 111 may be considered in a vertical ("Z") plane. Hence, according to embodiments described herein, the digit lines 103-1, 103-2, . . . , 103-Q are extending in a vertical direction, e.g., second direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a second direction (D3) 111.

The digit lines 103-1, 103-2, . . . , 103-Q may be or include conductive patterns (e.g., metal lines) extending in a vertical direction with respect to the substrate, e.g., in a second direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
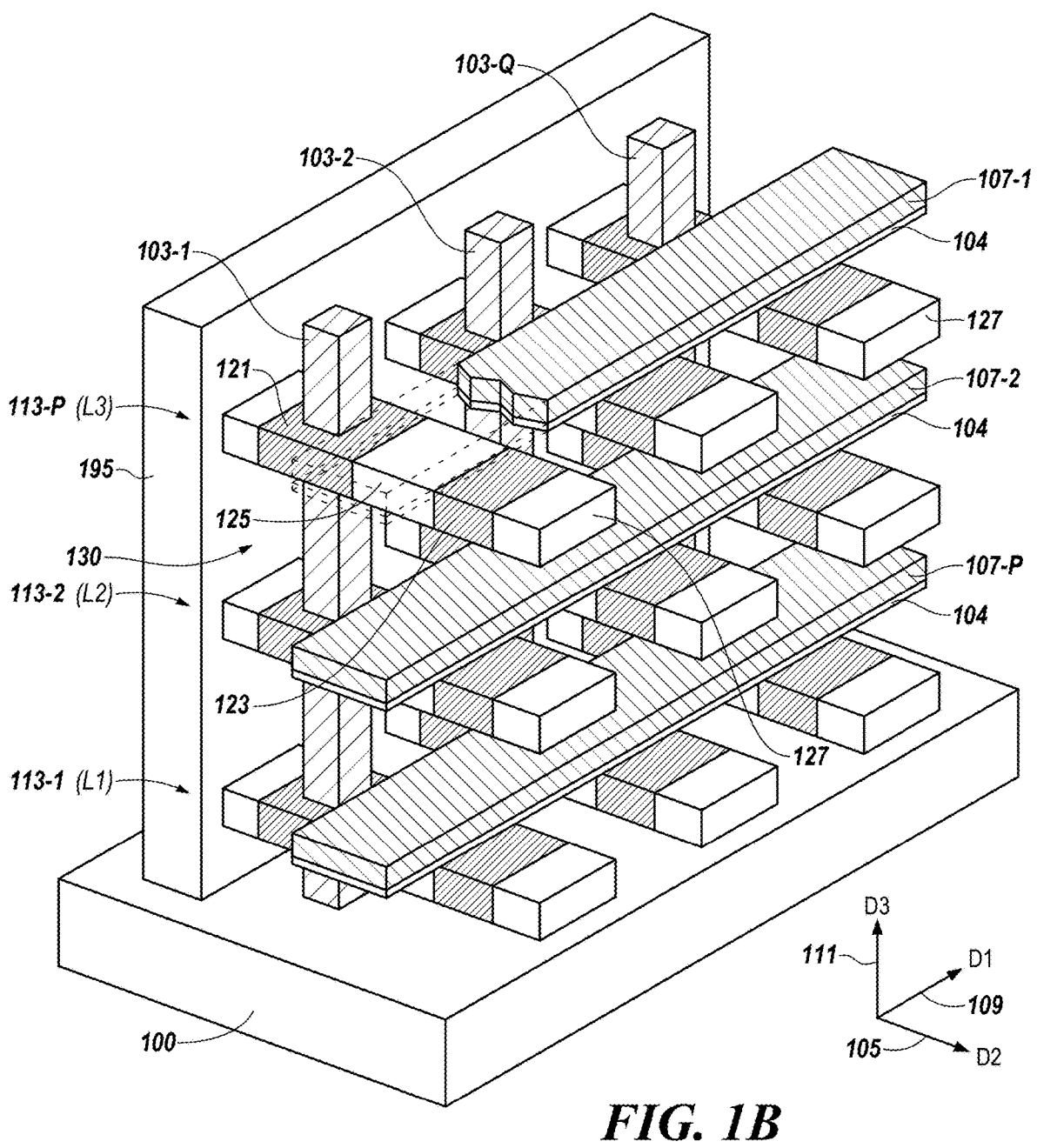
FIG. 1B is a perspective view illustrating a portion of a horizontal access devices in vertical three-dimensional (3D) memory in accordance with a number of embodiments of the present disclosure.

FIG. 1B illustrates a perspective view showing a three-dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., second direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a third level (L3). The repeating, vertical levels, L1, L2, and L3, may be arranged, e.g., "stacked", a vertical direction, e.g., second direction (D3) 111 shown in FIG. 1B, and may be separated from the substrate 100 by an insulator material. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 130, e.g., transistors, may be formed in a plurality of iterations of vertically, repeating layers within each level, as described in more detail below in connection with FIGS. 4-14, and may extend horizontally in the second direction (D2) 105, analogous to second direction (D2) 105 shown in FIG. 1B.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. According to embodiments described herein, and as seen further below, the channel region 125 is formed of epitaxially grown, single crystalline silicon. However, in alternate embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the second direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a second direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the second direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the second direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the second direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the second level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the second level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact 195 may be formed extending in the first direction (D1) 109 along an end surface of the horizontally oriented access devices 130, e.g., transistors, in each level (L1) 113-1, (L2) 113-2, and (L3) 113-P above the substrate 100. The body contact 195 may be connected to a body e.g., body region, of the horizontally oriented access devices 130, e.g., transistors, in each memory cell, e.g., memory cell 110 in FIG. 1A. The body contact 195 may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
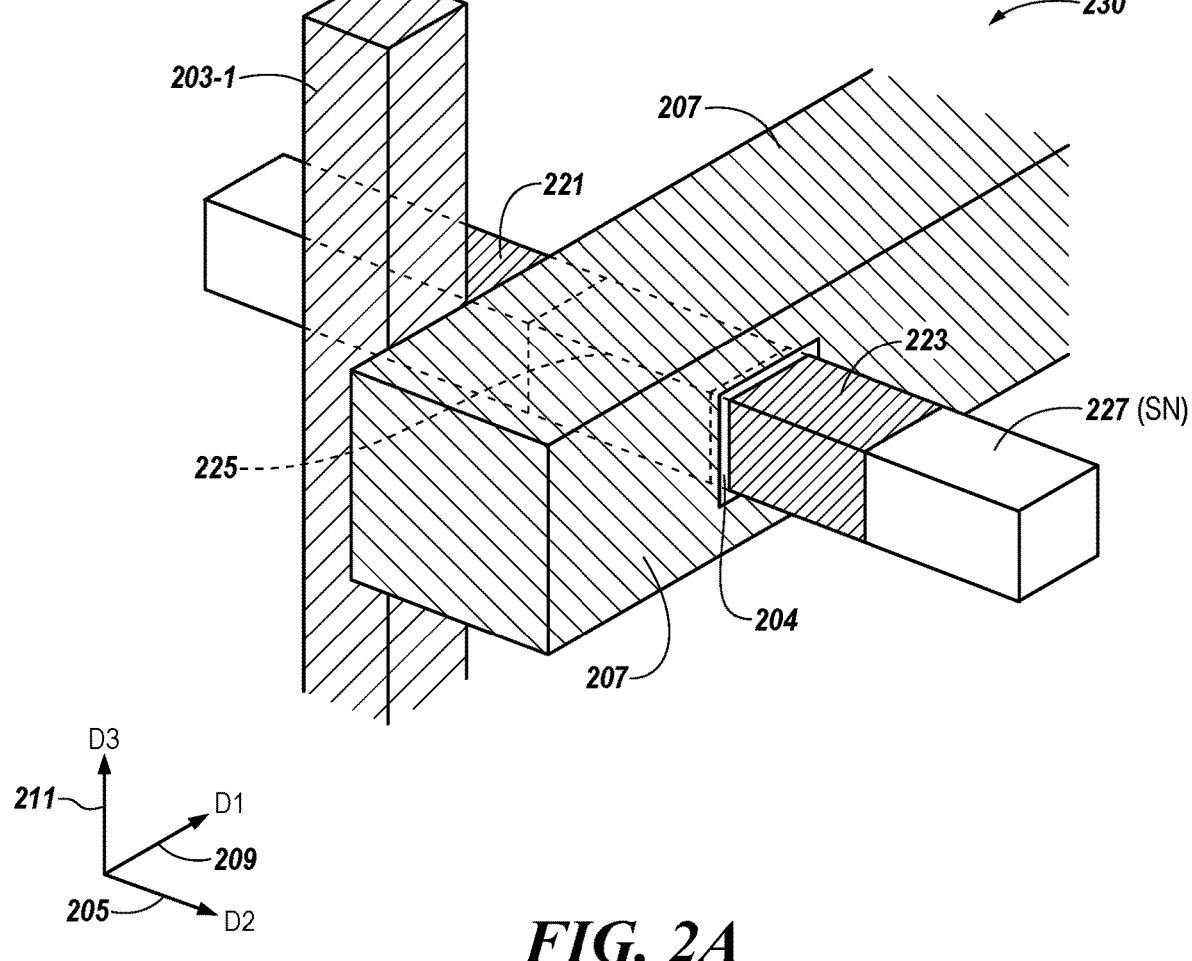
FIGS. 2A-2B illustrate a portion of a horizontal access devices in vertical three-dimensional (3D) memory in accordance with a number of embodiments of the present disclosure.

FIG. 2A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2A, the first and the second source/drain regions, 221 and 223, may be impurity doped regions to the laterally oriented access devices 230, e.g., transistors. The first and the second source/drain regions, 221 and 223, may be analogous to the first and the second source/drain regions 121 and 123 shown in FIG. 1B. The first and the second source/drain regions may be separated by a channel 225 formed in a body of semiconductor material, e.g., body region of the horizontally oriented access devices 230, e.g., transistors. The first and the second source/drain regions, 221 and 223, may be formed from an n-type or p-type dopant doped in the body region. Embodiments are not so limited.

For example, for an n-type conductivity transistor construction the body region of the laterally oriented access devices 230, e.g., transistors, may be formed of a low doped p-type (p-) semiconductor material. In one embodiment, the body region and the channel 225 separating the first and the second source/drain regions, 221 and 223, may include a low doped, p-type (e.g., low dopant concentration (p-)) polysilicon (Si) material consisting of boron (B) atoms as an impurity dopant to the polycrystalline silicon. The first and the second source/drain regions, 221 and 223, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide $(In_2O_3)$, or indium tin oxide $(In_{2-x}Sn_xO_3)$, formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 221 and 221, may include a high dopant concentration, n-type conductivity impurity (e.g., high dopant (n+)) doped in the first and the second source/drain regions, 221 and 223. In some embodiments, the high dopant, n-type conductivity first and second drain regions 221 and 223 may include a high concentration of phosphorus (P) atoms deposited therein. Embodiments, however, are not limited to this example. In other embodiments, the horizontally oriented access devices 230, e.g., transistors, may be of a p-type conductivity construction in which case the impurity, e.g., dopant, conductivity types would be reversed.

As shown in the example embodiment of FIG. 2A, the first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in electrical contact with the body contact. Further, as shown in the example embodiment of FIG. 2A, an access line, e.g., 207-1, analogous to the access lines 207-1, 207-2, . . . , 207-Q in FIGS. 2 and 107-1, 107-2, . . . , 107-Q shown in FIG. 1, may disposed on a top surface opposing and coupled to a channel region 225, separated therefrom by a gate dielectric 204. The gate dielectric material 204 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 204 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 2A, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed asymmetrically adjacent in electrical contact with the first source/drain regions 221. The digit line 203-1 may be formed as asymmetrically to reserve room for a body contact in the channel region 225.

Figure 2B:
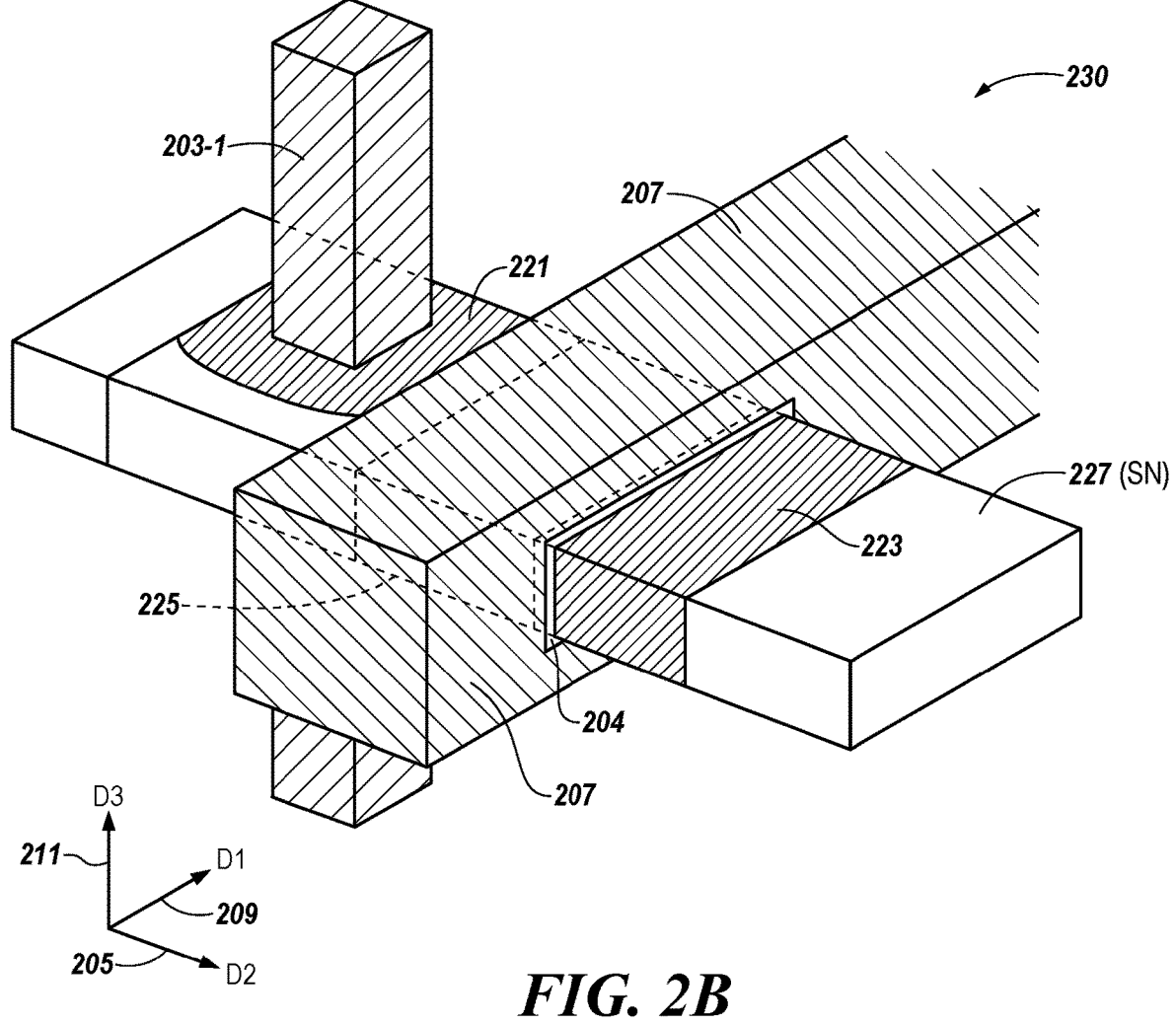

FIG. 2B illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2B, the first and the second source/drain regions, 221 and 223, may be impurity doped regions to the laterally oriented access devices 230, e.g., transistors. The first and the second source/drain regions, 221 and 223, may be analogous to the first and the second source/drain regions 221 and 223 shown in FIG. 2 and the first and the second source/drain regions 221 and 223 shown in FIG. 2A. The first and the second source/drain regions may be separated by a channel 225 formed in a body of semiconductor material, e.g., body region, of the horizontally oriented access devices 230, e.g., transistors. The first and the second source/drain regions, 221 and 223, may be formed from an n-type or p-type dopant doped in the body region. Embodiments are not so limited.

As shown in the example embodiment of FIG. 2B, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed symmetrically, in vertical alignment, in electrical contact with the first source/drain region 221. The digit line 203-1 may be formed in contact with an insulator material such that there is no body contact within channel 225.

As shown in the example embodiment of FIG. 2B, the digit line 203-1 may be formed symmetrically within the first source/drain region 221 such that the first source/drain region 221 surrounds the digit line 203-1 all around. The first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in contact with the body contact. An insulator material may fill the body contact such that the first source/drain region 221 may not be in electrical contact with channel 225. Further, as shown in the example embodiment of FIG. 2B, an access line, e.g., 207-1, analogous to the access lines 107-1, 107-2, . . . , 107-Q shown in FIG. 1, may disposed all around and coupled to a channel region 225, separated therefrom by a gate dielectric 204.

FIG. 3A illustrates a cross-sectional view, at one stage of a semiconductor fabrication process, for forming silicon within horizontal access devices in vertical three-dimensional (3D) memory, such as illustrated in FIGS. 1-2, and in accordance with a number of embodiments of the present disclosure.

In the embodiment shown in the example of FIG. 3A, the method comprises epitaxially forming multiple, alternating layers of a silicon germanium (SiGe) material and a silicon (Si) material in repeating iterations, e.g., tier 1, tier 2, tier 3, etc., to form a vertical stack 301 on a working surface of a semiconductor substrate 300. Epitaxially forming the layers of silicon (Si) material comprises epitaxially growing a first Si layer having a first thickness (tSi1) and a second layer of Si having a second thickness (tSi2) that is the different than the first thickness (tSi1). The alternating layers in each repeating tier, e.g., tier 1, tier 2, tier 3, etc., may include first epitaxially grown SiGe layers 331-1, 331-2, . . . , 331-N (collectively referred to as SiGe layer 331) of a thickness (tSiGe), first epitaxially grown Si layers 332-1, 332-2, . . . , 332-N (collectively referred to as first Si layer 332) of a first thickness (tSi1), second epitaxially grown SiGe layers 330-1, 330-2, . . . , 330-N (collectively referred to as SiGe layer 330) also having a thickness (tSiGe), and second epitaxially grown Si layers 333-1, 333-2, . . . , 333-N (collectively referred to as Si layer 333) of a second thickness (tSi2). In this embodiment, four layers of alternating, varying thickness (tSiGe), (tSi1), and (tSi2) may be deposited to form a repeating tiers to the repeating iterations. For example, the four alternating layers in a first tier may include a first SiGe layer 331-1 (tSiGe), a first Si layer 332-1 of a first thickness (tSi1) epitaxially grown on the first SiGe layer 331-1, a second SiGe layer 330-1 (also (tSiGe)) epitaxially grown on the first Si layer 332-1, and a second Si layer 333-1 of a second thickness (tSi2) epitaxially grown on the second SiGe layer 330-1.

In the embodiment of FIG. 3A, the first SiGe layer 331 and the second SiGe layer 330 can be epitaxially grown to have a same thickness (tSiGe). In this example embodiment, the first SiGe layer 331 and the second SiGe layer 330 can be epitaxially grown to have a thickness (tSiGe), e.g., vertical height in the second direction (D3), in a range of eighty (80) angstroms (Å) to nine hundred (900) angstroms (Å). For example, in one example embodiment of FIG. 3A, the SiGe layers 331 and 330 are epitaxially grown to a thickness of approximately six hundred (600) angstroms (Å). In one embodiment, the first Si layer 332 can have a vertical thickness (tSi1) less than a thickness (tSi2) of the second Si layer 333. For example, the first Si layer 332 can be epitaxially grown to have a thickness, e.g., vertical height, in a range of one hundred (100) angstroms (Å) to four hundred (400) angstroms (Å) while the second Si layer 333 can be epitaxially grown to have a thickness e.g., vertical height, in a range of two hundred (20) angstroms (Å) to eight hundred (800) angstroms (Å). The vertical thickness (tSiGe) of the first SiGe layer 331 and the second SiGe layer 330 may be more than the thickness (tSi1 and tSi2) of either of the first Si layer 333 or the second Si layer 332. Embodiments, however, are not limited to these examples. As shown in FIG. 3A, a vertical direction 311 is illustrated as a second direction (D3), e.g., z-direction in an x-y-z coordinate system, analogous to the third direction (D3), among first, second, and second directions, shown in FIGS. 1-2.

In some embodiments, the epitaxially grown SiGe may be an epitaxially grown mix of silicon and germanium. By way of example, and not by way of limitation, the epitaxially grown silicon germanium (SiGe) layers 331 and 330 may be grown on the substrate material 300 and/or silicon (Si) layers 332 and 333. Embodiments are not limited to these examples. The epitaxially grown, single crystalline silicon (Si) layers 332 and 333 may be a low doped, p-type (p-) epitaxially grown, single crystalline silicon (Si) material. The layers of the silicon (Si) material, may be formed by epitaxially growing silicon (Si) on the epitaxially grown silicon germanium (SiGe) material. For example, after the epitaxially grown silicon germanium (SiGe) layers 331 and 330 have been formed, a silicon (Si) seed of the epitaxially grown silicon germanium (SiGe) layers 331 and 330 may be used to epitaxially grow the single crystalline silicon (Si) layers 332 and 333. Embodiments, however, are not limited to these examples.

The repeating iterations of alternating epitaxially grown silicon germanium (SiGe) layers 331 and 330 and epitaxially grown, single crystalline silicon (Si) layers 332 and 333 may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a epitaxially grown silicon germanium (SiGe) and a epitaxially grown, single crystalline silicon (Si) material, in repeating iterations to form the vertical stack 301.

The layers may occur in repeating iterations vertically. In the example of FIGS. 3A, four tiers, numbered 1, 2, 3, and 4, of the repeating iterations are shown. For example, the stack may include: a first SiGe layer 331-1 (tSiGe), a first Si layer 332-1 of a first thickness (tSi1), a second SiGe layer 330-1 (tSiGe), a second Si layer 333-1 of a second thickness (tSi2) forming tier 1, another first SiGe layer 331-2 (tSiGe), another first Si layer 332-2 of a first thickness (tSi1), another second SiGe layer 330-2 (tSiGe), another second Si layer 333-2 of a second thickness (tSi2) forming tier 2, etc., in further repeating iterations. Embodiments, however, are not limited to this example.

FIG. 3B illustrates another cross-sectional view of one example embodiment for forming multiple, alternating layers of grown silicon germanium (SiGe) and epitaxially grown, single crystalline silicon (Si) to form horizontal access devices in vertical three-dimensional (3D) memory, such as illustrated in FIGS. 1-2, in order to provide for defect mitigation and selective etch in accordance with a number of embodiments of the present disclosure.

In the embodiment shown in the example of FIG. 3B, the method comprises epitaxially forming alternating layers of a silicon germanium (SiGe) material and a silicon (Si) material in repeating iterations to form a vertical stack 301 on a working surface of a semiconductor substrate 300. The multiple, alternating layers in each tier may include a first SiGe layer 331-1, 331-2, . . . , 331-N (collectively referred to as SiGe layer 331) having a first thickness (tSiGe1), a first Si layer 333-1, 333-2, . . . , 333-N (collectively referred to as first Si layer 333) of a first thickness (tSi1), a second SiGe layer 330-1, 330-2, . . . , 330-N (collectively referred to as SiGe layer 330) having a second thickness (tSiGe2), a second Si layer 334-1, 334-2, . . . , 334-N (collectively referred to as Si layer 334) of a second thickness (tSi2), a third SiGe layer 347-1, 347-2, . . . , 347-N (collectively referred to as SiGe layer 347) having a third thickness (tSiGe3), and a third Si layer 332-1, 332-2, . . . , 332-N (collectively referred to as third Si layer 332) of a third thickness (tSi3).

Growth of a multi-pitch superlattice comprising multiple SiGe/Si/SiGe/Si layers reduces the average percentage (%) germanium (Ge) which enables the epitaxial SiGe layer to remain metastably strained to the silicon (Si) substrate and/or epitaxially grown silicon (Si) layers when formed under suitable growth conditions. According to embodiments, SiGe layer composition may be targeted to enable selective removal relative to Si layers for forming single crystalline silicon (Si) device channel isolation. SiGe etch rate may depend exponentially on the percentage (%) germanium within a tier, e.g., tier 1. Compensation for the germanium % in SiGe layers cannot be minimized solely for epitaxial growth strain management and defect mitigation without a resulting loss of selectivity and/or etch rate which hinders 3D DRAM integration. Embodiments provided herein allow for both epitaxial growth strain management for layer quality while enabling SiGe:Si selective etch for 3D DRAM memory applications.

In the example embodiment of FIG. 3B, a strained multi-pitch (SiGe/Si/SiGe)n/Si superlattice is epitaxially grown on a (001) crystalline plane orientation, silicon (Si) substrate where "n" is a non-integer >1. This example embodiment illustrates at least six (6) layers, including multiple, alternating layers of epitaxially grown silicon germanium (SiGe) and epitaxially grown silicon (Si) of varying thickness are epitaxially grown to form tiers, e.g., tier 1, tier 2, etc., of the repeating iterations. For example, as shown in FIG. 3B, the multiple, alternating layers in a first tier may include a first SiGe layer 331-1 (tSiGe1) epitaxially grown on a (001) crystalline plane orientation, silicon (Si) substrate. A first Si layer 333-1 of a first thickness (tSi1) is epitaxially grown on the first SiGe layer 331-1. A second SiGe layer 330-1 (tSiGe2) is epitaxially grown on the first Si layer 333-1. A second Si layer 334-1 of a second thickness (tSi2) is epitaxially grown on the second SiGe layer 330-1. A third SiGe layer 347-1 (tSiGe3) is epitaxially grown on the second Si layer 334-1. And a third Si layer 332-1 of a third thickness (tSi3) is epitaxially grown on the third SiGe layer 347-1. In one embodiment, the first SiGe layer 331, the second SiGe layer 330 and the third SiGe layer 347 can be epitaxially grown in a controlled manner (e.g., time, concentrations, rate flow) to have approximately a same thickness (e.g., tSiGe1=tSiGe2=tSiGe3).

In another embodiment, the first SiGe layer 331, the second SiGe layer 330 and the third SiGe layer 347 can be epitaxially grown to have approximately similar and/or different thicknesses (e.g., tSiGe1=tSiGe3 tSiGe2). In one example embodiment, the first SiGe layer 331, the second SiGe layer 330 and the third SiGe layer 347 can be epitaxially grown to have a thickness, e.g., vertical height in the second direction (D3), in a range of eighty (80) angstroms (Å) to nine hundred (900) angstroms (Å). In one example embodiment, the first SiGe layer 331 and the third SiGe layer 347 are epitaxially grown in a controlled manner to a thickness of approximately six hundred (600) angstroms (Å) and the second SiGe layer 330 is epitaxially grown in a controlled manner to a thickness of approximately the four hundred (400) angstroms (Å). Embodiments, however, are not limited to this example.

Similarly, according to embodiments, the first Si layer 333, the second Si layer 334, and the third Si layer 332 may be epitaxially grown in a controlled manner to each have a same and/or different vertical thickness (e.g., tSi1=tSi2=tSi3 and/or tSi1=tSi2≠tSi3). According to embodiments, at least one Si layer, e.g., Si layer 332, is epitaxially grown to a thickness, e.g., tSi3, which is greater than a thickness (tSi1 and tSi2) of the first and the second Si layers 333 and 334. For example, the first and the second Si layers 333 and 334 are epitaxially grown in a controlled manner to have a vertical thickness (tSi1 and tSi2) less than a thickness (tSi3) of the third Si layer 332. According to this example embodiment, the first Si layer 333 and the second Si layer 334 are epitaxially grown to have a thickness (tSi1 and tSi2) e.g., vertical height, in a range of seventy (70) angstroms (Å) to eight hundred (800) angstroms (Å) while the third Si layer 332 is epitaxially grown to have a thickness (tSi3), e.g., vertical height, in a range of one hundred (100) angstroms (Å) to three hundred (300) angstroms (Å). For example, the first Si layer 333 and the second Si layer 334 are epitaxially grown to have a thickness (tSi1 and tSi2), e.g., vertical height, of approximately five hundred fifty (550) angstroms (Å), and the third Si layer 332 is epitaxially grown to have a thickness tSi3), e.g., vertical height, of approximately two hundred (200) angstroms (Å). As such, a vertical thickness of the first SiGe layer 331, the second SiGe layer 330 and the third SiGe layer 347 (tSiGe1, tSiGe2, tSiGe3) may be more than a thickness of any of the first Si layer 333, the second Si layer 332 or third Si layer 334 (tSi1, tSi2, and tSi3). Embodiments, however, are not limited to these examples.

As shown in, FIG. 3B, a vertical direction 311 is illustrated as a second direction (D3), e.g., z-direction, in an x-y-z coordinate system, analogous to the second direction (D3), among first, second, and second directions, shown in FIGS. 1-2. According to embodiments shown in FIG. 3B, at least one potential benefit of n>1 in a strained multi-pitch (SiGe/Si/SiGe)n/Si sublattices may include reducing a thickness of each individual SiGe layer to maintain metastable strained growth between the SiGe and Si layers which is beneficial where higher overall germanium (Ge) content percentage (%) is helpful for selective exhumation of Ge (e.g., SiGe) layers relative to single crystalline Si layers. Further, reduced sacrificial, single crystalline silicon (Si) layer thickness (e.g., tSi1 and tSi2) relative to remaining single crystalline silicon (Si) layer thickness (tSi3), intended for formation and enabling Si device channel isolation for forming horizontal access devices in 3D DRAM memory applications, reduces Si channel material layer 332 thinning during sacrificial Si layer 333 and 334 removal. Additionally, reduced sacrificial, single crystalline silicon (Si) layer 333 and 334 thickness (e.g., tSi1 and tSi2) relative to single crystalline silicon (Si) layer 332 thickness (tSi3) may facilitate improved remaining channel thickness (e.g., t2 in FIG.

5C) control and/or allow for later Si channel consumption within a given integration flow.

In some embodiments, the epitaxially grown SiGe layers 331, 330, and 347 may be an epitaxially grown mix of silicon and germanium. By way of example, and not by way of limitation, the epitaxially grown silicon germanium (SiGe) may be grown on the substrate material 300 and/or epitaxially grown silicon (Si) layers 333, 334, and 332. Embodiments are not limited to these examples. The epitaxially grown, single crystalline silicon (Si) layers 332, 333, and 334 may be a low doped, p-type (p-) epitaxially grown, single crystalline silicon (Si) material. In one embodiment, only one or more of epitaxially grown, single crystalline silicon (Si) layers 332, 333, and 334 may be a low doped, p-type (p-) epitaxially grown, single crystalline silicon (Si) material. The silicon layers 332, 333, and 334 may be epitaxially grown on the epitaxially grown silicon germanium (SiGe) layers 331, 330, and 347. For example, after the epitaxially grown silicon germanium (SiGe) layers 331, 330, and 347 have been formed, a silicon (Si) seed of the epitaxially grown silicon germanium (SiGe) layers 331, 330, and 347 may be used to epitaxially grown the single crystalline silicon (Si) layers 332, 333, and 334. Embodiments, however, are not limited to these examples.

The repeating iterations of alternating epitaxially grown silicon germanium (SiGe) layers 331, 330, and 347 and epitaxially grown, single crystalline silicon (Si) layers 332, 333, and 334 may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of epitaxially grown silicon germanium (SiGe) and epitaxially grown, single crystalline silicon (Si) material, in repeating iterations to form the vertical stack 301.

As shown in the example embodiment of FIG. 3B, the layers may occur in repeating iterations vertically to form multiple tiers, with each tier representing the pitch. In the example of FIG. 3B, "N" tiers, numbered 1, 2, 3, and N, of the repeating iterations are shown. In this example embodiment, the stack may include a first SiGe layer 331-1 (tSiGe1) epitaxially grown on a silicon (Si) based substrate 300. A first Si layer 333-1 of a first thickness (tSi1) is epitaxially grown on the first SiGe layer 331-1. A second SiGe layer 330-1 (tSiGe2) is epitaxially grown on the first Si layer 333-1. A second Si layer 334-1 of a second thickness (tSi2) is epitaxially grown on the second SiGe layer 330-1. A third SiGe layer 347-1 (tSiGe3) is epitaxially grown on the second Si layer 334-1. A third Si layer 332-1 of a third thickness (tSi3) is epitaxially grown on the third SiGe layer 347-1 to form a first tier (tier 1). Similarly, a first SiGe layer 331-2 (tSiGe1) may be epitaxially grown on the third silicon layer 332-1. A first Si layer 333-2 of a first thickness (tSi1) is epitaxially grown on the first SiGe layer 331-2. A second SiGe layer 330-2 (tSiGe2) is epitaxially grown on the first Si layer 333-2. A second Si layer 334-2 of a second thickness (tSi2) is epitaxially grown on the second SiGe layer 330-2. A third SiGe layer 347-2 (tSiGe3) is epitaxially grown on the second Si layer 334-2. A third Si layer 332-2 of a third thickness (tSi3) is epitaxially grown on the third SiGe layer 347-2 to form a second tier (tier 2), etc., in further repeating iterations. Embodiments, however, are not limited to this example.

FIG. 4A illustrates an example method, at one stage of a semiconductor fabrication process, for forming epitaxial silicon within horizontal access devices in vertical three-dimensional (3D) memory, such as illustrated in FIGS. 1-2, and in accordance with a number of embodiments of the present disclosure. FIG. 4A illustrates a top down view of a semiconductor structure, at a particular point in time, in a semiconductor fabrication process, according to one or more embodiments. In the example embodiment shown in the example of FIG. 4A, the method comprises using an etchant process to form a plurality of first vertical openings 415, having a first horizontal direction (D1) 409 and a second horizontal direction (D2) 405, through the vertical stack to the substrate. In one example, as shown in FIG. 4A, the plurality of first vertical openings 415 are extending predominantly in the second horizontal direction (D2) 405 and may form elongated vertical, pillar columns 413-1, 413-2, . . . , 413-M (collectively and/or independently referred to as 413), with sidewalls 414 in the vertical stack. The plurality of first vertical openings 400 may be formed using photolithographic techniques to pattern a photolithographic mask 435, e.g., to form a hard mask (HM), on the vertical stack prior to etching the plurality of first vertical openings 415. Similar semiconductor process techniques may be used at other points of the semiconductor fabrication process described herein.

The openings 415 may be filled with a dielectric material 439. In one example, a spin on dielectric process may be used to fill the openings 415. In one embodiment, the dielectric material 439 may be an oxide material. However, embodiments are not so limited.

FIG. 4B is a cross sectional view, taken along cut-line A-A' in FIG. 4A, showing another view of the semiconductor structure at a particular time in the semiconductor fabrication process. The cross-sectional view shown in FIG. 4B shows the repeating iterations of alternating layers of an epitaxially grown silicon germanium (SiGe) 430 and an epitaxially grown, single crystalline silicon (Si) material 432 on a semiconductor substrate 400 to form the vertical stack, e.g., 401 as shown in FIG. 4.

As shown in FIG. 4B, a plurality of first vertical openings may be formed through the layers within the vertically stacked memory cells to expose vertical sidewalls in the vertical stack and form elongated vertical pillar columns 413 and then filled with a first dielectric material 439. The first vertical openings may be formed through the repeating iterations of the epitaxially grown silicon germanium (SiGe) 430 and 431, and the epitaxially grown, single crystalline silicon (Si) material 432 and 433. As such, the first vertical openings may be formed through a first epitaxially grown silicon germanium (SiGe) 431-1, a first epitaxially grown, single crystalline silicon (Si) material 432-1, a second epitaxially grown silicon germanium (SiGe) 430-1, a second epitaxially grown, single crystalline silicon (Si) material 433-1 (tier 1), a third SiGe material 431-2, a third epitaxially grown, single crystalline silicon (Si) material 432-2 (as part of tier 2), etc. Embodiments, however, are not limited to the vertical opening(s) shown in FIG. 4B. Multiple vertical openings may be formed through the layers of materials. The first vertical openings may be formed to expose vertical sidewalls in the vertical stack. The first vertical openings may extend in a second horizontal direction (D2) 405 to form elongated vertical, pillar columns with first vertical sidewalls in the vertical stack and then filled with second dielectric 439.

As shown in FIG. 4B, a first dielectric material 439, such as an oxide or other suitable spin on dielectric (SOD), may be deposited in the first vertical openings, using a process such as CVD, to fill the first vertical openings. First dielectric material 439 may also be formed from a silicon nitride (Si$_3$N$_4$) material. In another example, the first dielectric material 439 may include silicon oxy-nitride (SiO$_x$N$_y$), and/or combinations thereof. Embodiments are not limited to these examples. The plurality of first vertical openings may be formed using photolithographic techniques to pattern a photolithographic mask 435, e.g., to form a hard mask (HM), on the vertical stack prior to etching the plurality of first vertical openings. In one embodiment, hard mask 435 may be deposited over an epitaxially grown silicon germanium (SiGe) 430. Similar semiconductor process techniques may be used at other points of the semiconductor fabrication process described herein.

FIG. 5 illustrates an example method, at another stage of a semiconductor fabrication process, for forming epitaxial silicon within horizontal access devices in vertical three-dimensional (3D) memory, such as illustrated in FIGS. 1-2, and in accordance with a number of embodiments of the present disclosure. FIG. 5 illustrates a top down view of a semiconductor structure, at a particular point in time, in a semiconductor fabrication process, according to one or more embodiments.

In the example embodiment shown in FIG. 5, the method comprises using a photolithographic mask to pattern and form a second vertical opening 570 through the vertical stack and extending predominantly in the first horizontal direction to expose sidewalls adjacent a second region of the epitaxially grown silicon germanium (SiGe) and silicon (Si). The second vertical opening 570 may be etched through the hard mask (435 in FIG. 4B) adjacent to where horizontal access devices are to be formed. Multiple second vertical opening 570 may be formed through the layers of epitaxially grown silicon germanium (SiGe) and silicon (Si) using photolithographic techniques to pattern the hard mask (435 in FIG. 4B) and expose those particular areas of the vertical stack. The second vertical openings 570 is filled with the first dielectric material 539. A plurality of spaced, third vertical opening (687 in FIG. 6) is formed through the first dielectric material 539 filling the plurality of second vertical openings 570. In some examples, the plurality of spaced, third vertical openings (687 in FIG. 6) are formed through the first dielectric material 539 in the vertical stack adjacent areas where access device nodes are to be formed.

FIG. 6A illustrates an example method, at one stage of a semiconductor fabrication process, for forming silicon within horizontal access devices in vertical three-dimensional (3D) memory, such as illustrated in FIGS. 1-2, and in accordance with a number of embodiments of the present disclosure. FIG. 6A illustrates a top down view of a semiconductor structure, at a particular point in time, in a semiconductor fabrication process, according to one or more embodiments. In some examples, a plurality of spaced, third vertical openings 687 are formed through the first dielectric material 639 filling the plurality of second vertical openings 670. As illustrated in FIG. 6A, the third vertical openings 687 can be adjacent each first dielectric material 639 filing first vertical opening (415 of FIG. 4A).

In some embodiments, as shown in FIG. 6A, the method comprises depositing support-pillar material in a plurality of spaced, third vertical openings 687, adjacent each filled first vertical openings, through the vertical stack adjacent areas where access device nodes will be formed, to form support pillars 636. The spaced, third vertical openings, adjacent each filled first vertical openings, can have a spaced distance in the range of approximately one hundred (100) to two hundred (200) nanometers (nm). For example, the third vertical openings can have a spaced distance of one hundred twenty (120) nm.

In some embodiments, the support pillars 636 can be formed by depositing a third dielectric material in the third vertical openings 687. In some embodiments, the third dielectric material of the support pillar is different than the first and second dielectric material. In some examples, the third dielectric material can be a dielectric oxide other than silicon dioxide ($SiO_2$), a dielectric nitride other than (SiN), or a carbon. For example, Magnesium oxide (MgO) and/or Boron nitride (BN), amongst other dielectric oxides and dielectric nitrides, can be deposited as the support pillar material in the third vertical opening 687 to form the support pillar 636. In some examples, the third dielectric material can be a high-k dielectric oxide. For example, a high-k dielectric oxide comprises depositing zirconium oxide (ZrOx), hafnium oxide (HfOx), aluminum oxide (AlOx), niobium oxide (NbOx), or combinations thereof can be deposited as the support-pillar material in the third vertical opening 687 to form the support pillar 636. In some embodiments, the support pillar material is resistant to wet etches selective to nitride, silicon, oxide, SiGe, and titanium/ titanium nitride (TiN). In some embodiments, the support pillar material is resistant to dry etches selective to silicon, oxide, SiGe, and metals.

FIG. 6B is a cross sectional view, taken along cut-line 6B-6B in FIG. 6A, showing another view of the semiconductor structure at a particular time in the semiconductor fabrication process. The cross-sectional view shown in FIG. 6B shows the repeating iterations of alternating layers of an epitaxially grown silicon germanium (SiGe) 630 and an epitaxially grown, single crystalline silicon (Si) material 632 on a semiconductor substrate 600 to form the vertical stack. The dielectric may be planarized to a top surface of the second hard mask 637 of the vertical semiconductor stack, using chemical mechanical planarization (CMP) or other suitable semiconductor fabrication technique. Similar semiconductor process techniques may be used at other points of the semiconductor fabrication process described herein.

Further, as shown in FIG. 6B, support pillars 636, may be formed in the plurality of third vertical openings (687 in FIG. 6A). By way of example and not by way of limitation, the support pillar material may be conformally deposited in the plurality of third vertical openings (687 in FIG. 6A) using a chemical vapor deposition (CVD) process, plasma enhanced CVD (PECVD), atomic layer deposition (ALD), or other suitable deposition process, to fill the plurality of third vertical openings (687 in FIG. 6A). The support pillars 636 may be formed to reduce and/or eliminate cantilevered platforms, which can cause deformation or breakage of the platform during subsequent processing. The support pillars 636 can be formed to provide support on the opposite end of the platform. That is, the support pillars 636 can provide a secondary support to the platform allowing the platform to be supported on at least two sides.

The plurality of spaced, third vertical openings (687 in FIG. 6A) may be formed through the first dielectric material in the vertical stack adjacent areas where access device nodes will be formed. Multiple third vertical openings (687 in FIG. 6A) may be formed through the first dielectric material filling the second vertical openings (570 in FIG. 5). The third vertical openings (687 in FIG. 6A) may extend in a third horizontal direction (D3) 611 to form elongated vertical, pillar columns and then filled with third dielectric.

FIG. 7A illustrates an example method, at one stage of a semiconductor fabrication process, for forming silicon within horizontal access devices in vertical three-dimensional (3D) memory, such as illustrated in FIGS. 1-2, and in accordance with a number of embodiments of the present disclosure. FIG. 7A illustrates a top down view of a semiconductor structure, at a particular point in time, in a semiconductor fabrication process, according to one or more embodiments. In some examples, a plurality of spaced, third vertical openings 787 are formed through the first dielectric material 739 filling the plurality of second vertical openings 770. In some embodiments, as illustrated in FIG. 7A, the third vertical openings 787 can be formed adjacent alternating first dielectric material 739 filing first vertical opening (415 of FIG. 4A). That is, the third vertical openings 787 can skip every other first vertical opening when being formed.

In some embodiments, as shown in FIG. 7A, the method comprises depositing support-pillar material in a plurality of spaced, third vertical openings 787, adjacent alternating first vertical openings, through the vertical stack adjacent areas where access device nodes will be formed, to form support pillars 736. In some embodiments, the support pillars 736 can be formed by depositing a third dielectric material in the third vertical openings 787. The spaced, third vertical openings, adjacent alternating filled first vertical openings, can have a spaced distance in the range of approximately four hundred fifty (450) to six hundred (600) nanometers (nm). For example, the third vertical openings can have a spaced distance of three hundred (300) nm.

FIG. 7B is a cross sectional view, taken along cut-line 7B-7B in FIG. 7A, showing another view of the semiconductor structure at a particular time in the semiconductor fabrication process. The cross-sectional view shown in FIG. 7B shows the repeating iterations of alternating layers of an epitaxially grown silicon germanium (SiGe) 730 and an epitaxially grown, single crystalline silicon (Si) material 732 on a semiconductor substrate 700 to form the vertical stack. The dielectric may be planarized to a top surface of the second hard mask 737 of the vertical semiconductor stack, using chemical mechanical planarization (CMP) or other suitable semiconductor fabrication technique. Similar semiconductor process techniques may be used at other points of the semiconductor fabrication process described herein.

Further, as shown in FIG. 7B, support pillars 736, may be formed in the plurality of third vertical openings (787 in FIG. 7A) adjacent alternating first vertical openings. By way of example and not by way of limitation, the support pillar material may be conformally deposited in the plurality of third vertical openings (787 in FIG. 7A) using a chemical vapor deposition (CVD) process, plasma enhanced CVD (PECVD), atomic layer deposition (ALD), or other suitable deposition process, to fill the plurality of third vertical openings (787 in FIG. 7A). The support pillars 736 may be formed to reduce and/or eliminate cantilevered platforms, which can cause deformation or breakage of the platform during subsequent processing. The support pillars 736 can be formed to provide support on the opposite end of the platform. That is, the support pillars 736 can provide a secondary support to the platform allowing the platform to be supported on at least two sides.

The plurality of spaced, third vertical openings (787 in FIG. 7A) may be formed through the first dielectric material in the vertical stack adjacent areas where access device nodes will be formed. Multiple third vertical openings (787 in FIG. 7A) may be formed through the first dielectric material filling the second vertical openings (570 in FIG. 5). The third vertical openings (787 in FIG. 7A) may extend in a third horizontal direction (D3) 711 to form elongated vertical, pillar columns and then filled with third dielectric.

Figure 8A:
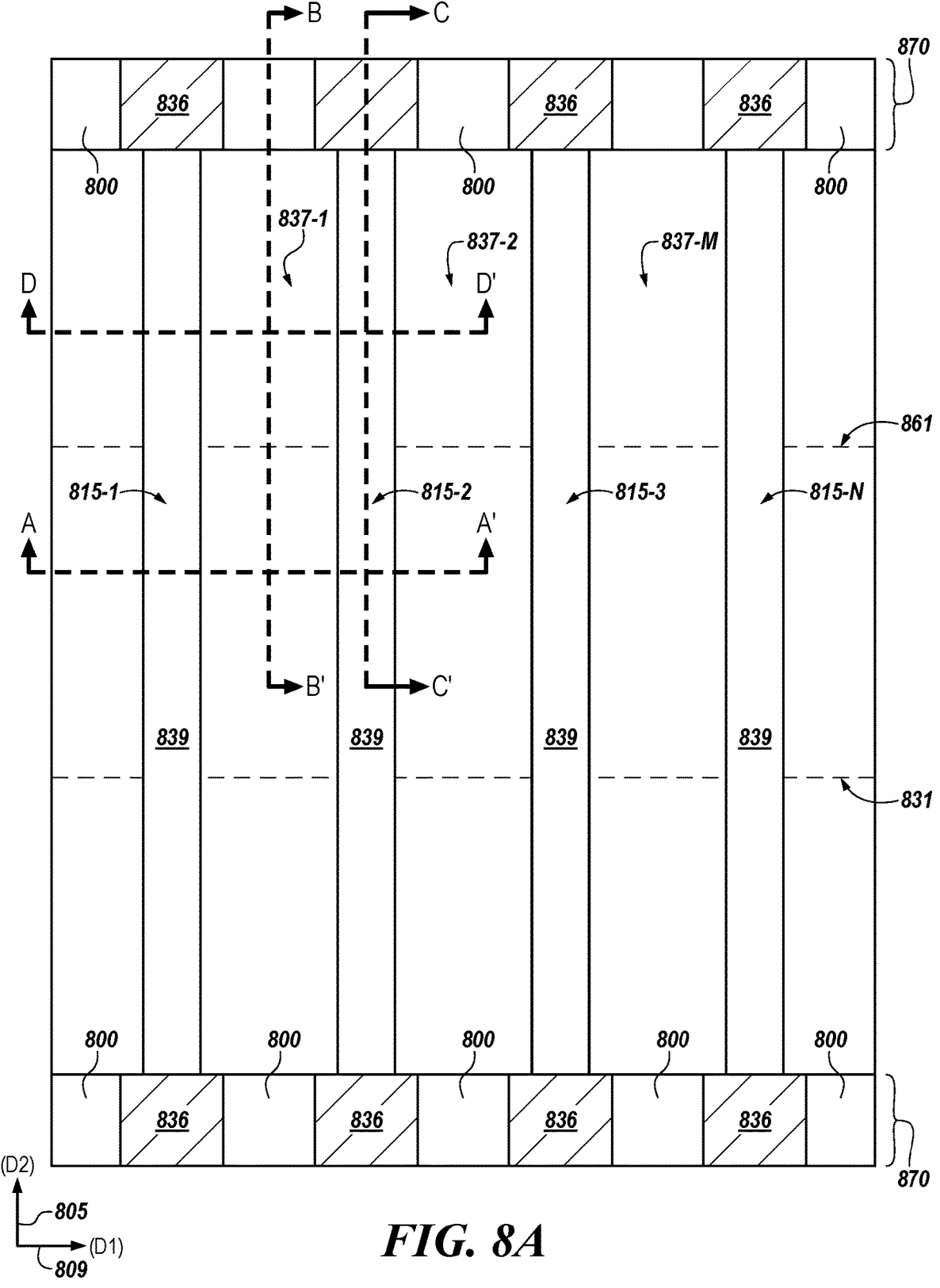

FIG. 8A illustrates an example method, at another stage of a semiconductor fabrication process, for forming silicon within horizontal access devices in vertical three-dimensional (3D) memory, such as illustrated in FIGS. 1-2, and in accordance with a number of embodiments of the present disclosure. FIG. 8A illustrates a top down view of a semiconductor structure, at a particular point in time, in a semiconductor fabrication process, according to one or more embodiments.

In the example embodiment shown in FIG. 8A, the method comprises using a photolithographic mask to reform a plurality of second vertical opening 870 through the vertical stack and extending predominantly in the first horizontal direction to expose sidewalls adjacent a second region of the epitaxially grown silicon germanium (SiGe) and silicon (Si). The plurality of second vertical openings 870 may be etched through the hard mask (835 in FIG. 8B) and second hard mask (837 in FIG. 8B) adjacent to where horizontal access devices are to be formed. In addition, as illustrated in FIG. 8A, the plurality of second vertical openings 870 may be adjacent support pillars 836. Multiple second vertical opening 870 may be formed through the first dielectric material used to fill the originally formed second vertical opening.

Figure 8B:
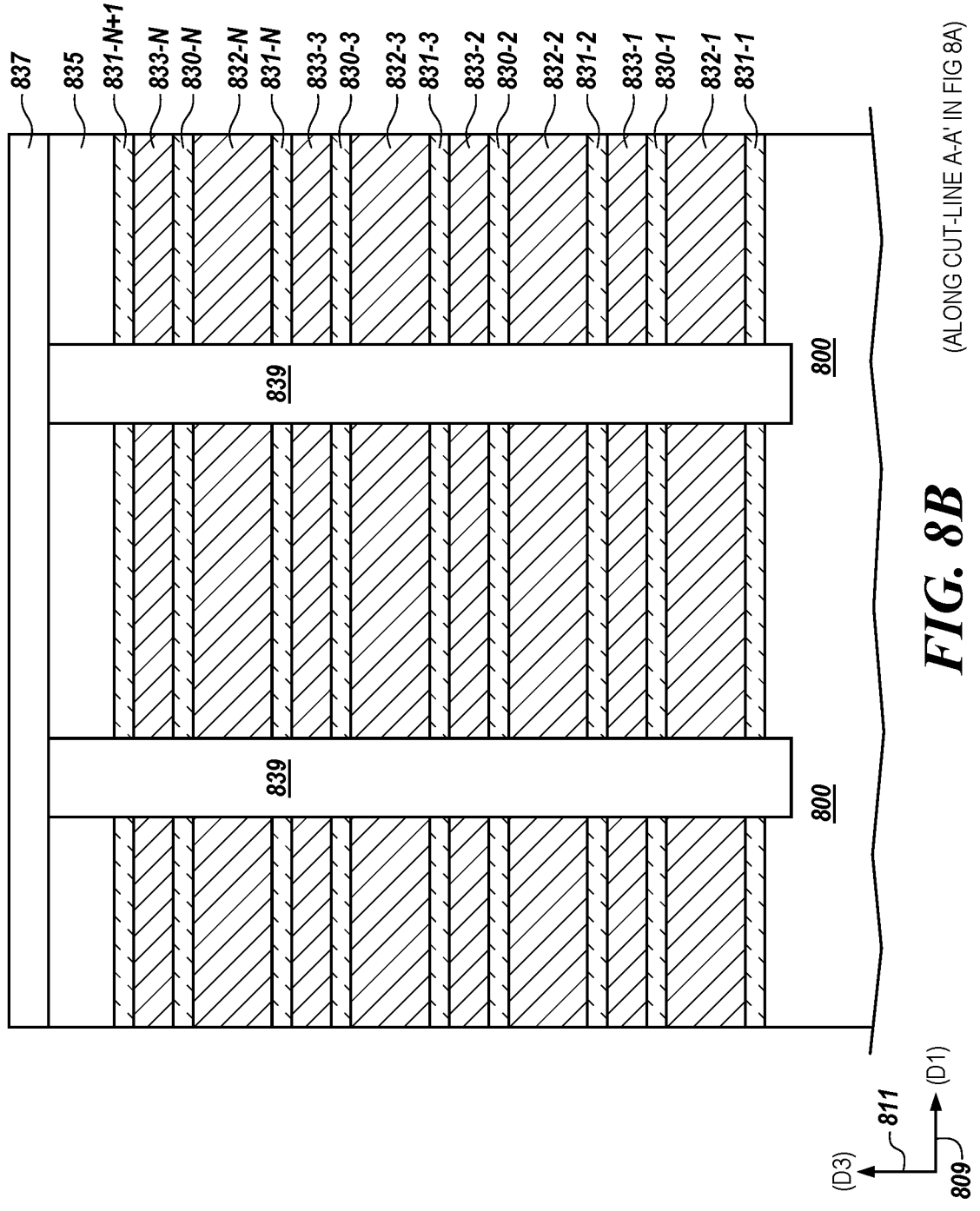

FIG. 8B is a cross sectional view, taken along cut-line A-A' in FIG. 8A, showing another view of the semiconductor structure at this particular time in the semiconductor fabrication process. The cross-sectional view shown in FIG. 8B shows the repeating iterations of multiple, alternating layers of the epitaxially grown silicon germanium (SiGe) 830 and 831 and the epitaxially grown, single crystalline silicon (Si) material 832 and 833, on a semiconductor substrate 800. In the example embodiment described herein four (4) alternating layers, 831, 832, 830, and 833, are shown making up a tier, e.g., tier 1 in FIG. 3, of the vertical stack. Embodiments, however, are not limited to this example.

As shown in FIG. 8B, a plurality of first vertical openings may have already been formed through the layers within the vertically stacked memory cells to expose first vertical sidewalls in the vertical stack and filled with a first dielectric material 839. The first vertical openings were formed through the repeating iterations of the epitaxially grown silicon germanium (SiGe) 830 and 831 and the epitaxially grown, single crystalline silicon (Si) material 832 and 833.

Figure 8C:
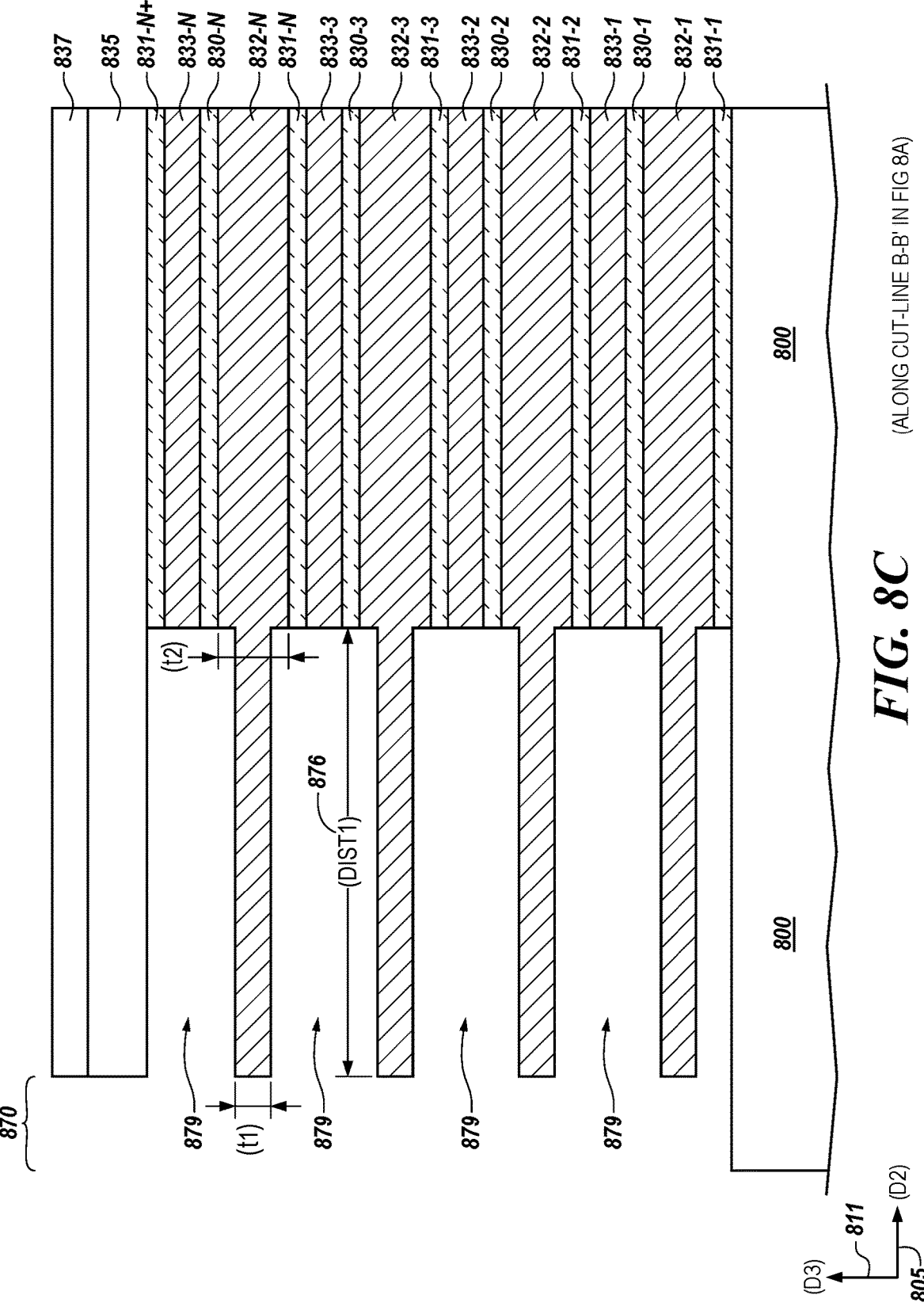

FIG. 8C is another cross-sectional view, at this particular stage of the semiconductor fabrication process, for forming epitaxial silicon within horizontal access devices in vertical three-dimensional (3D) memory, such as illustrated in FIGS. 1-2, and in accordance with a number of embodiments of the present disclosure. FIG. 8C illustrates a cross sectional view, taken along cut-line B-B' in FIG. 8A.

As noted above, FIG. 8C illustrates the method comprises forming second vertical openings 870 through the vertical stack and extending predominantly in the first horizontal direction (809 in FIG. 8B) to expose sidewalls adjacent a second region of the epitaxially grown silicon germanium (SiGe) 830 and 831 and the epitaxially grown, single crystalline silicon (Si) material 832 and 833. Forming the second vertical openings 870 through the vertical stack comprises forming the second vertical openings 870 in vertical alignment with a location to form the horizontal access devices.

As illustrated in FIG. 8C, the cross-sectional view shown in FIG. 8C is illustrated extending in the second horizontal direction (D2) 805, left and right along the plane of the drawing sheet, along an axis of the repeating iterations of alternating layers of the epitaxially grown silicon germanium (SiGe) 830 and 831 and the epitaxially grown, single crystalline silicon (Si) material 832 and 833.

In the example embodiment of FIG. 8C the epitaxially grown silicon germanium (SiGe) 830 and 831, and at least one sacrificial layer of the epitaxially grown, single crystalline silicon (Si) material 833, is selectively etched to form a plurality of first horizontal openings 879 extending a first distance (DIST 1) 876 from the second vertical openings 870. For example, an etchant may be flowed into the second vertical openings 870 to selectively etch the epitaxially grown silicon germanium (SiGe) material 830 and 831, and at least one sacrificial layer of the epitaxially grown, single crystalline silicon (Si) material 833, and a portion of the epitaxially grown silicon (Si) material 832. The etchant may selectively remove portions of all iterations of the epitaxially grown silicon germanium (SiGe) 830 and 831, and at least one sacrificial layer of the epitaxially grown, single crystalline silicon (Si) material 833, and a portion of the epitaxially grown silicon (Si) 832 within the stack according to a timed exhume process. As such, the etchant may primarily be selective to the epitaxially grown Si material 832 and selectively remove the epitaxially grown silicon germanium (SiGe) 830 and 831. A second etchant may subsequently be flowed into the second vertical opening 870 to perform a non-selective, isotropic, timed exhume etch of the epitaxially grown, single crystalline Si material 832 and 833 to remove all of the at least one sacrificial layer of the epitaxially grown, single crystalline silicon (Si) material 833, and a portion of the epitaxially grown silicon (Si) 832 a first distance (DIST 1) 876 from the second vertical opening 870 within the stack.

The selective etchant process may occur in multiple steps to protect the structure and stabilize epitaxially grown, single crystalline silicon (Si) material 832. The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) may be utilized. As another example, a dry etch chemistry of $O_2$ or of $O_2$ and nitrogen ($N_2$) may be used to selectively etch the epitaxially grown silicon germanium (SiGe) 830 and 831, and at least one sacrificial layer of the epitaxially grown, single crystalline silicon (Si) material 833, and a portion of the epitaxially grown silicon (Si) 832. Alternatively, or in addition, a selective etch to remove the epitaxially grown silicon germanium (SiGe) 830 and 831, and at least one sacrificial layer of the epitaxially grown, single crystalline silicon (Si) material 833, and a portion of the epitaxially grown silicon (Si) 832 may comprise a selective etch chemistry of phosphoric acid ($H_3PO_4$) or hydrogen fluoride (HF) and/or dissolving the epitaxially grown silicon germanium (SiGe) 830 using a selective solvent, among other possible etch chemistries or solvents.

Thus, the selective and non-selective etchant processes may be controlled by controlling time, composition of etchant gas, and etch rate of a reactant gas flowed into the second vertical openings 870, e.g., rate, concentration, temperature, pressure, and time parameters.

The first selective etch may be isotropic, but selective primarily to the epitaxially grown silicon (Si) material 832 and 833, removing only the epitaxially grown silicon germanium (SiGe) 830 and 831. The second non-selective, isotropic etch may be subsequent to the first to remove the at least one sacrificial layer of the epitaxially grown, single crystalline silicon (Si) material 833, and a portion of the epitaxially grown silicon (Si) 832 in the timed exhume process. In one or more embodiments the selective etch may be performed according to a two-step exhumation process to first selectively remove the epitaxially grown silicon germanium (SiGe) 830 and 831 followed by a non-selective removal of the at least one sacrificial layer of the epitaxially grown, single crystalline silicon (Si) material 833, and a portion of the epitaxially grown silicon (Si) 832 to meet device target specifications. Thus, in one example embodiment, the first selective etchant process may remove substantially all of the epitaxially grown silicon germanium (SiGe) 830 and 831 a first distance (DIST 1) from the second vertical opening 870 within the stack. The second non-selective etchant process may fully remove the at least one sacrificial layer of the epitaxially grown, single crystalline silicon (Si) material 833, and a portion of the epitaxially grown silicon (Si) 832, etching horizontally a first distance (DIST 1) 876 from the second vertical openings 870 according to the timed exhume process. Embodiments, however, are not limited to this example.

Figure 8D:
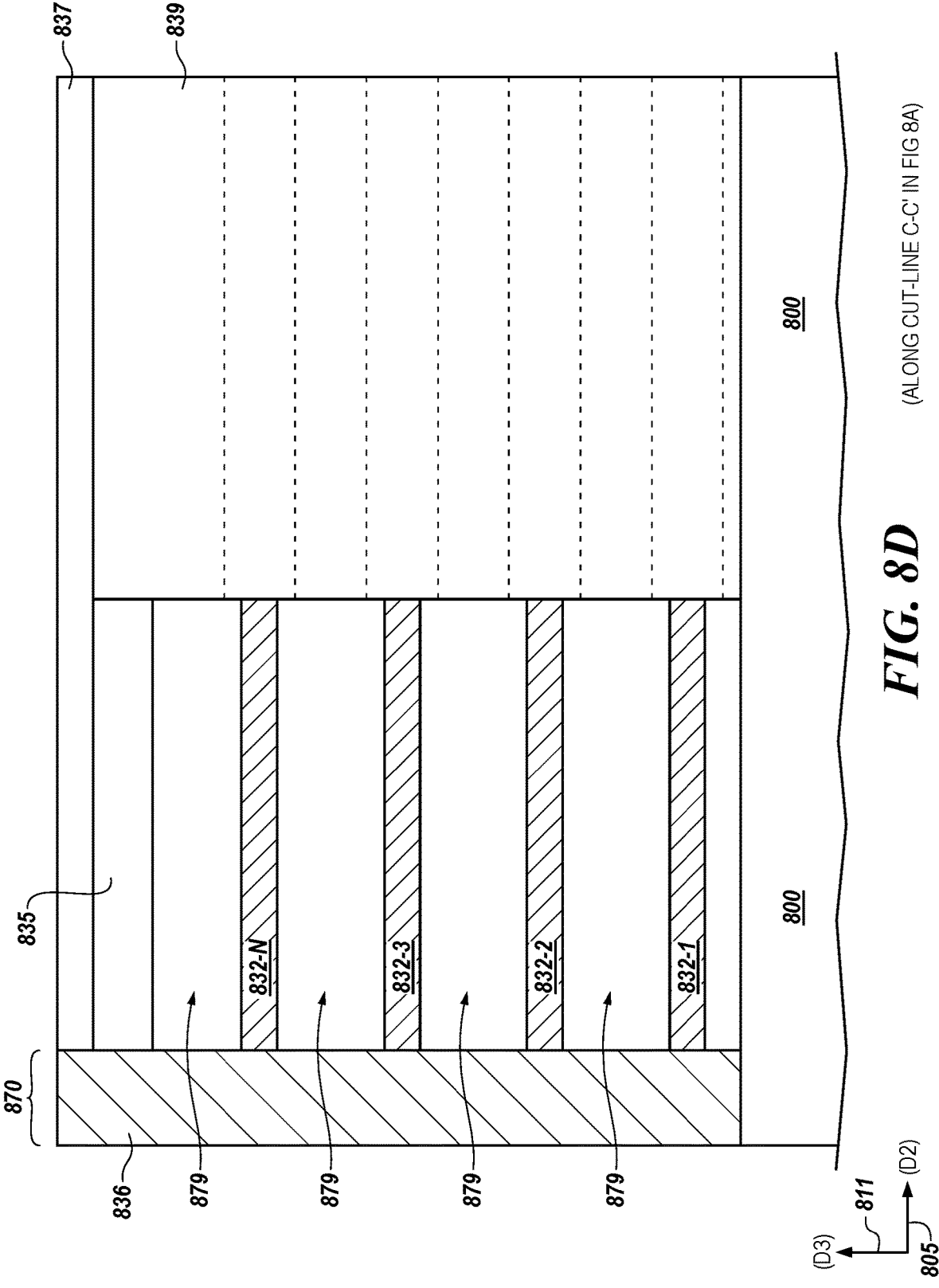
Figure 8E:
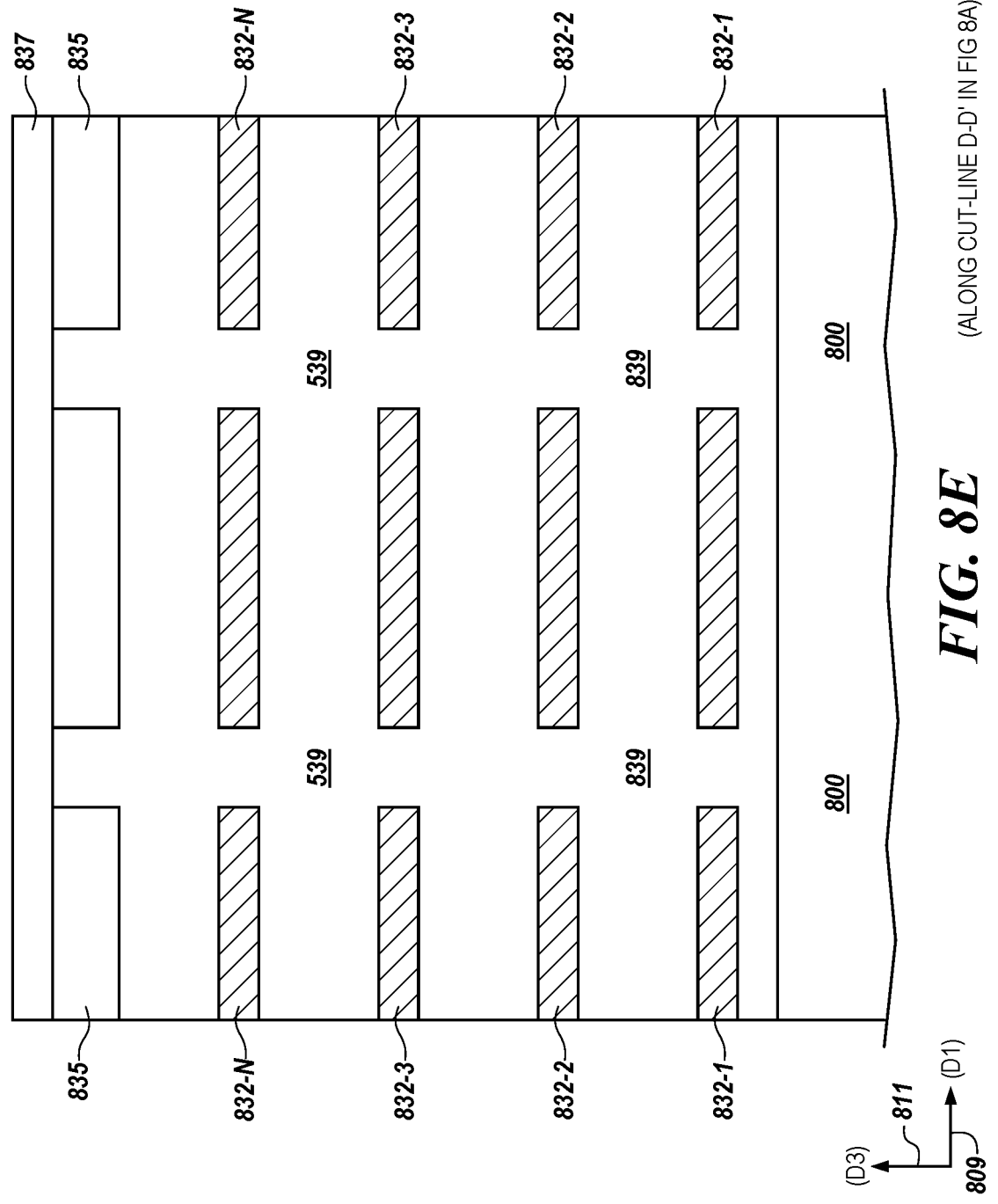

As further shown in FIG. 8C, a controlled oxide lateral punch through the plurality of first vertical openings (415 in FIG. 4A), between the access device regions and the first horizontal openings 879, to form continuous horizontal openings, seen left to right along the plane of the drawing sheet and extending in the first horizontal direction (D1) 809 in FIG. 8E, using a timed exhume process, e.g., selectively etching the first dielectric material 839 in FIG. 8B. In some embodiments, the lateral punch may be a controlled etch process selective to the remaining, thinned epitaxially grown single crystalline silicon (Si) material 832 between separated epitaxially grown, remaining single crystalline silicon (Si) material 832 in the access device regions. In one embodiment, the remaining, thinned epitaxially grown single crystalline Si material 832 has a thickness (t1), from an original thickness (t2), in a range of approximately 50 to 250 angstroms (Å). In one embodiment, the original thickness (t2) is in a range of approximately 300 to 600 angstroms (Å).

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second horizontal direction (D2) 805, left and right in the plane of the drawing sheet, along an axis of the repeating iterations of multiple, alternating layers of the etched and removed epitaxially grown silicon germanium (SiGe) 830 and 831 in FIG. 8C, and at least one sacrificial layer of the epitaxially grown, single crystalline silicon (Si) material 833 in FIG. 8C, and a portion of the epitaxially grown silicon (Si) 832 forming first horizontal openings 879, and remaining epitaxially grown, single crystalline silicon (Si) material 832 having a thickness (t1) reduced from an original thickness, shown as (t2) in FIG. 8C.

At the left end of the drawing sheet is shown the repeating iterations of alternating layers of the etched epitaxially grown silicon germanium (SiGe) 830 and 831 in FIG. 8C, and at least one sacrificial layer of the epitaxially grown, single crystalline silicon (Si) material 833 in FIG. 8C, and a portion of the epitaxially grown silicon (Si) 832 forming first horizontal openings 879, and the remaining, thinned epitaxially grown, single crystalline silicon (Si) material 832. At the left end of the drawing sheet is shown the repeating iterations of alternating layers of the etched epitaxially grown silicon (SiGe), and etched areas where the first dielectric material has been removed to form continuous horizontal openings 879 in a first direction (D1) 809 in FIG. 8E, separating the layers of remaining, thinned epitaxially grown, single crystalline silicon (Si) material 832. Second vertical opening 870 and support pillar 836 are shown adjacent a region of the now continuous horizontal openings 879. At the right hand of the drawing sheet, the first dielectric material 839 may be seen, separating access device and storage node regions in the first direction (D1) 809 in FIG. 8E. Dashed lines indicate the presence of the remaining un-etched, un-removed epitaxially grown silicon germanium (SiGe) 830 and 831 in FIG. 8C, and full original deposition thicknesses (t2) of the epitaxially grown, single crystalline silicon (Si) material 832 and 832 and the first dielectric material 839, set into the plane of the drawing sheet, in the cross-sectional view, taken along cut-line C-C' in FIG. 8A.

FIG. 8E illustrates a cross sectional view, taken along cut-line D-D' in FIG. 8A, showing another view of the semiconductor structure at this particular point in one example semiconductor fabrication process of an embodiment of the present disclosure. The cross-sectional view shown in FIG. 8E is illustrated, right to left in the plane of the drawing sheet, extending in the first direction (D1) 809 along a cross section of the repeating iterations of alternating layers of remaining, thinned epitaxially grown, single crystalline silicon (Si) material 832, extending out of the plane of the drawing sheet from the first dielectric material 839. The continuous horizontal openings with the first dielectric material 839 may be in the background into the plane of the drawing sheet. A hard mask 835 may be covered by second hard mask 837.

Figure 9A:
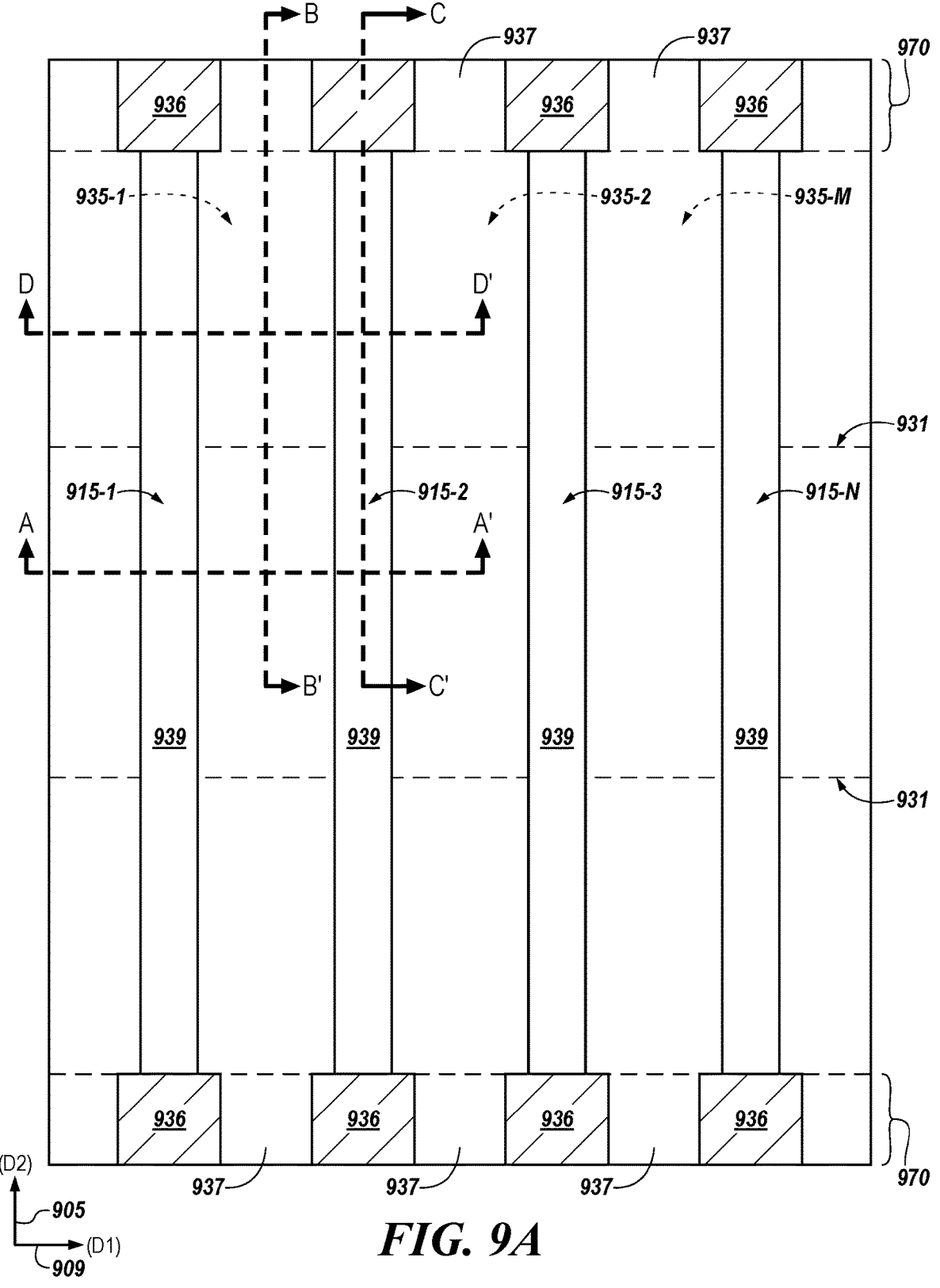

FIG. 9A illustrates an example method, at another stage of a semiconductor fabrication process, for forming silicon within horizontal access devices in vertical three-dimensional (3D) memory, such as illustrated in FIGS. 1-2, and in accordance with a number of embodiments of the present disclosure. FIG. 9A illustrates a top down view of a semiconductor structure, at a particular point in time, in a semiconductor fabrication process, according to one or more embodiments.

In the example embodiment of FIG. 9A, the method comprises a newly deposited second dielectric material 937 deposited through the second vertical openings 970 on exposed surfaces of the remaining, thinned epitaxially grown, single crystalline silicon (Si) material 932 within the first horizontal openings (879 in FIG. 8C). The second dielectric material 937 may form around the single crystalline silicon (Si) material 932 and the support pillar 936. A portion of the unetched first dielectric material 939 may be seen in FIG. 9B.

Figure 9B:
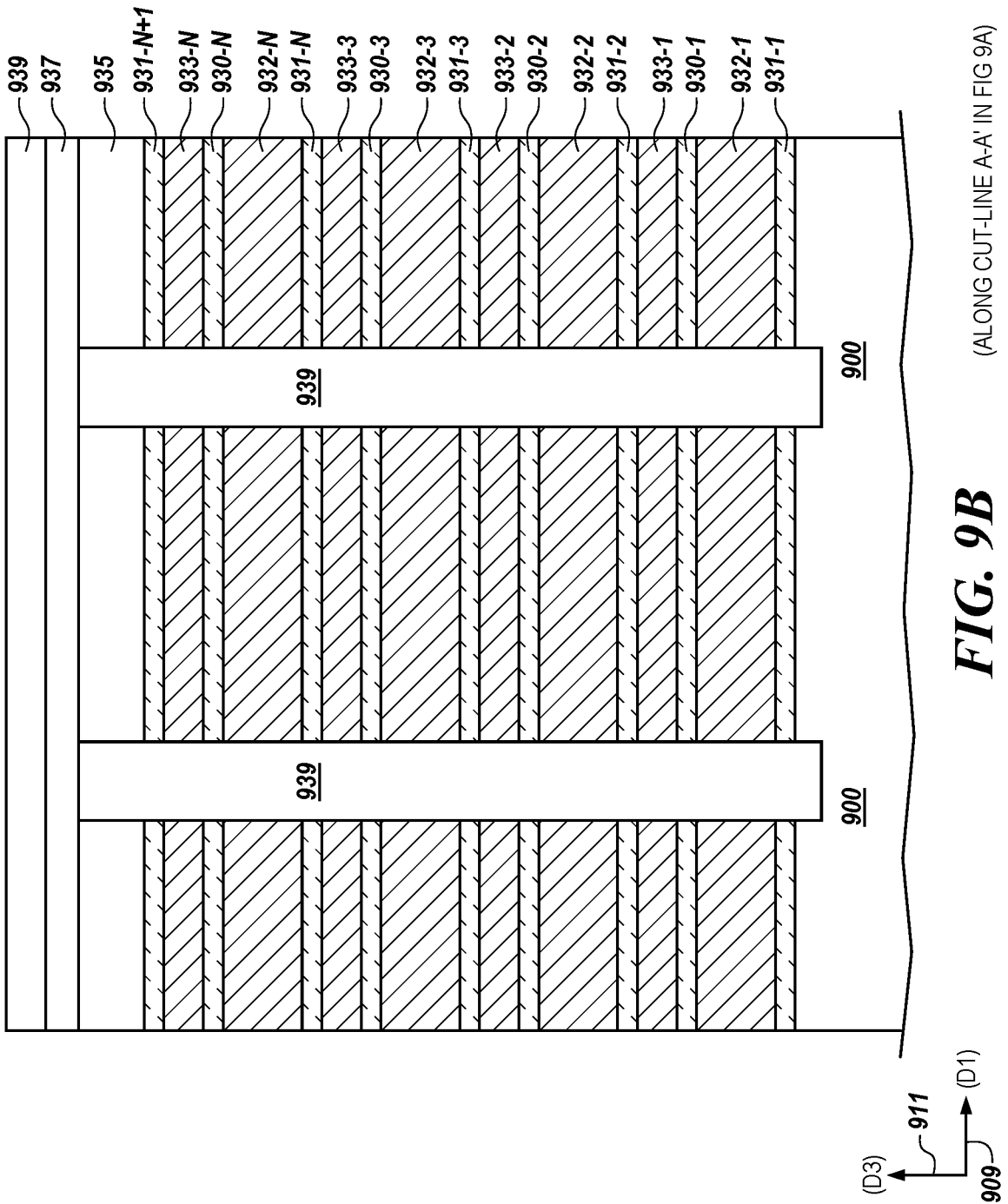

FIG. 9B is a cross sectional view, taken along cut-line A-A' in FIG. 9A, showing another view of the semiconductor structure at a particular time in the semiconductor fabrication process. The cross-sectional view shown in FIG. 9B shows the repeating iterations of multiple, alternating layers of epitaxially grown silicon germanium (SiGe) 930 and 931 and the epitaxially grown, single crystalline silicon (Si) material 932 and 933, on a semiconductor substrate 900.

As shown in FIG. 9B, a plurality of first vertical openings have already been formed through the layers within the vertically stacked memory cells to expose first vertical sidewalls (815 in FIG. 8A) in the vertical stack and filled with the first dielectric material 939. In FIGS. 4A-4B, the first vertical openings were formed through the repeating iterations of the epitaxially grown silicon germanium (SiGe) 930 and 931 and the epitaxially grown, single crystalline silicon (Si) material 932 and 933.

As shown in FIG. 9B, a first dielectric material 939, such as an oxide or other suitable spin on dielectric (SOD), is shown in the first vertical openings (515 in FIG. 5), filling the first vertical openings. A hard mask 935 is shown over the vertical stack having a second dielectric material 937 and third dielectric material 939 deposited thereon. In some embodiments, as shown in the cross-sectional view of FIG. 9B, the third dielectric material 939 may be the same type dielectric material as used for the first dielectric material 939. Embodiments, however, are not so limited.

Figure 9C:
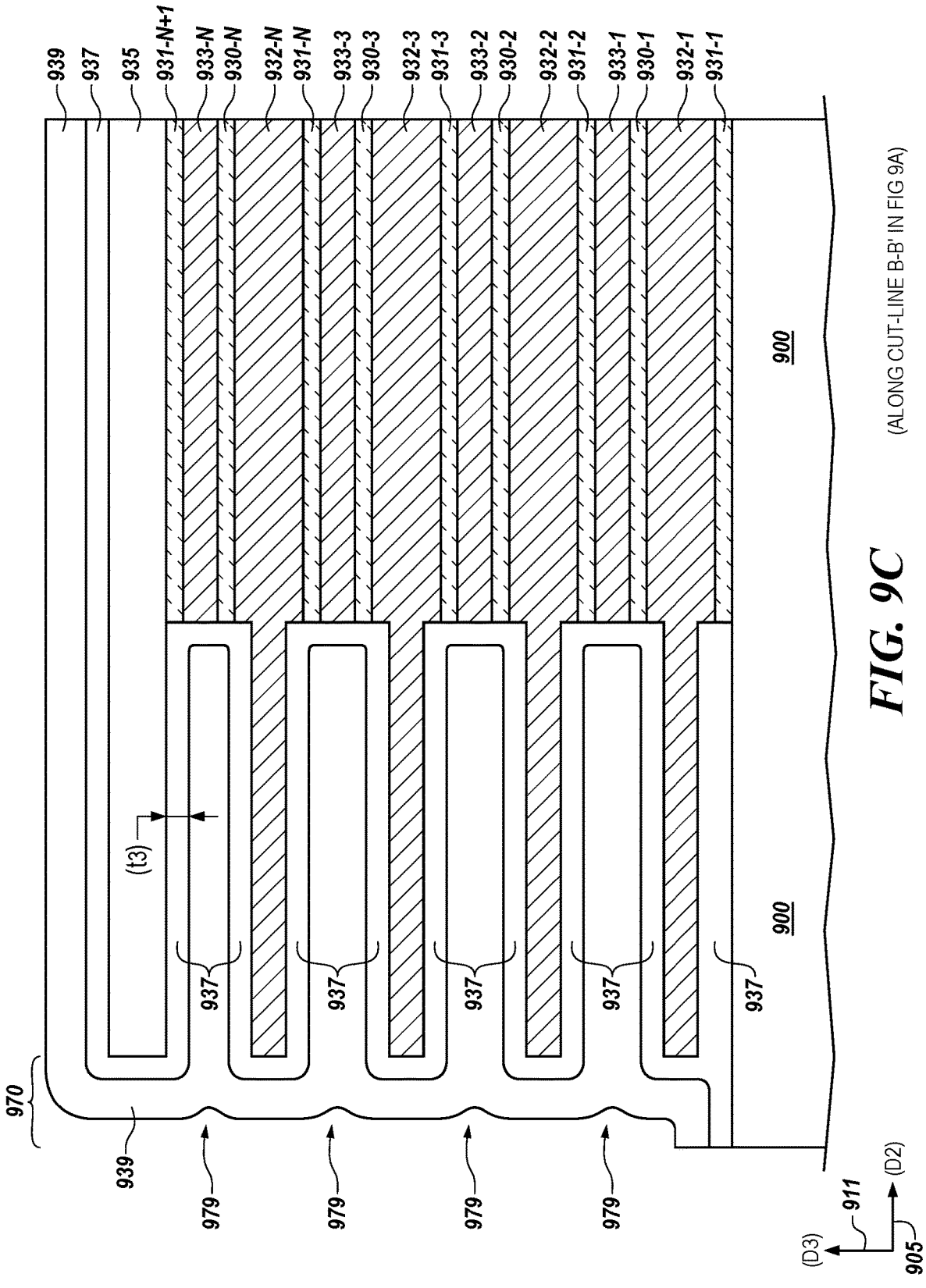

FIG. 9C is a cross-sectional view, taken along cut-line B-B' in FIG. 9A, showing another view of the semiconductor structure at this particular point in one example semiconductor fabrication process for forming single crystalline epitaxial silicon within horizontal access devices in vertical three-dimensional (3D) memory, such as illustrated in FIGS. 1-2, and in accordance with a number of embodiments of the present disclosure.

The epitaxially grown silicon germanium (SiGe) 930 and 931 and sacrificial layer of epitaxially grown silicon (Si) 933 has already been selectively etched isotropically in the second direction (D2) 905, a distance in a timed exhume (DIST 1 in FIG. 8C), to form a plurality of first horizontal openings 979 in the first region separating layers of the remaining, thinned, epitaxially grown single crystalline (Si) material 932. A second dielectric material 937 is conformally deposited on exposed surfaces of the remaining, thinned, epitaxially grown single crystalline (Si) material 932 in the first horizontal openings 979. The second dielectric material 937 may be deposited fully upon exposed surfaces in the plurality of first horizontal openings 979 to provide a first support, bridge-like structure to the remaining, thinned, epitaxially grown single crystalline (Si) material 932. In one embodiment, the second dielectric material is deposited using an atomic layer deposition (ALD) process. The second dielectric material 937 may serve as a liner around the plurality of first horizontal openings 979. The second dielectric material 937 may be flowed into the second vertical opening 970 and first horizontal openings 979, from where sacrificial epitaxially grown silicon germanium (SiGe) material layers 930 and 931 (in FIG. 9C) and at least one, thinner sacrificial epitaxially grown single crystalline (Si) material layer (933 in FIG. 9C) was removed, to cover exposed surfaces of the remaining, thinned, epitaxially grown, single crystalline silicon (Si) material 932 in order to provide support structure to the remaining, thinned, epitaxially grown single crystalline (Si) material 932.

In one embodiment, the second dielectric material 937 may comprise a nitride material. In another embodiment, second dielectric material 937 may comprise a silicon nitride ($Si_3N_4$) material (also referred to herein as "SiN"). In another embodiment the second dielectric material 937 may include silicon dioxide ($SiO_2$) material. In another embodiment the second dielectric material 937 may comprise a silicon oxy-carbide (SiOxCy) material, and/or combinations thereof. Embodiments are not limited to these examples.

In one embodiment, the second dielectric material 937 may be conformally deposited all around exposed surfaces in the plurality of first horizontal openings to have a thickness (t3) of approximately 20 to 80 angstroms (Å).

As further shown in FIG. 9C, a third dielectric material 939, e.g., oxide material, may be conformally deposited on exposed surfaces of the second dielectric material 937. The third dielectric material 939 may be deposited fully upon exposed surfaces of the second dielectric material to fill the plurality of first horizontal openings 979, and at least partially the second vertical opening 970, to further provide a second support, bridge-like structure to the remaining, thinned, epitaxially grown single crystalline (Si) material 932. In some embodiments, as shown in FIG. 9C, the third dielectric material 939 may be a same dielectric material as the first dielectric material 939, shown in FIG. 9B and may further serve as a liner around the plurality of first horizontal openings 979. The third dielectric material 939 may be flowed into the second vertical opening 970 to cover exposed surfaces of the second dielectric material 937 thus supporting the remaining, thinned, epitaxially grown, single crystalline silicon (Si) material 932 from where sacrificial epitaxially grown silicon germanium (SiGe) material layers 930 and 931 and at least one, thinner sacrificial epitaxially grown single crystalline (Si) material layer 933 was removed to form the plurality of first horizontal openings 979 within the stack.

Figure 9D:
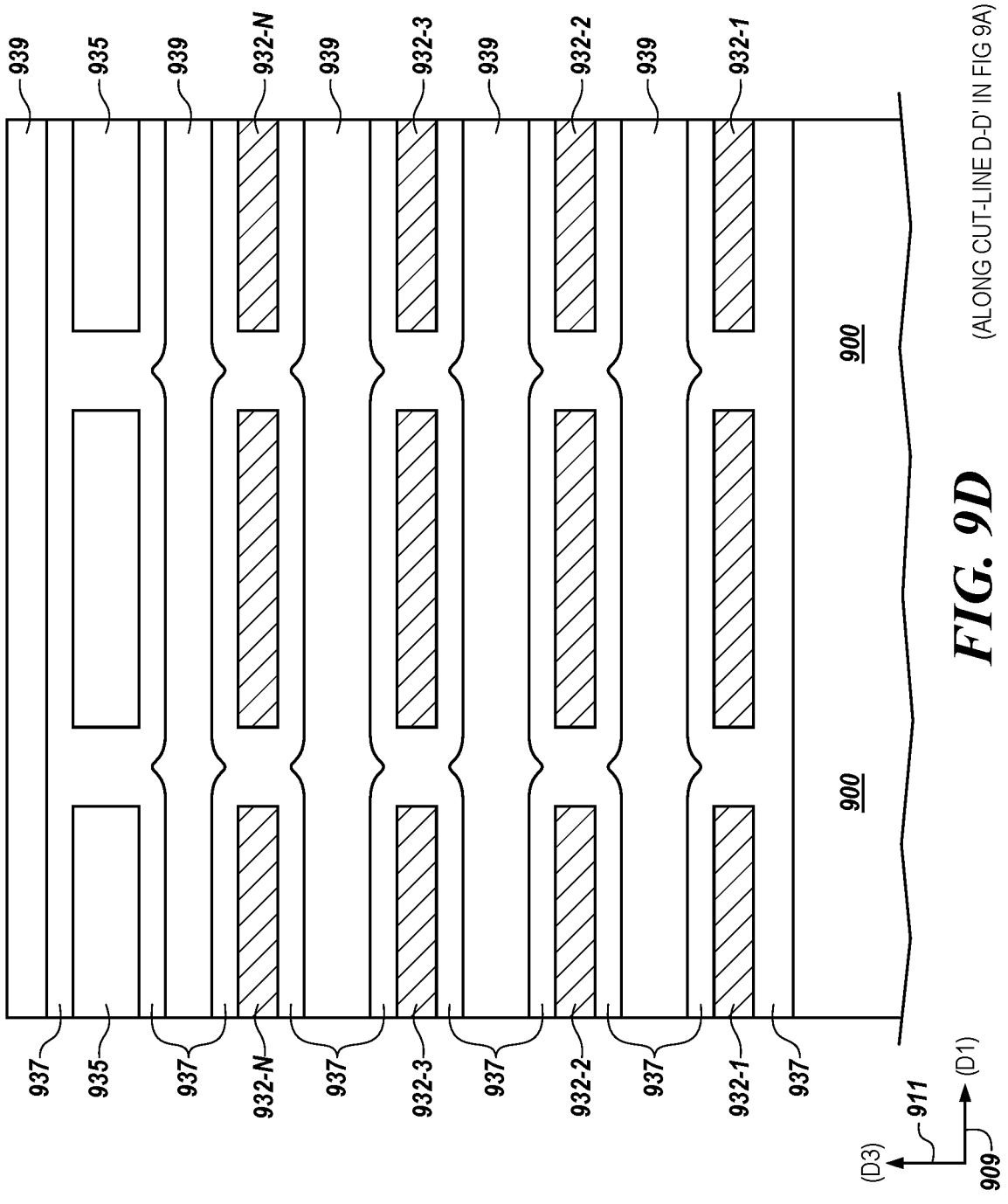

FIG. 9D illustrates a cross sectional view, taken along cut-line D-D' in FIG. 9A, showing another view of the semiconductor structure at this particular point in one example semiconductor fabrication process of an embodiment of the present disclosure. The cross-sectional view shown in FIG. 9D is illustrated, right to left in the plane of the drawing sheet, extending in the second direction (D2) 905 in FIG. 9C, along a cross section of the repeating iterations of alternating layers of alternating layers of remaining, thinned, epitaxially grown, single crystalline silicon (Si) material 932, surrounded by second dielectric material 937 and spaced between layers of the vertical stack by the third dielectric material 939. A hard mask 935 may be covered by second dielectric material 937 and the third dielectric material 939. Thus, the third dielectric material 939 may also fill the spaces between the second dielectric materials 937 and the cross section of repeating iterations of alternating layers of remaining, thinned epitaxially grown, single crystalline silicon (Si) material 932.

FIG. 10 illustrates an example method, at another stage of a semiconductor fabrication process, for forming silicon within horizontal access devices in vertical three-dimensional (3D) memory, such as illustrated in FIGS. 1-2, and in accordance with a number of embodiments of the present disclosure. As will be seen in FIG. 10, a timed selective etch process is performed, selectively etching the second dielectric material 1037 a second distance (DIST 2) from the second vertical openings 1070.

FIG. 10 illustrates a cross sectional view, taken along cut-line B-B' in FIG. 9A, showing another view of the semiconductor structure at this particular point in one example semiconductor fabrication process of an embodiment of the present disclosure. The cross-sectional view shown in FIG. 10 shows the repeating iterations of alternating layers of the epitaxially grown silicon germanium (SiGe) 1030 and 1031 and the remaining, thinned epitaxially grown, single crystalline silicon (Si) material 1032 (and un-etched, un-thinned epitaxially grown, single crystalline silicon (Si) material 1032 that was not removed in the timed exhume described in FIG. 5C) on a semiconductor substrate 1000.

The cross-sectional view shown in FIG. 10 is illustrated extending in the second horizontal direction (D2) 1005, left and right along the plane of the drawing sheet, along an axis of the repeating iterations of alternating layers of the epitaxially grown silicon germanium (SiGe) 1030 and 1031 and the epitaxially grown, single crystalline silicon (Si) material 1032 and 1033. In the example embodiment of FIG. 10, the second dielectric material 1037 is selectively etched a second distance (DIST 2) 1083 from the second vertical openings 1070. In some examples, the second dielectric material 1037 may be etched back a second distance (DIST 2) 1083 in a timed selective etch, exhume process. Second distance (DIST 2) 1083 is the distance from the second vertical openings 1070 to a remaining, unetched portion of the second dielectric material 1037. In some embodiments, the second dielectric material 1037 is etched back from the second vertical openings 1070 a second distance (DIST 2) in a range of approximately twenty-five (25) to seventy-five (75) nanometers (nm). The second dielectric material 1037 may be selectively etched, being selective to the remaining, thinned epitaxially grown, single crystalline silicon (Si) material 1032 and only partially thinning the third dielectric material 1039, thus leaving the epitaxially grown, single crystalline silicon (Si) material 1032 and portions of the third dielectric material 1039 intact. As shown further in FIG. 10, a portion of the third dielectric material 1039 has been removed with an additional selective etch of the second dielectric material 1037 in the first horizontal openings (979 in FIG. 9C)

Further, as shown in FIG. 10 a gate dielectric material 1042 may be formed on exposed surfaces of the remaining, thinned, epitaxially grown, single crystalline silicon (Si) material 1032 to form horizontal access devices. In some embodiments the gate dielectric material may be an oxide material 1042. The gate dielectric material 1042 may be conformally deposited fully around every surface of the remaining, thinned, epitaxially grown, single crystalline silicon (Si) material 1032 to form gate all around (GAA) gate structures, at the channel regions of the access devices. The gate dielectric material 1042 may be deposited on exposed surfaces of the remaining, thinned, epitaxially grown, single crystalline silicon (Si) material 1032 using an atomic layer deposition. In some examples, an oxide material 1042 may be deposited over the exposed surfaces of the epitaxially grown, single crystalline silicon (Si) material 1032. In some embodiments, the gate dielectric material 1042 may be a thermally grown oxide material 1042 on exposed surfaces of the remaining, thinned, exposed epitaxially grown, single crystalline silicon (Si) material 1032. A thermal oxidation process may be used to densify the ALD the oxide material 1042. The thermal oxidation process may involve forming oxide material 1042 from a hybrid oxide material. The hybrid oxide material may combine a low temperature oxide material and a high temperature oxide material.

As shown in FIG. 10, a first conductive material 1077 may be deposited on a gate dielectric material 1042 to form gates. The first conductive material 1077 may be deposited around the remaining, thinned, exposed epitaxially grown, single crystalline silicon (Si) material 1032 such that the first conductive material 1077 may have a top portion above the epitaxially grown, single crystalline silicon (Si) material 1032 and a bottom portion below the epitaxially grown, single crystalline silicon (Si) material to form gate all around (GAA) gate structures, at the channel regions of the access devices. The gates opposing the channel regions provide a subthreshold voltage (sub-Vt) slope in a range of approximately 45 to 100 millivolts per decade (mV/dec). The first conductive material 1077 may be conformally deposited into second vertical openings 1070 and fill the continuous horizontal openings up to the unetched portions of the third dielectric material 1039 and the second dielectric material 1037. The first conductive material 1077 may be conformally deposited using a chemical vapor deposition (CVD) process, plasma enhanced CVD (PECVD), atomic layer deposition (ALD), or other suitable deposition process.

In some embodiments, the first conductive material, 1077, may comprise one or more of a doped semiconductor material, e.g., doped silicon, doped germanium, etc. In some embodiments, the first conductive material 1077 may comprise a conductive metal nitride material, e.g., titanium nitride, tantalum nitride, etc. In some embodiments, the first conductive material may comprise a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc., and/or some other combination thereof. The first conductive material 1077 together with the gate dielectric material 1042 may form horizontally oriented access lines (which also may be referred to a wordlines) opposing channel regions of the epitaxially grown, single crystalline silicon (Si) material.

FIG. 11A illustrates a cross sectional view, taken along cut-line B-B' in FIG. 9A, showing another view of the semiconductor structure at another particular point in one example semiconductor fabrication process of an embodiment of the present disclosure. The cross-sectional view shown in FIG. 11A is illustrated extending in the second horizontal direction (D2) 1105, left and right along the plane of the drawing sheet, along an axis of the repeating iterations of alternating layers of the epitaxially grown silicon germanium (SiGe) 1130 and 1131 and the epitaxially grown, single crystalline silicon (Si) material 1132 and 1133.

A first conductive material 1177 was deposited on the gate dielectric material 1142 and formed around the remaining, thinned, epitaxially grown, single crystalline silicon (Si) material 1132, and is here recessed back to form gate all around (GAA) structures opposing only channel regions of the epitaxially grown, single crystalline silicon (Si) material 1132. The first conductive material 1177, formed on the gate dielectric material 1142, may be recessed and etched away from the second vertical opening 1170. In some embodiments, the first conductive material 1177 may be etched using an atomic layer etching (ALE) process. In some embodiments, the first conductive material 1177 may be etched using an isotropic etch process. The first conductive material 1177 may be selectively etched leaving the gate dielectric material 1142 covering the remaining, thinned epitaxially grown, single crystalline silicon (Si) material 1132 and the third dielectric material 1139 intact. The first conductive material 1177 may be selectively etched in the second direction, in the continuous second horizontal openings (described above), a second distance (DIST 3) in a range of twenty (20) to fifty (50) nanometers (nm) back from the second vertical opening 1170. The first conductive material 1177 may be selectively etched around the remaining, thinned epitaxially grown, single crystalline silicon (Si) material 1132 and back into the continuous horizontal openings (described above) extending in the first horizontal direction (1109 in FIG. 11B). An ILD fill material 1167 may be deposited into first vertical openings 1170 and filling the continuous second horizontal openings up to the unetched portions of the gate dielectric material 1142, the un-etched third dielectric material 1139, and the first conductive material 1177. The ILD fill material 1167 may be conformally deposited using a chemical vapor deposition (CVD) process, plasma enhanced CVD (PECVD), atomic layer deposition (ALD), or other suitable deposition process.

FIG. 11B illustrates a cross sectional view, taken along cut-line D-D' in FIG. 9A, showing another view of the semiconductor structure at this particular point in one example semiconductor fabrication process of an embodiment of the present disclosure. The cross-sectional view shown in FIG. 11B is illustrated extending in the first horizontal direction (D1) 1109, left and right in the plane of the drawing sheet, along an axis perpendicular to the repeating iterations of multiple, alternating layers of the etched first conductive material 1177, gate dielectric 1142, and epitaxially grown, single crystalline silicon (Si) material 1132.

In FIG. 11B, first dielectric material 1139 is shown spacing the arrays of vertically stacked memory cells, extending left and right along a first horizontal direction (D1) 1109 in the plane of the drawings sheet, for a three-dimensional array of vertically oriented memory cells. Extending into and out from the plane of the drawing sheet is shown the repeating iterations of alternating layers of the remaining, thinned epitaxially grown, single crystalline silicon (Si) material 1132 at the channel regions covered by the gate dielectric material 1142, and covered in the continuous second horizontal openings (described above) in the first direction (D1) 1109 by the first conductive material 1177. The first conductive material 1177, formed on the gate dielectric material 1142, was etched away from the second vertical opening (1170 in FIG. 11A). The first conductive material 1177, formed on the gate dielectric material 1142, was recessed back in the continuous horizontal openings extending in the second horizontal direction (1105 in FIG. 11A).

The first conductive material 1177 is deposited on the gate dielectric material 1142 and formed around the epitaxially grown, single crystalline silicon (Si) material 1132 to form gate all around (GAA) structure opposing channel regions of the epitaxially grown, single crystalline silicon (Si) material 32 in the access device regions. In FIG. 11B, the first conductive material, 1177 is shown filling in the space in the second horizontal openings (described above) left by the etched first dielectric material 1139.

FIG. 12A illustrates an example method, at another stage of a semiconductor fabrication process, for forming silicon within horizontal access devices in vertical three-dimensional (3D) memory, such as illustrated in FIGS. 1-2, and in accordance with a number of embodiments of the present disclosure. FIG. 12A illustrates a top down view of a semiconductor structure, at a particular point in time, in a semiconductor fabrication process, according to one or more embodiments. In the example embodiment of FIG. 12A, the method comprises using a photolithographic process to pattern the photolithographic mask (1238 in FIG. 12B) to form fourth vertical opening 1251 adjacent a second region of the repeating iterations of alternating layers of the epitaxially grown silicon germanium (SiGe) (1230 and 1231 in FIG. 12B) and the epitaxially grown, single crystalline silicon (Si) material (1132 and 1133 in FIG. 11A) to expose second vertical sidewalls in the stack (e.g., stack shown in FIG. 4). In FIGS. 12A-12C the epitaxially grown, single crystalline silicon (Si) material (1132 and 1133 in FIG. 11A) is selectively etched in the second horizontal direction to form a plurality of second horizontal openings (1279 in FIG. 12C), in which to form storage nodes, in the second region, e.g., storage node regions in the 3D vertical array of memory cells. Once the epitaxially grown, single crystalline silicon (Si) material (1132 and 1133 in FIG. 11A) has been removed by selectively etching, second source/drain regions (1245 in FIG. 12C), adjacent channel regions for the horizontal access devices, may be formed in a side surface of the epitaxially grown, single crystalline silicon (Si) material (1132 in FIG. 11A) through gas phase doping from the second horizontal openings (1279 in FIG. 12C).

FIG. 12B illustrates a cross sectional view, taken along cut-line A-A' in FIG. 12A in the storage node regions, showing another view of the semiconductor structure at this particular point in one example semiconductor fabrication process of an embodiment of the present disclosure. The cross sectional view shown in FIG. 12B is away from the plurality of separate, horizontal access lines, and shows bridged, repeating iterations of multiple, alternating layers of epitaxially grown silicon germanium (SiGe) (1230 and 1231 in FIG. 12C) on a semiconductor substrate 1200 bridging openings of the second horizontal openings (1279 in FIG. 12C) to form the vertical stack where the epitaxial silicon material (1132 and 1133 FIG. 11A) has been removed to form storage nodes. As shown in FIG. 12B, a vertical direction 1211 is illustrated as a third direction (D3), e.g., z-direction in an x-y-z coordinate system, analogous to the third direction (D3) 1211, among first, second, and second directions, shown in FIGS. 1-2. The plane of the drawing sheet, extending right and left, is in a first direction (D1) 1209. In the example embodiment of FIG. 12B, the materials within the vertical stack, e.g., multiple, alternating layers of epitaxially grown silicon germanium (SiGe) (1230 and 1231 in FIG. 12C) are extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 12C illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 12C is illustrated extending in the second horizontal direction (D2) 1205, left and right along the plane of the drawing sheet, along an axis of the repeating iterations of alternating layers of epitaxially grown silicon germanium (SiGe) 1230, along and in which the horizontally oriented access devices and horizontally oriented storage nodes, e.g., capacitor cells, can be formed within the layers of epitaxially grown, single crystalline silicon (Si) material 1232. As shown in FIG. 12C, a fourth vertical opening 1251 has been formed through the repeating iterations of multiple, alternating layers of the epitaxially grown silicon germanium (SiGe) 1230 and 1231 and the epitaxially grown, single crystalline silicon (Si) material 1232 and 1133 in FIG. 11A. The epitaxially grown, single crystalline silicon (Si) material 1232 in the second region, e.g., storage node region, is selectively etched to form the second horizontal openings 1279 in which to form storage nodes, e.g., horizontally oriented capacitor cells (shown next in FIG. 11). In one example, an atomic layer etching (ALE) process is used to selectively etch the epitaxially grown, single crystalline silicon (Si) material 1232. In one embodiment selectively etching the epitaxially grown, single crystalline silicon (Si) material 1232 in the second region, e.g., storage node region, to form the second horizontal openings 1279 may be performed according to a timed exhume process. In one or more embodiments the second dielectric material 1237 serves as an etch stop for the timed exhume, selective etch process.

As is shown in FIG. 12C, a source/drain region 1245 may be formed by gas phase doping a dopant into a side surface portion of the epitaxially grown, single crystalline silicon (Si) material 1232. In some embodiments, the source/drain region 1245 may be a second source/drain region 1245 adjacent storage node regions and on one side of channel regions on an opposite side of channel regions from a first source/drain region (1243 in FIG. 12C) connecting to a digit line connection (described in FIGS. 12-14) to the horizontal access devices. In one example, gas phase doping may be used to achieve a highly isotropic e.g., non-directional doping, to form the second source/drain regions 1245 for the horizontally oriented access devices. In another example, thermal annealing with doping gas, such as phosphorous (P) may be used with a high energy plasma assist to break the bonding. Embodiments, however, are not so limited and other suitable semiconductor fabrication techniques may be utilized.

FIG. 13 illustrates a cross sectional view, taken along cut-line B-B' in FIG. 12A, showing another view of the semiconductor structure at this particular point in one example semiconductor fabrication process of an embodiment of the present disclosure. The cross-sectional view shown in FIG. 1310 is illustrated extending in the second horizontal direction (D2) 1305, left and right along the plane of the drawing sheet, along an axis of the repeating iterations of alternating layers of support structure oxide material 1339 and epitaxially grown, single crystalline silicon (Si) material 1332 along and in which the horizontally oriented access devices are formed. And, as shown in FIG. 13, horizontally oriented storage nodes, e.g., capacitor cells, have been formed where the layers of epitaxially grown, single crystalline silicon (Si) material 1332 have been selectively etched and removed.

In the example embodiment of FIG. 13, the horizontally oriented storage nodes, e.g., capacitor cells, are illustrated as having been formed in this semiconductor fabrication process and first electrodes 1361, e.g., bottom electrodes to be coupled to second source/drain regions 1345 of horizontal access devices, and second electrodes 1356, e.g., top electrodes to be coupled to a common electrode plane such as a ground plane, separated by cell dielectrics 1363, are shown. However, embodiments are not limited to this example. In other embodiments, the first electrodes 1361, e.g., bottom electrodes, coupled to second source/drain regions 1345 of horizontal access devices, and second electrodes 1356, e.g., top electrodes, coupled to a common electrode plane such as a ground plane, separated by cell dielectrics 1363, may be formed subsequent to forming a first source/drain regions (1143 in FIG. 11C), a channel region, and a second source/drain region 1345 in a region of the epitaxially grown, single crystalline silicon (Si) material 1332, intended for location, e.g., placement formation, of the horizontally oriented access devices, described next.

In the example embodiment of FIG. 13, the horizontally oriented storage nodes having the first electrodes 1361, e.g., bottom electrodes to be coupled to source/drain regions of horizontal access devices, and second electrodes 1356, e.g., top electrodes to be coupled to a common electrode plane such as a ground plane, are shown formed in a second horizontal opening, extending in second direction (D2) 1305, left and right in the plane of the drawing sheet, a second distance from the fourth vertical opening, e.g., 1251 in FIG. 12C, formed in the vertical stack, and along an axis of orientation of the horizontal access devices and horizontal storage nodes of the arrays of vertically stacked memory cells of the three dimensional (3D) memory.

Figure 14A:
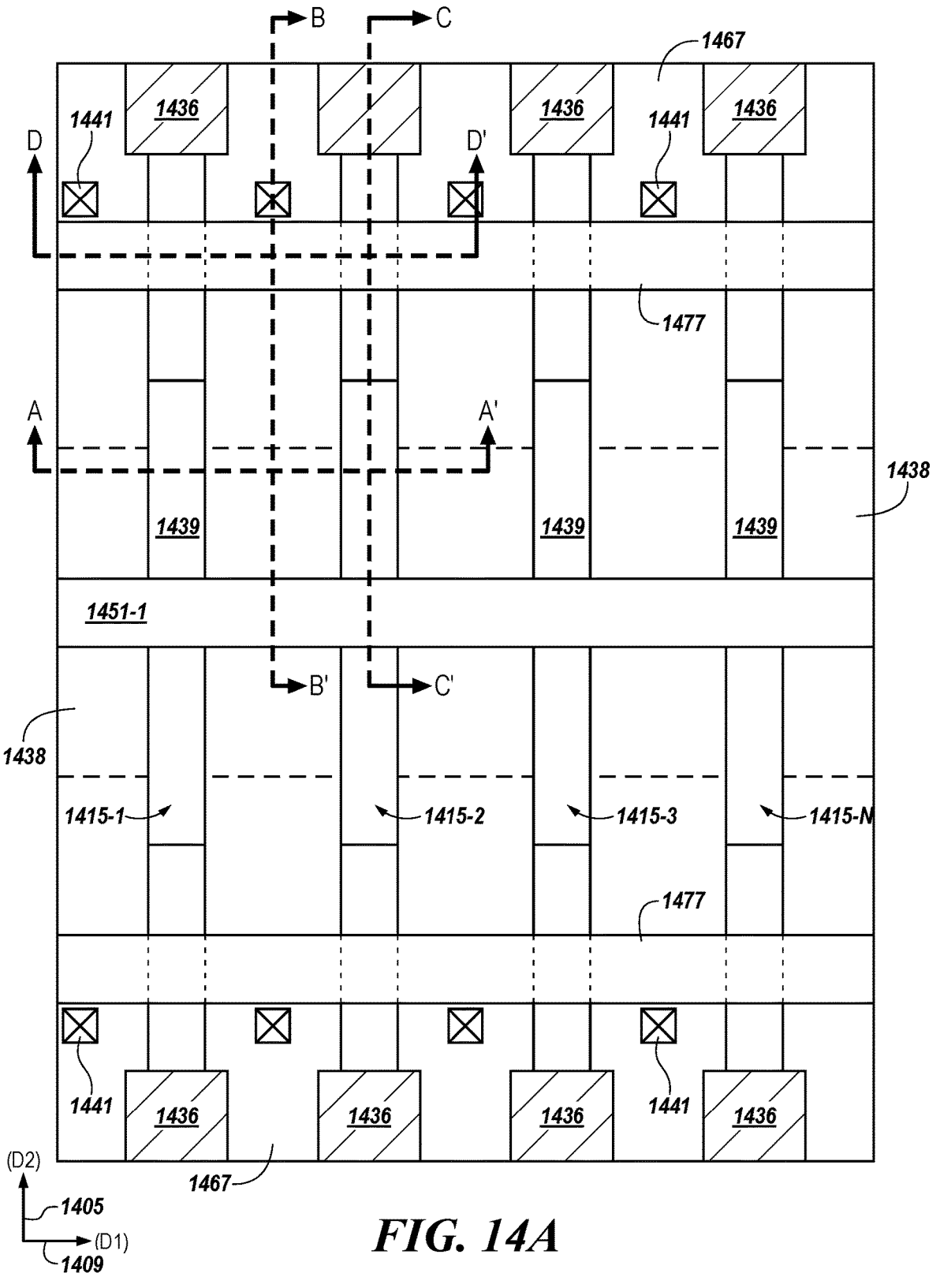

FIG. 14A illustrates an example method, at another stage of a semiconductor fabrication process, for forming silicon within horizontal access devices in vertical three-dimensional (3D) memory, such as illustrated in FIGS. 1-2, and in accordance with a number of embodiments of the present disclosure. FIG. 14A illustrates a top down view of a semiconductor structure, at a particular point in time, in a semiconductor fabrication process, according to one or more embodiments.

The method in FIG. 14A further illustrates using one or more etchant processes to form a plurality of patterned fifth vertical openings (1455 in FIG. 14C) in a vertical digit line region through the vertical stack, using a masked photolithographic process, and extending predominantly in the first horizontal direction (D1) 1409. The one or more etchant processes form the plurality of patterned fourth vertical openings 1451, discussed below in connection with FIG. 14C, to expose second sidewalls in the repeating iterations of multiple, alternating layers of remaining, thinned epitaxially grown, single crystalline silicon (Si) material 1432 and the third dielectric material 1439 in FIG. 14C.

Figure 14B:
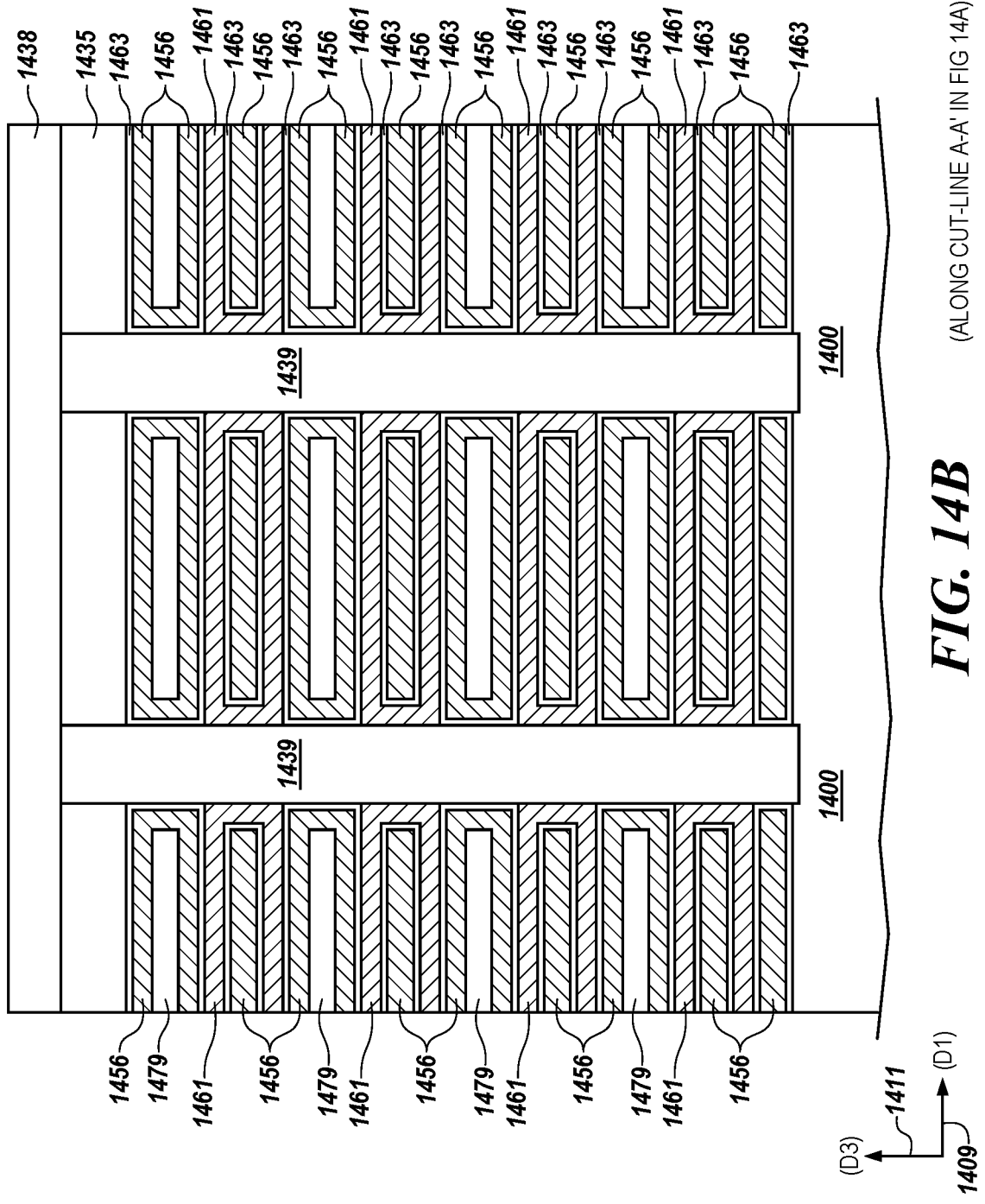

FIG. 14B illustrates a cross sectional view, taken along cut-line A-A' in FIG. 14A, showing another view of the semiconductor structure at this particular point in one example semiconductor fabrication process of an embodiment of the present disclosure. The cross-sectional view shown in FIG. 14B is away from the plurality of separate, horizontal access lines, and shows repeating iterations of first electrodes 1461, e.g., bottom cell contact electrodes, cell dielectrics 1463, and top, common node electrodes 1456, on a semiconductor substrate 1400 to form the vertical stack. As shown in FIG. 14B, a vertical direction 1411 is illustrated as a second direction (D3), e.g., z-direction in an x-y-z coordinate system, analogous to the second direction (D3) 1411, among first, second, and second directions, shown in FIGS. 1-2. The plane of the drawing sheet, extending right and left, is in a first direction (D1) 1409. In the example embodiment of FIG. 14B, the first electrodes 1461, e.g., bottom electrodes, coupled to source/drain regions (1445 in FIG. 14C) of horizontal access devices, and second electrodes 1456 are illustrated separated by a cell dielectric material 1463 extending into and out of the plane of the drawing sheet in second direction (D2) and along an axis of orientation of the horizontal access devices and horizontal storage nodes of the arrays of vertically stacked memory cells of the three dimensional (3D) memory.

Figure 14C:
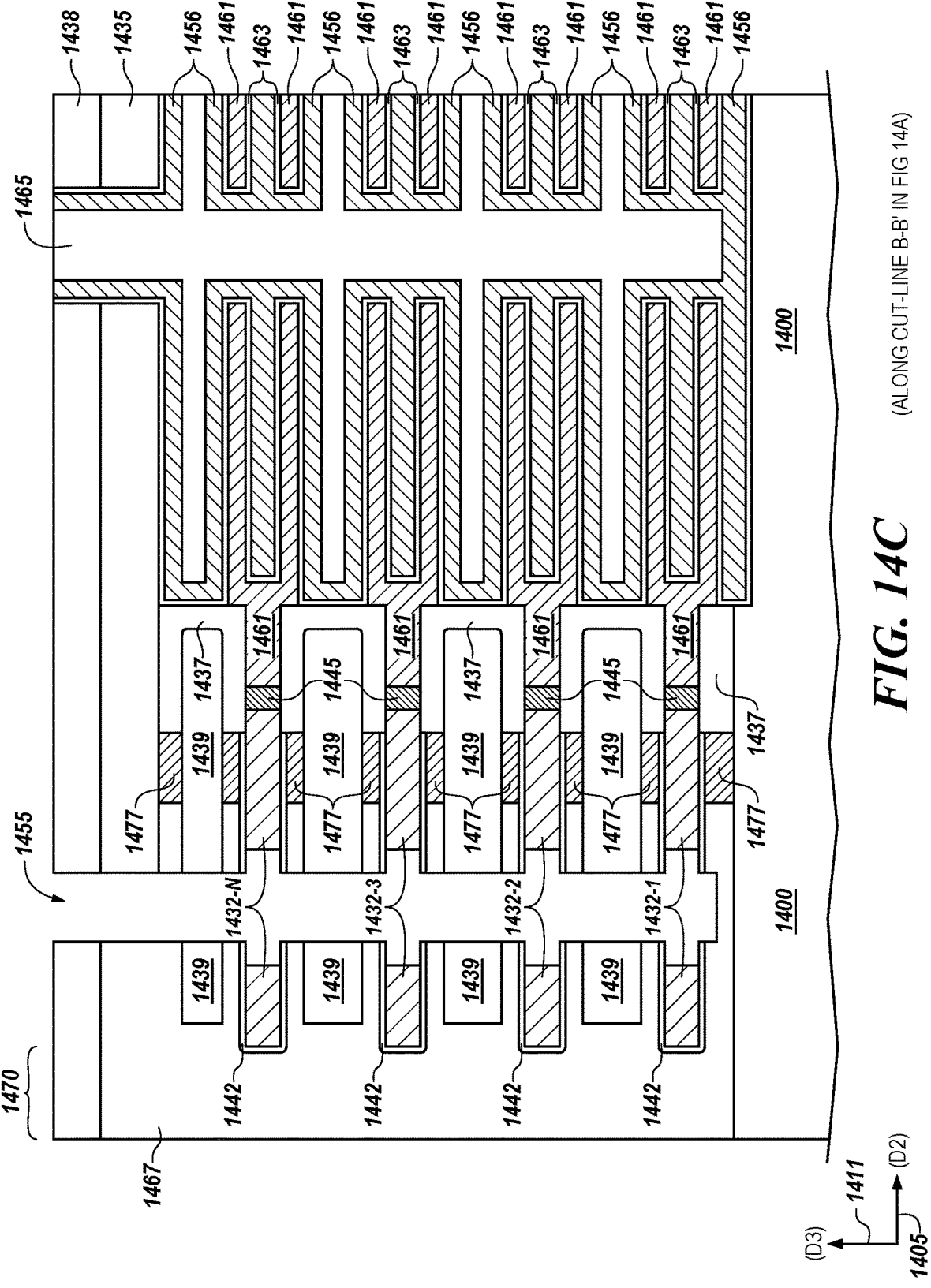

FIG. 14C illustrates a cross sectional view, taken along cut-line B-B' in FIG. 14A, showing another view of the semiconductor structure at this particular point in one example semiconductor fabrication process of an embodiment of the present disclosure. The cross-sectional view shown in FIG. 14C is illustrated extending in the second horizontal direction (D2) 1405, left and right along the plane of the drawing sheet, along an axis of the repeating iterations of alternating layers of second electrodes 1456 along and in which the horizontally oriented access devices and horizontally oriented storage nodes, e.g., capacitor cells, can be formed within the layers of epitaxially grown, single crystalline silicon (Si) material 1432.

In the example embodiment of FIG. 14C, the horizontally oriented storage nodes, e.g., capacitor cells, are illustrated as having been formed been formed in this semiconductor fabrication process and first electrodes 1461, e.g., bottom electrodes, coupled to source/drain regions of horizontal access devices, and second electrodes 1456, e.g., top electrodes, coupled to a common electrode plane such as a ground plane 1465, separated by cell dielectrics 1463, are shown. In this embodiment, a dual-sided capacitor is illustrated as an alternative to the single-sided capacitor. However, embodiments are not limited to this example. In other embodiments, the first electrodes 1461, e.g., bottom electrodes, coupled to source/drain regions of horizontal access devices, and second electrodes 1456, e.g., top electrodes, coupled to a common electrode plane such as a ground plane 1465, separated by cell dielectrics 1463. The storage nodes may be formed subsequent to forming a first source/drain region, a channel region, and a second source/drain region in a region of the epitaxially grown, single crystalline silicon (Si) material 1432, intended for location, e.g., placement formation, of the horizontally oriented access devices.

In the example embodiment of FIG. 14C, the horizontally oriented storage nodes having the first electrodes 1461, e.g., bottom electrodes, coupled to source/drain regions of horizontal access devices, and second electrodes 1456, e.g., top electrodes, coupled to a common electrode plane such as a ground plane 1465, are shown formed in a second horizontal opening, extending in second direction (D2) 1405, left and right in the plane of the drawing sheet, along an axis of orientation of the horizontal access devices and horizontal storage nodes of the arrays of vertically stacked memory cells of the three dimensional (3D) memory. In FIG. 14C, a neighboring, horizontal access lines are illustrated adjacent the second dielectric material 1437, extending in to and out from the plane of the drawing sheet, with a portion of the first conductive material 1477-1 located above the epitaxially grown, single crystalline silicon (Si) material 1432, and a portion of the first conductive material 1477-2 located below the epitaxially grown, single crystalline silicon (Si) material 1432.

Figure 14D:
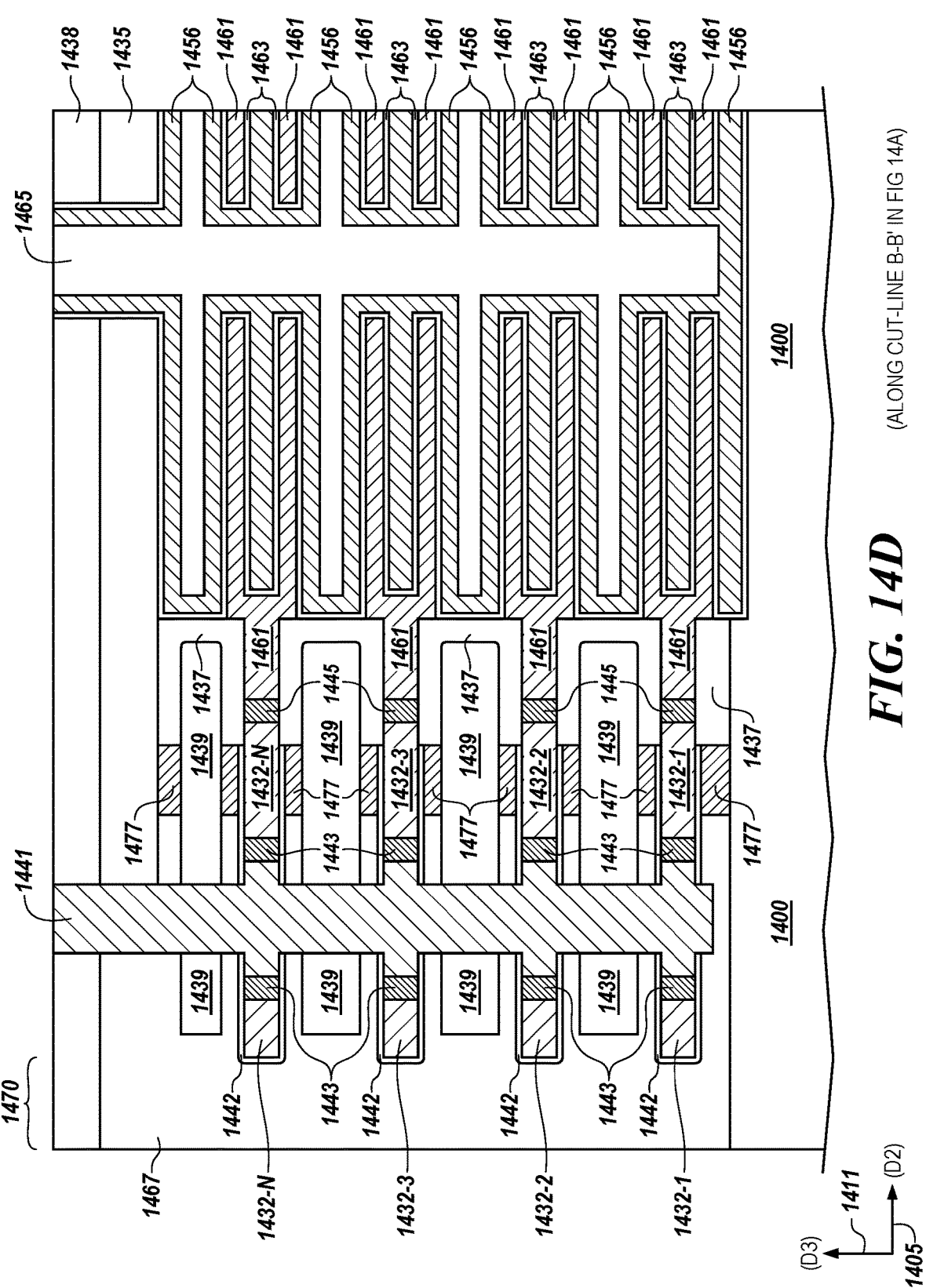

FIG. 14D also illustrates a cross sectional view, taken along cut-line B-B' in FIG. 14A, showing another view of the semiconductor structure at another particular point in one example semiconductor fabrication process of an embodiment of the present disclosure. As shown in FIG. 14D, an etchant process has been used to form the plurality of patterned fourth vertical openings 1451, discussed above in connection with FIG. 14C, vertically through, and to expose second sidewalls in the repeating iterations of multiple, alternating layers of remaining, thinned epitaxially grown, single crystalline silicon (Si) material 1432, ILD material 1467, and the third dielectric material 1439.

As shown in FIG. 14D, a second conductive material 1441 may be deposited to form vertical digit lines. The second conductive material 1441 may be formed as a vertical digit line adjacent multiple, alternating layers of remaining, thinned epitaxially grown, single crystalline silicon (Si) material 1432. In particular, the second conductive material 1441 may form vertically oriented digit lines adjacent a location to form first source/drain regions, between the support pillar material. In the embodiment shown in FIG. 14D, the second conductive material 1441 may comprise a highly doped n-type poly silicon (Si) material. The first source/drain regions 1443 may be formed by diffusing n-type dopants from the n-type poly silicon (Si) material of the second conductive material 1441 into the multiple, alternating layers of remaining, thinned epitaxially grown, single crystalline silicon (Si) material 1432 through an annealing process.

In one embodiment, the second conductive material 1441 may be formed by gas phase doping a high energy gas phase dopant, such as phosphorus (P) atoms, as impurity dopants, at a high plasma energy such as PECVD to form a high concentration, n-type doped (n+) region within the fifth vertical opening. For example, a highly phosphorus (P) doped (n+) poly-silicon germanium (SiGe) material may be deposited into the fourth vertical openings 1451 to form the second conductive material 1441.

Thus, the first source/drain regions 1443 may be formed by out-diffusing n-type (n+) dopants into the multiple, alternating layers of remaining, thinned epitaxially grown, single crystalline silicon (Si) material 1432 to form the first source/drain regions 1443.

FIG. 15 illustrates a cross sectional view, taken along cut-line B-B' in FIG. 14A, showing another view of the semiconductor structure at this particular point in one example semiconductor fabrication process of an alternate embodiment of the present disclosure from that of FIG. 14D. The cross sectional view shown in FIG. 15 is illustrated extending multiple, alternating layers of remaining, thinned epitaxially grown, single crystalline silicon (Si) material 1532 in second direction (D2), left and right in the plane of the drawing sheet, formed in the vertical stack, e.g., 401 in FIG. 4, and along an axis of orientation of the horizontal access devices and horizontal storage nodes of the arrays of vertically stacked memory cells of the three dimensional (3D) memory.

In the embodiment of FIG. 15, the second conductive material 1541 may be formed within second vertical openings (1455 in FIG. 14C). The second conductive material 1541 may be formed from a high concentration, n-type dopant. The high concentration, n-type dopant may be formed by depositing a polysilicon material onto the multiple, alternating layers of remaining, thinned epitaxially grown, single crystalline silicon (Si) material 1532 and annealed to out-diffuse the n-type dopants to form the first source/drain regions 1543.

As shown in the embodiment of FIG. 15, a metal material 1571 may be deposited into the second vertical opening (1455 in FIG. 14C), within second conductive material 1541. In some embodiments, the metal material 1571 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc., and/or some other combination thereof. The metal material 1571 coupled to the second conductive material 1541 may be formed vertically adjacent first conductive material 1577.

FIG. 16 illustrates a cross sectional view, taken along cut-line B-B' in FIG. 14A, showing another view of the semiconductor structure at this particular point in one example semiconductor fabrication process of another alternate embodiment of the present disclosure. The cross-sectional view shown in FIG. 16 is illustrated extending in the second horizontal direction (D2) 1605, left and right along the plane of the drawing sheet.

In the example embodiment of FIG. 16, the second conductive material 1641 may be formed within second vertical openings 1681. The second conductive material 1641 may once again be formed from a high concentration, n-type dopant. However, in this example embodiment, the high concentration, n-type dopant may be formed by depositing a highly phosphorus (P) doped (n+) poly-silicon germanium (SiGe) material onto the multiple, alternating layers of remaining, thinned epitaxially grown, single crystalline silicon (Si) material 1632.

As in the embodiment of FIG. 15, a metal material 1671 may be deposited into the second vertical opening (1455 in FIG. 14C), within second conductive material 1641. In some embodiments, the metal material 1671 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc., and/or some other combination thereof. The metal material 1671 coupled to the second conductive material 1641 may be formed vertically adjacent first conductive material 1677.

FIG. 17A illustrates an example method, at another stage of a semiconductor fabrication process, forming epitaxial silicon within horizontal access devices in vertical three-dimensional (3D) memory, in accordance with a number of embodiments of the present disclosure. FIG. 17A illustrates a top down view of a semiconductor structure, at a particular point in time, in a semiconductor fabrication process, according to one or more embodiments. In the example embodiment of FIG. 17A, the method comprises using a photolithographic process to pattern the photolithographic mask where a second conductive material 1741 is asymmetric to reserve room for a body contact 1795. A second conductive material 1741 may be formed vertically through a plurality of patterned second vertical openings through the vertical stack. The vertically oriented digit lines are formed asymmetrically adjacent in electrical contact with the first source/drain regions (1543 in FIG. 15). Horizontal access lines and GAA structures are also shown opposing channel regions, separating first source/drain regions from second source/drain regions 1445.

FIG. 17B illustrates an example method, at another stage of a semiconductor fabrication process, forming epitaxial silicon within horizontal access devices in vertical three-dimensional (3D) memory, in accordance with a number of embodiments of the present disclosure. FIG. 17B illustrates a top down view of a semiconductor structure, at a particular point in time, in a semiconductor fabrication process, according to one or more embodiments. In the example embodiment of FIG. 17B, the method comprises using a photolithographic process to pattern the photolithographic mask (1537 in FIG. 15) where a second conductive material 1741 is deposited symmetrically.

The second conductive material 1741 may be formed symmetrically as a vertical digit line contact. The vertically oriented digit lines are formed symmetrically, in vertical alignment, in electrical contact with the first source/drain regions (1543 in FIG. 15). The second conductive material 1741 may be formed in contact with an insulator material 1792 such that there is no body contact within a second vertical opening (1455 in FIG. 14C). Second conductive material 1741 may form vertical digit lines adjacent a first source/drain region (1543 in FIG. 15). Horizontal access lines and GAA structures are also shown opposing channel regions, separating first source/drain regions from second source/drain regions (1545 in FIG. 15).

FIG. 18A illustrates a top down layout view for a folded digit line architecture having horizontally oriented access devices coupled to horizontally oriented access lines, and having vertical digit lines for semiconductor devices, in accordance with a number of embodiments of the present disclosure. FIG. 18A illustrates a top down view of a semiconductor structure with dual vertical digit lines. As illustrated in FIG. 18A, embodiments of the present disclosure may be employed in a structure wherein the array of vertically stacked memory cells is electrically coupled in a folded digit line architecture. In a folded digit line structure, the dual structures may share a single word line 1803. A folded digit line structure may be possible when the digit lines 1807 has an odd amount of word lines 1803. A folded digit line structure may be possible when only one word line is turned on in the sub array block.

FIG. 18B illustrates an alternate top view, showing an open digit line architecture having horizontally oriented access devices coupled to horizontally oriented access lines, and having vertical digit lines for semiconductor devices, in accordance with a number of embodiments of the present disclosure. FIG. 18B illustrates a top down view of a semiconductor structure with dual vertical digit lines 1807-1A and 1807-1B. As illustrated in FIG. 18B, embodiments of the present disclosure may be employed in a structure wherein the array of vertically stacked memory cells is electrically coupled in an open digit line architecture. In an open digit line structure, each digit line structure may have its own word line 1803-1A and 1803-1B, such that a dual vertical digit line structure may have two wordlines. An open digit line structure may be possible when the digit lines 1807 has an even amount of word lines 1803. If two neighboring wordlines are turned on, only an open digit line structure may be possible; a folded digit line structure would not be possible.

FIG. 19 is a block diagram of an apparatus in the form of a computing system 1900 including a memory device 1903 in accordance with a number of embodiments of the present disclosure. As used herein, a memory device 1903, a memory array 1910, and/or a host (e.g., controller) 1902, for example, might also be separately considered an "apparatus." According to embodiments, the memory device 1903 may comprise at least one memory array 1910 with a memory cell formed having a digit line and body contact, according to the embodiments described herein.

In this example, system 1900 includes a host 1902 coupled to memory device 1903 via an interface 1904. The computing system 1900 can be a personal laptop computer, a desktop computer, a digital camera, a mobile telephone, a memory card reader, or an Internet-of-Things (IoT) enabled device, among various other types of systems. Host 1902 can include a number of processing resources (e.g., one or more processors, microprocessors, or some other type of controlling circuitry) capable of accessing memory device 1903. The system 1900 can include separate integrated circuits, or both the host 1902 and the memory device 1903 can be on the same integrated circuit. For example, the host 1902 may be a system controller of a memory system comprising multiple memory devices 1903, with the system controller (e.g., control circuitry) 1905 (e.g., control circuitry) providing access to the respective memory devices 1903 by another processing resource such as a central processing unit (CPU).

In the example shown in FIG. 19, the host 1902 is responsible for executing an operating system (OS) and/or various applications (e.g., processes) that can be loaded thereto (e.g., from memory device 1903 via system controller 1905). The OS and/or various applications can be loaded from the memory device 1903 by providing access commands from the host 1902 to the memory device 1903 to access the data comprising the OS and/or the various applications. The host 1902 can also access data utilized by the OS and/or various applications by providing access commands to the memory device 1903 to retrieve said data utilized in the execution of the OS and/or the various applications.

For clarity, the system 1900 has been simplified to focus on features with particular relevance to the present disclosure. The memory array 1910 can be a DRAM array comprising at least one memory cell having a digit line and body contact formed according to the techniques described herein. For example, the memory array 1910 can be an unshielded DL 4F2 array such as a 3D-DRAM memory array. The array 1910 can comprise memory cells arranged in rows coupled by word lines (which may be referred to herein as access lines or select lines) and columns coupled by digit lines (which may be referred to herein as sense lines or data lines). Although a single array 1910 is shown in FIG. 19, embodiments are not so limited. For instance, memory device 1903 may include a number of arrays 1910 (e.g., a number of banks of DRAM cells).

The memory device 1903 includes address circuitry 1906 to latch address signals provided over an interface 1904. The interface can include, for example, a physical interface employing a suitable protocol (e.g., a data bus, an address bus, and a command bus, or a combined data/address/command bus). Such protocol may be custom or proprietary, or the interface 1904 may employ a standardized protocol, such as Peripheral Component Interconnect Express (PCIe), Gen-Z, CCIX, or the like. Address signals are received and decoded by a row decoder 1908 and a column decoder 1912 to access the memory array 1910. Data can be read from memory array 1910 by sensing voltage and/or current changes on the sense lines using sensing circuitry 1911. The sensing circuitry 1911 can comprise, for example, sense amplifiers that can read and latch a page (e.g., row) of data from the memory array 1910. The I/O circuitry 1907 can be used for bi-directional data communication with the host 1902 over the interface 1904. The read/write circuitry 1913 is used to write data to the memory array 1910 or read data from the memory array 1910. As an example, the circuitry 1913 can comprise various drivers, latch circuitry, etc.

Control circuitry 1905 decodes signals provided by the host 1902. The signals can be commands provided by the host 1902. These signals can include chip enable signals, write enable signals, and address latch signals that are used to control operations performed on the memory array 1910, including data read operations, data write operations, and data erase operations. In various embodiments, the control circuitry 1905 is responsible for executing instructions from the host 1902. The control circuitry 1905 can comprise a state machine, a sequencer, and/or some other type of control circuitry, which may be implemented in the form of hardware, firmware, or software, or any combination of the three. In some examples, the host 1902 can be a controller external to the memory device 1903. For example, the host 1902 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause-and-effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and storage nodes, comprising:

forming multiple, alternating silicon germanium (SiGe) layers and single crystalline silicon (Si) layers in different thicknesses to form tiers in a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

forming a second vertical opening through the vertical stack and extending predominantly in the first horizontal direction to expose second vertical sidewalls adjacent a first region of the SiGe layers and single crystalline Si layers;

forming a first dielectric material in the second vertical opening;

forming a plurality of spaced, third vertical openings in the first dielectric material;

forming support-pillar material in the plurality of spaced, third vertical openings to form support pillars, wherein a first source/drain region of a respective horizontally oriented access device is formed between a first vertically oriented support pillar of the vertically oriented support pillars and a second vertically oriented support pillar of the vertically oriented support pillars;

selectively removing at least a portion of the first dielectric material from the second vertical openings, without removing the support-pillar material to form a plurality of spaced, fourth vertical openings;

selectively removing at least a portion of the SiGe layers in the tiers from the second vertical opening;

forming a second dielectric material on exposed surfaces of the single crystalline Si layers;

selectively removing at least a portion of the second dielectric material to expose active surfaces of the Si layers;

forming a gate dielectric material on the exposed active surfaces of the Si layers; and forming a conductive material on the gate dielectric material.

2. The method of claim 1, wherein forming the support pillar material comprises forming a high-k dielectric oxide material as the support pillar material.

3. The method of claim 2, wherein forming the high-k dielectric oxide comprises depositing zirconium oxide (ZrOx), hafnium oxide (HfOx), aluminum oxide (AlOx), niobium oxide (NbOx), or combinations thereof.

4. The method of claim 1, wherein forming the Si layers comprises epitaxially growing the Si layers to have a first thickness in a range of approximately 100 to 300 angstroms (Å).

5. The method of claim 1, wherein forming the plurality of spaced, third vertical openings, comprises forming the third vertical openings adjacent alternating first dielectric material formed in the first vertical openings.

6. The method of claim 1, wherein forming the plurality of spaced, third vertical openings, comprises forming the third vertical openings adjacent each first dielectric material formed in the first vertical openings.

7. The method of claim 6, wherein forming the plurality of spaced, third vertical openings comprises forming the third vertical opening to have a spaced distance in a range of approximately 100 to 200 nanometers (nm).

8. The method of claim 1, further comprising:

forming a fifth vertical opening adjacent a second region of the SiGe layers and the single crystalline Si layers to expose third vertical sidewalls in the vertical stack;

selectively removing the single crystalline Si layer in the second horizontal direction to form a plurality of second horizontal openings in the second region and stopping on the second dielectric material;

gas phase doping a dopant into a side surface of the single crystalline Si layers from the second horizontal openings to form second source/drain regions horizontally adjacent a channel region; and forming horizontally oriented capacitor cells having a bottom electrode formed in electrical contact with the second source/drain regions.

9. The method of claim 1, wherein in forming vertically oriented digit lines comprises forming a second conductive material using the plurality of spaced, fourth vertical openings.

10. The method of claim 9, further comprising:

forming a doped, n-type poly silicon (Si) material in the plurality of spaced fourth vertical openings through the vertical stack adjacent first source/drain regions to form the vertically oriented digit lines; and annealing to diffuse n-type dopants from the n-type poly silicon (Si) material into the formed Si material to form first source/drain regions in the horizontally oriented access devices adjacent channel regions.

11. A method for forming arrays of vertically stacked memory cells, having horizontally oriented access devices and storage nodes, comprising:

forming multiple, alternating silicon germanium (SiGe) layers and single crystalline silicon (Si) layers in different thicknesses from a substrate to form tiers in a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

forming a second vertical opening through the vertical stack and extending predominantly in the first horizontal direction to expose second vertical sidewalls adjacent a first region of the SiGe layers and single crystalline Si layers;

forming a first dielectric material in the second vertical opening;

forming a plurality of spaced, third vertical openings in the first dielectric material;

forming support-pillar material in the plurality of spaced, third vertical openings to form support pillars, wherein a first source/drain region of a respective horizontally oriented access device is formed between a first support pillar of the support pillars and a second support pillar of the support pillars;

selectively removing at least a portion of the first dielectric material from the second vertical openings, without removing the support-pillar material to form a plurality of spaced, fourth vertical openings;

selectively removing at least a portion of the SiGe layers in the tiers from the fourth vertical openings;

forming a first conductive material on a gate dielectric material;

recessing the first conductive material a gate distance (GD) from the fourth vertical openings;

forming a second dielectric material in the fourth vertical; and removing the second dielectric material to expose edges of the single crystalline Si layers in the vertical stack adjacent first source/drain regions.

12. The method of claim 11, wherein forming support-pillar material comprises forming support-pillar material resistant to wet etches selective to nitride, silicon, oxide, SiGe, and titanium/titanium nitride (TiN).

13. The method of claim 11, wherein forming support-pillar material comprises forming a third dielectric material, wherein the third dielectric material is different than the first and the second dielectric material.

14. The method of claim 11, further comprising:

forming a doped, n-type poly silicon (Si) material in the plurality of spaced, fourth vertical openings through the vertical stack adjacent first source/drain regions to form vertically oriented digit lines; and annealing to diffuse n-type dopants from the n-type poly silicon (Si) material into the Si material to form first source/drain regions in the horizontally oriented access devices adjacent channel regions.

15. The method of claim 11, further comprising:

selectively removing the first dielectric in the second horizontal direction to form first horizontal openings for access lines;

conformally forming a second dielectric material on exposed surfaces in the first horizontal openings to provide a support structure to remaining Si layers;

forming the first dielectric material in the first horizontal openings; and selectively removing the second dielectric.

16. The method of claim 15, further comprising forming a fifth vertical opening adjacent a second region of the SiGe layers and single crystalline Si layers to expose third vertical sidewalls in the vertical stack in which to form storage nodes.

17. The method of claim 16, further comprising:

selectively removing the single crystalline Si layers in each tier from the fifth vertical opening in the second horizontal direction, using remaining, un-removed second dielectric material as an etch stop, to form a plurality of second horizontal openings in the second region;

gas phase doping a dopant into exposed side surfaces of the single crystalline Si layers from the second horizontal openings to form second source/drain regions horizontally adjacent channel regions; and forming horizontally oriented capacitor cells as storage nodes having bottom electrodes in electrical contact with the second source/drain regions in the second horizontal openings.

18. The method of claim 11, wherein forming the SiGe layers comprises forming the SiGe layers, in each tier, to have a vertical thickness in a range of approximately 400 to 900 angstroms (Å).

19. The method of claim 11, wherein forming the SiGe layers comprises forming the SiGe layers, in each tier, to have approximately a same thickness.

20. The method of claim 11 wherein forming the SiGe layers comprises forming the SiGe layers, in each tier, have a vertical thickness in a range of approximately 100 to 200 angstroms (Å).

21. The method of claim 11, wherein forming the SiGe layers comprises forming the SiGe layers, in each tier, to have a vertical thickness less than the first thickness of the first Si layers.

22. A memory device, comprising:

an array of vertically stacked memory cells formed in tiers, wherein each tier includes multiple, alternating layers of single crystalline silicon (Si) of different thicknesses, wherein the array has horizontally oriented access devices and storage nodes formed in the multiple, alternating layers of single crystalline Si in each tier, wherein the array comprises:

the horizontally oriented access devices having first source/drain regions and second source drain regions separated by single crystalline channel regions, and gate structures on the channel regions;

a dielectric material supporting the single crystalline channel regions;

the horizontally oriented storage nodes electrically coupled to the second source/drain regions of the horizontally oriented access devices; and vertically oriented support pillars adjacent the horizontally oriented access devices, wherein a respective first source/drain region is formed between a first vertically oriented support pillar of the vertically oriented support pillars and a second vertically oriented support pillar of the vertically oriented support pillars.

23. The memory device of claim 22, wherein the vertically oriented support pillars comprises a plurality of spaced, vertically oriented support pillars formed adjacent alternating horizontally oriented access devices.

24. The memory device of claim 22, wherein the vertically oriented support pillar comprises a plurality of spaced, vertically oriented support pillars formed adjacent each horizontally oriented access devices.

25. The memory device of claim 22, comprising:

horizontally oriented access lines separated from the channel region by a gate dielectric; and vertically oriented digit lines electrically coupled to the first source/drain regions of the horizontally oriented access devices.

26. The memory device of claim 22, wherein the dielectric material comprises a silicon nitride material having a thickness in a range of 20 to 80 angstroms (Å).

27. The memory device of claim 22, wherein the vertically oriented support pillars are resistant to dry etches selective to silicon, oxide, SiGe, and metals.

28. The memory device of claim 22, wherein the dielectric material comprises a silicon oxy-carbide (SiOxCy) material.

* * * * *